US010692946B2

(12) United States Patent
Yamada et al.

(10) Patent No.: US 10,692,946 B2
(45) Date of Patent: Jun. 23, 2020

(54) ORGANIC EL DISPLAY PANEL AND METHOD FOR PRODUCING SAME

(71) Applicant: JOLED INC., Tokyo (JP)

(72) Inventors: Jiro Yamada, Tokyo (JP); Kazuma Teramoto, Tokyo (JP); Kenichi Nendai, Tokyo (JP); Kaoru Abe, Tokyo (JP); Hideki Kobayashi, Tokyo (JP); Hirotaka Nanno, Tokyo (JP)

(73) Assignee: JOLED INC., Tokyo (JP)

( * ) Notice: Subject to any disclaimer, the term of this patent is extended or adjusted under 35 U.S.C. 154(b) by 34 days.

(21) Appl. No.: 16/302,666

(22) PCT Filed: May 17, 2017

(86) PCT No.: PCT/JP2017/018590
§ 371 (c)(1),
(2) Date: Nov. 18, 2018

(87) PCT Pub. No.: WO2017/200023
PCT Pub. Date: Nov. 23, 2017

(65) Prior Publication Data
US 2019/0206957 A1 Jul. 4, 2019

(30) Foreign Application Priority Data

May 18, 2016 (JP) ................................. 2016-099881

(51) Int. Cl.
*H01L 27/32* (2006.01)
*H01L 51/52* (2006.01)
(Continued)

(52) U.S. Cl.
CPC .......... *H01L 27/3246* (2013.01); *H01L 27/32* (2013.01); *H01L 27/322* (2013.01);
(Continued)

(58) Field of Classification Search
None
See application file for complete search history.

(56) References Cited

U.S. PATENT DOCUMENTS

| 5,443,922 A | 8/1995 | Nishizaki et al. |
| 7,183,582 B2 * | 2/2007 | Imamura ............... G02F 1/1345 257/113 |

(Continued)

FOREIGN PATENT DOCUMENTS

| EP | 1122801 A2 | 8/2001 |
| JP | H5-163488 A | 6/1993 |

(Continued)

OTHER PUBLICATIONS

International Search Report in PCT/JP2017/018590, dated Aug. 15, 2017. 4pp.

*Primary Examiner* — Chandra Chaudhari
(74) *Attorney, Agent, or Firm* — Hauptman Ham, LLP

(57) ABSTRACT

An organic electroluminescence (EL) display panel includes pixels arranged in a matrix of rows and columns, and includes: a substrate; pixel electrode layers that are arranged on the substrate in the matrix; an insulating layer that is provided above the substrate and the pixel electrode layers, and has elongated openings and a grooved portion for each of the pixels, the openings extending in a column direction and being arranged in a row direction, the grooved portion having an upper opening and a bottom and being communicated with at least one of the openings in plan view; organic functional layers that are provided above the pixel electrode layers, and include light emitting layers in which organic electroluminescence occurs in the openings; and a light-transmissive counter electrode layer that is provided above the organic functional layers. Cross-sectional profiles of the openings taken along the row direction are uniform in the column direction.

15 Claims, 30 Drawing Sheets

(51) Int. Cl.
  *H01L 51/00* (2006.01)
  *H01L 51/50* (2006.01)
  *H01L 51/56* (2006.01)

(52) U.S. Cl.
  CPC ........ *H01L 27/326* (2013.01); *H01L 27/3211* (2013.01); *H01L 51/0005* (2013.01); *H01L 51/50* (2013.01); *H01L 51/5012* (2013.01); *H01L 51/5056* (2013.01); *H01L 51/5072* (2013.01); *H01L 51/5088* (2013.01); *H01L 51/5218* (2013.01); *H01L 51/5234* (2013.01); *H01L 51/5246* (2013.01); *H01L 51/5253* (2013.01); *H01L 51/5284* (2013.01); *H01L 51/56* (2013.01); *H01L 2227/323* (2013.01)

(56) References Cited

U.S. PATENT DOCUMENTS

| | | | |
|---|---|---|---|
| 8,981,638 B2 * | 3/2015 | Isa | H01L 27/3211 313/498 |
| 9,437,831 B2 * | 9/2016 | Yamazaki | H01L 29/24 |
| 2001/0023661 A1 | 9/2001 | Hiroki et al. | |
| 2006/0152559 A1 | 7/2006 | Sakai et al. | |
| 2007/0075618 A1 | 4/2007 | Mitsuya | |
| 2009/0284135 A1 | 11/2009 | Yoshida et al. | |
| 2011/0260955 A1 | 10/2011 | Yoshida et al. | |
| 2013/0214301 A1 | 8/2013 | Yamada et al. | |
| 2013/0320388 A1 | 12/2013 | Sekimoto | |
| 2014/0061603 A1 | 3/2014 | Kim et al. | |
| 2015/0188091 A1 | 7/2015 | Kudo et al. | |
| 2016/0293681 A1 | 10/2016 | Shinokawa et al. | |
| 2017/0117339 A1 | 4/2017 | Takata | |

FOREIGN PATENT DOCUMENTS

| | | |
|---|---|---|
| JP | 2004-351305 A | 12/2004 |
| JP | 2006-194921 A | 7/2006 |
| JP | 2007-49173 A | 2/2007 |
| JP | 2007-95614 A | 4/2007 |
| JP | 2007-95729 A | 4/2007 |
| JP | 2008-91051 A | 4/2008 |
| JP | 2008-243648 A | 10/2008 |
| JP | 2009-277570 A | 11/2009 |
| JP | 2011-170249 A | 9/2011 |
| JP | 2012-38739 A | 2/2012 |
| JP | 2013-89293 A | 5/2013 |
| JP | 2013-191533 A | 9/2013 |
| JP | 2013-240733 A | 12/2013 |
| JP | 2015-144107 A | 8/2015 |
| JP | 2015-223813 A | 12/2015 |
| WO | 2008/149499 A1 | 12/2008 |
| WO | 2010/070800 A1 | 6/2010 |
| WO | 2013/179355 A1 | 12/2013 |
| WO | 2015/072063 A1 | 5/2015 |
| WO | 2015/155971 A1 | 10/2015 |

* cited by examiner

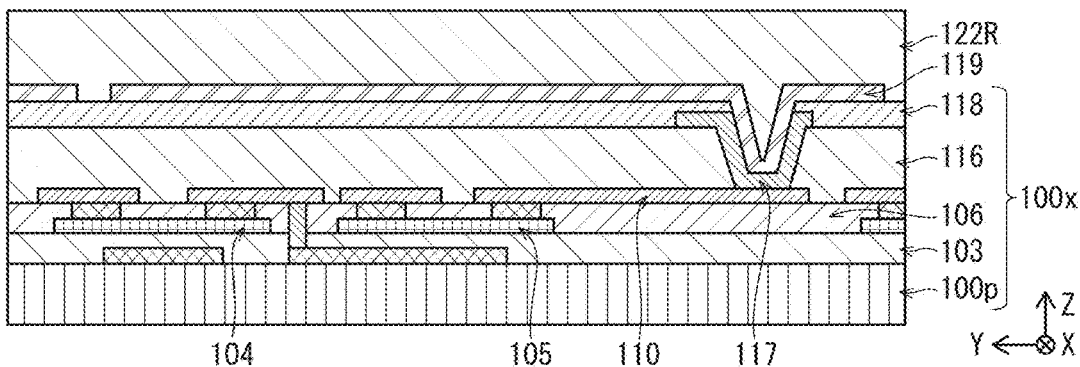
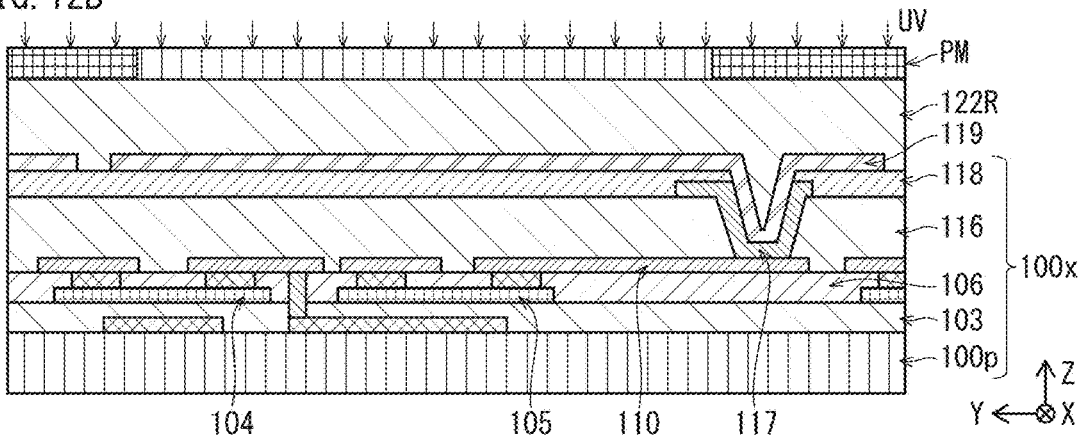
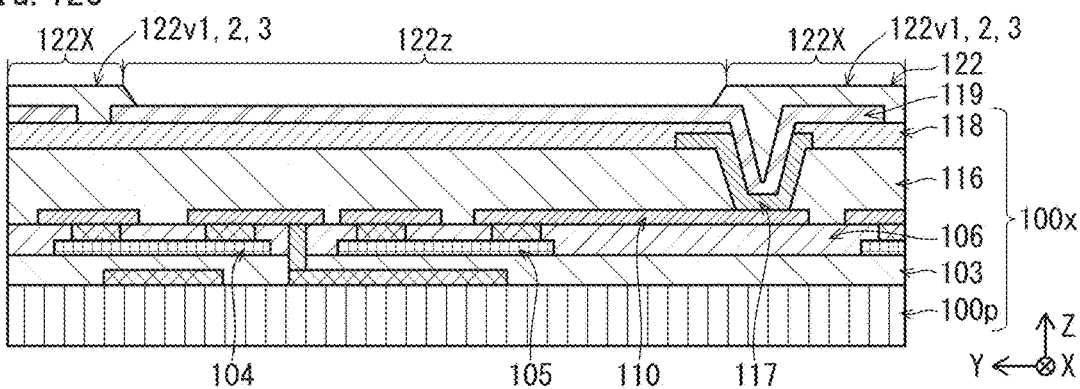
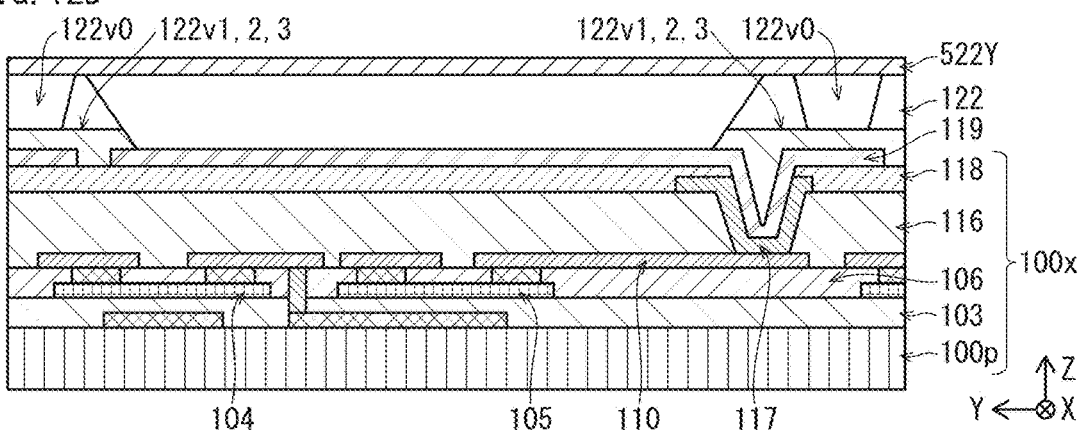

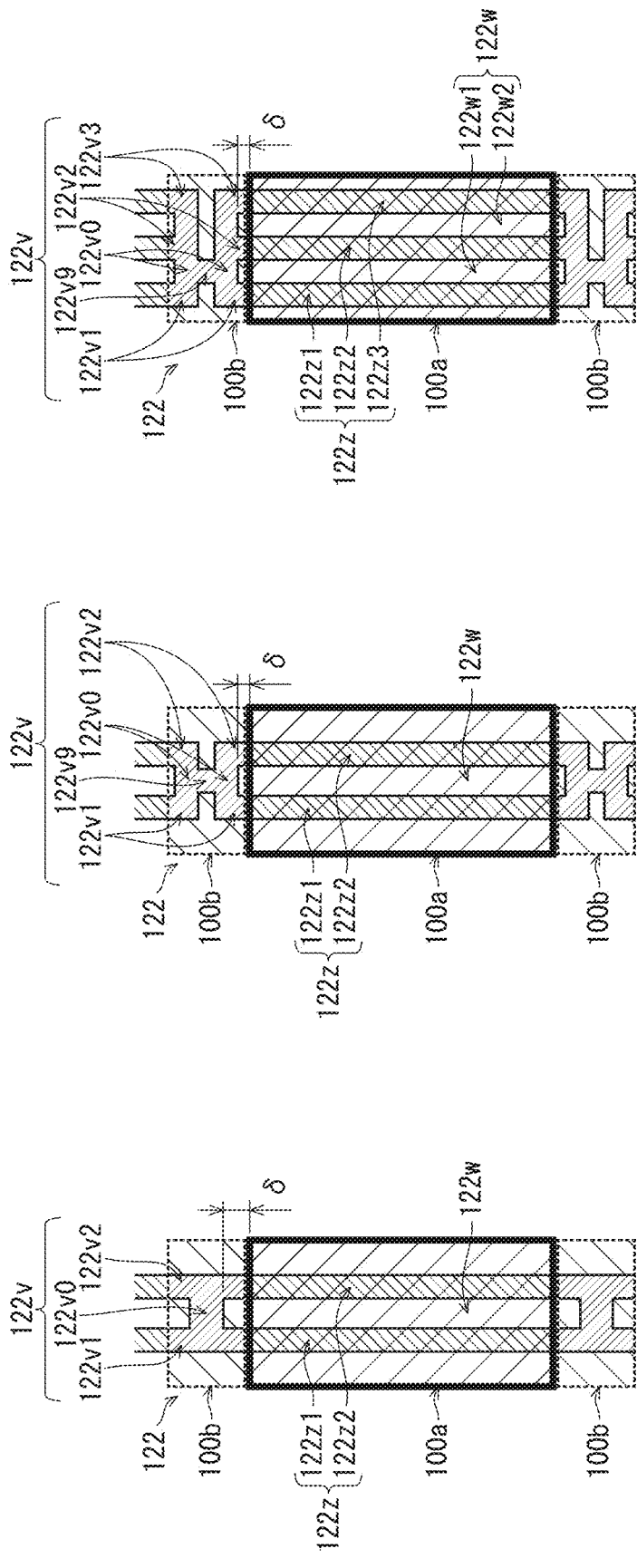

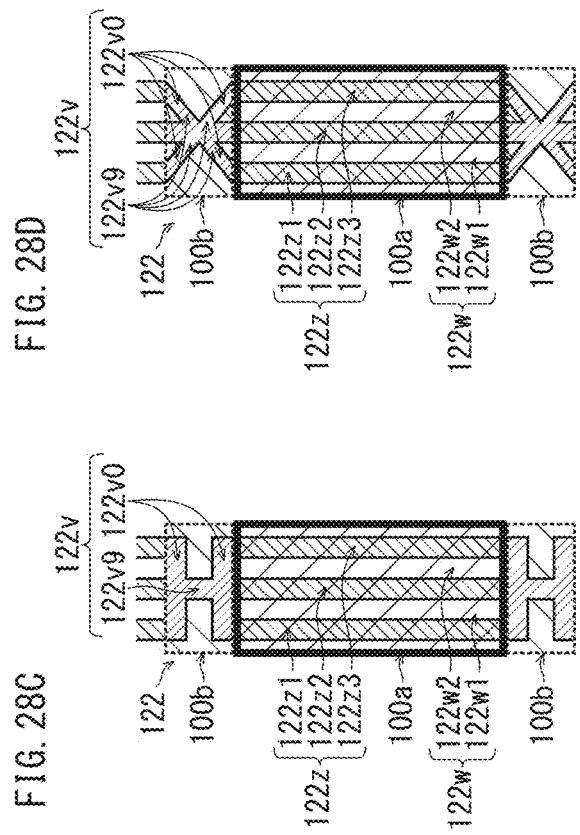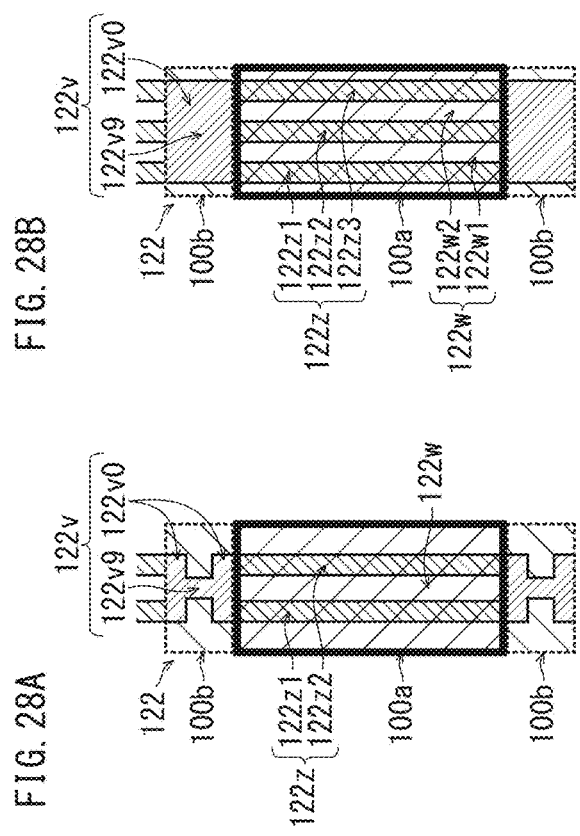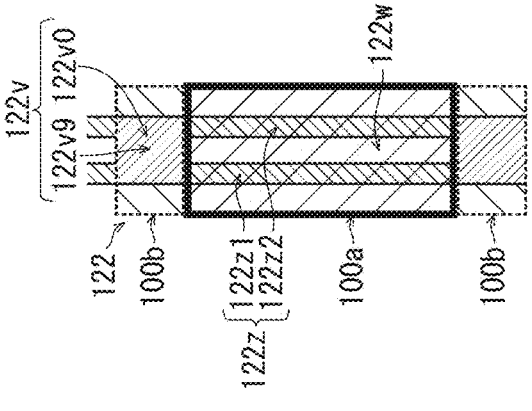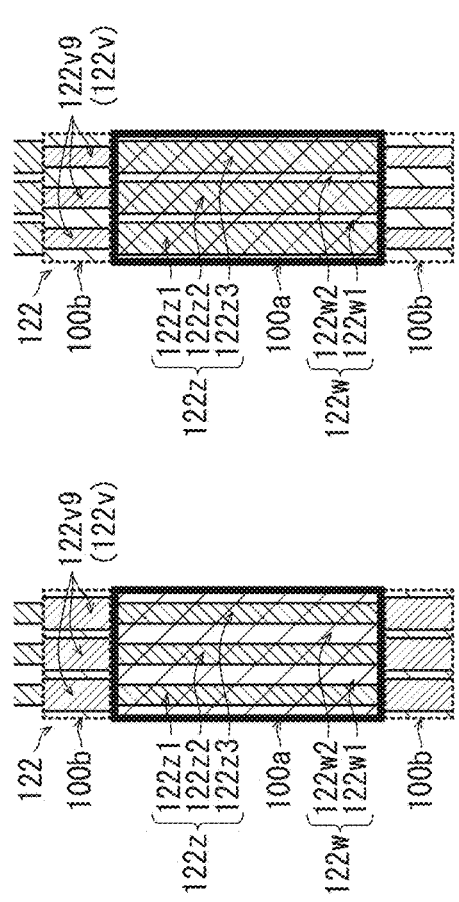

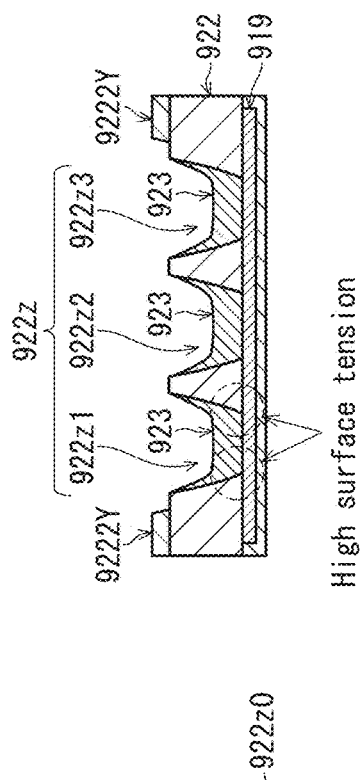
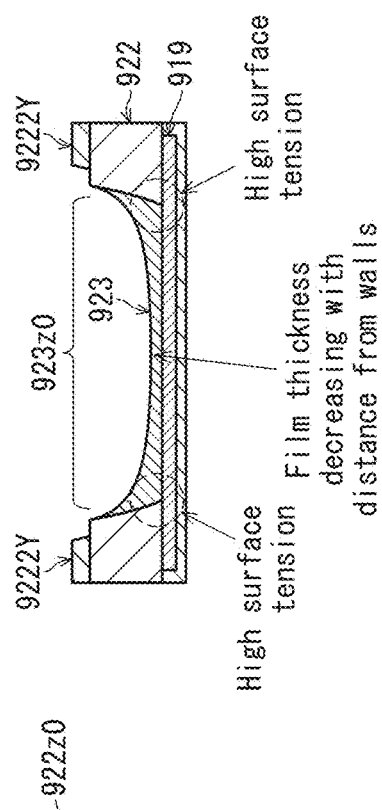
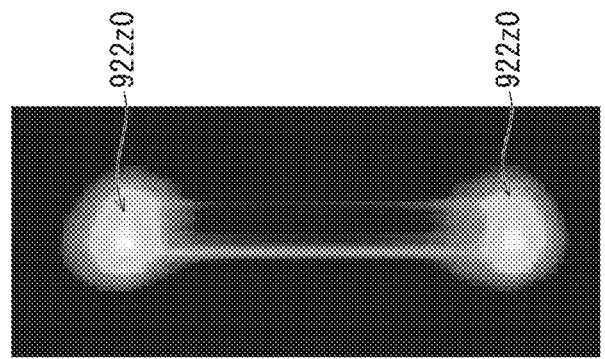
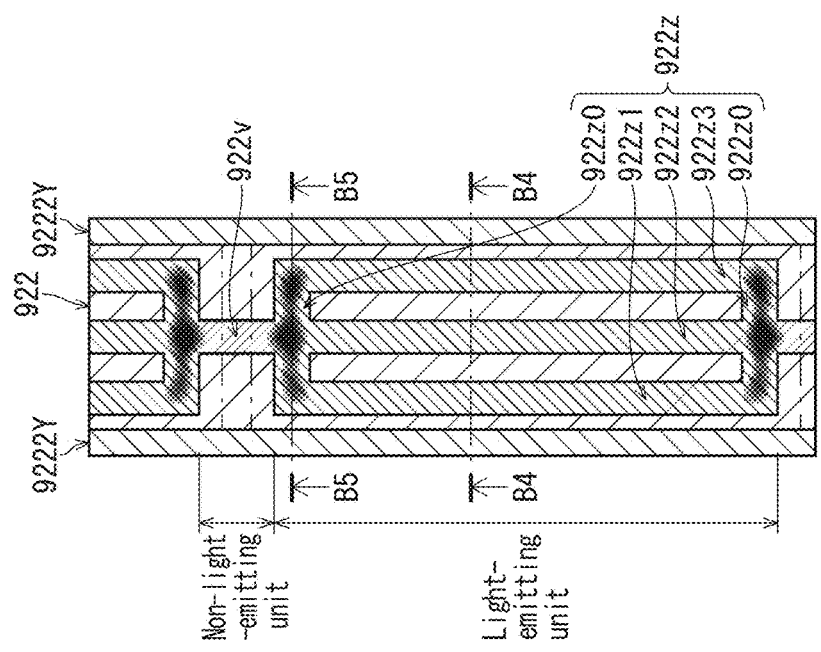
FIG. 30A
FIG. 30B
FIG. 30C
FIG. 30D

ORGANIC EL DISPLAY PANEL AND METHOD FOR PRODUCING SAME

RELATED APPLICATIONS

The present application is a National Phase of International Application Number PCT/JP2017/018590, filed May 17, 2017, which claims priority to JP2016-099881 filed May 18, 2016.

TECHNICAL FIELD

The present disclosure relates to organic electroluminescence (EL) display panels that use organic EL elements employing electroluminescence of organic material, and to a method of manufacturing the same.

BACKGROUND ART

In recent years, organic EL display panels including a matrix of organic EL elements arranged above a substrate have been put into practical use, as display panels for use in display devices such as digital televisions. Such organic EL display panels achieve high visibility due to the organic EL elements being self-luminous. In the organic EL display panels, each organic EL element has a basic configuration in which a light emitting layer containing an organic light emitting material is disposed between an electrode pair of an anode and a cathode, and when driven, a voltage is applied between the electrode pair and light is emitted through recombination of holes injected to the light emitting layer from the anode and electrons injected to the light emitting layer from the cathode.

In the organic EL display panels, there has been a demand for improving a light extraction efficiency of the organic EL elements from the standpoint of reducing power consumption, increasing the panel service life, and so on.

In response to this demand, display devices proposed in Patent Literatures 1 and 2 for example include: a reflector (reflective structure), which is constituted from first members of a concave shape and second members that are each placed between two adjacent first members; and an organic light emitting layer, which is provided between the first members and the second members. The proposed display devices exhibit an improved light extraction efficiency owing to the first members and the second members having refractive indices within a predetermined range.

CITATION LIST

Patent Literature

[Patent Literature 1]
Japanese Patent Application Publication No. 2013-191533
[Patent Literature 2]
Japanese Patent Application Publication No. 2015-144107

SUMMARY

Technical Problem

According to the techniques described in Patent Literatures 1 and 2, however, when a low-cost ink application method such as an ink jet method is used for constituting a reflector including organic light emitting layers, it is difficult to uniformly apply an ink containing light emitting layer materials to the inside of each pixel. This is due to the concave first members that are provided on surfaces of pixel electrodes onto which the ink is to be applied. This causes a problem that film thickness of the formed light emitting layers is ununiform in the pixel, and thus luminance unevenness occurs.

The present disclosure was made in view of the above problem, and aims to provide an organic EL display panel and a manufacturing method of the same that uniformize film thickness of light emitting layers in each pixel to suppress luminance unevenness, with a low-cost ink application method for a reflector.

Solution to Problem

One aspect of the present disclosure provides an organic electroluminescence (EL) display panel including pixels arranged in a matrix of rows and columns, the organic EL display panel comprising: a substrate; pixel electrode layers that are made of a light-reflective material and are arranged on the substrate in the matrix; an insulating layer that is provided above the substrate and the pixel electrode layers, and has elongated openings and a grooved portion for each of the pixels, the openings extending in a column direction and being arranged in a row direction, the grooved portion having an upper opening and a bottom and being communicated with at least one of the openings in plan view; organic functional layers that are provided above the pixel electrode layers, and include light emitting layers in which organic electroluminescence occurs in the openings; and a light-transmissive counter electrode layer that is provided above the organic functional layers, wherein cross-sectional profiles of the openings taken along the row direction are uniform in the column direction.

Advantageous Effects

According to the organic EL display panel and the manufacturing method of the same relating to the one aspect of the present disclosure, it is possible to uniformize film thickness of light emitting layers in each pixel to suppress luminance unevenness in an organic display panel having a reflector including application-type functional layers.

BRIEF DESCRIPTION OF DRAWINGS

FIGS. 12A to 12D are schematic cross-sectional views of the organic EL display panel 10 during manufacture, taken along a line at the same position as the line A1-A1 in FIG. 4B.

FIG. 21A shows a case where the inks are uniformly applied to gaps 522z between column banks 522Y, and FIG. 21B shows a case where the inks are applied to regions of a lattice shape defined by insulating sublayers 122X and 122Y.

FIGS. 24A to 24C are enlarged plan views of subpixels relating to a modification.

FIGS. 28A to 28H are enlarged plan views of subpixels relating to a modification.

FIG. 30A shows measurement results of film thickness of light emitting layers in subpixels of a substrate of the display panel conceived of by the inventors, FIG. 30B is an image of luminance distribution in the subpixels of the display panel, FIG. 30C is a schematic cross-sectional view taken along a line B4-B4 in FIG. 30A, and FIG. 30D is a schematic cross-sectional view taken along a line B5-B5 in FIG. 30A.

DESCRIPTION OF EMBODIMENTS

<<Process by which One Aspect of the Present Disclosure was Achieved>>

The inventors considered a problem in manufacturing of organic EL display panels (hereinafter referred to just as display panels). The following describes the problem with reference to the drawings.

According to the organic EL display devices described in Patent Literatures 1 and 2, as described above, in the case where a low-cost ink application method such as an ink jet method is used for forming organic light emitting layers, uniform ink application in each pixel is difficult due to the concave first members, which are provided on the pixel electrodes onto which the ink containing light emitting layer materials is to be applied. As a result, the ink insufficiently spreads in the pixel, and this causes a problem that the film thickness of the light emitting layers is ununiform and thus luminance unevenness occurs.

In response to this problem, the inventors performed a test with use of their conceived test display panel in order to suppress variation in film thickness of light emitting layer in each pixel during a manufacturing process.

Figure 29:
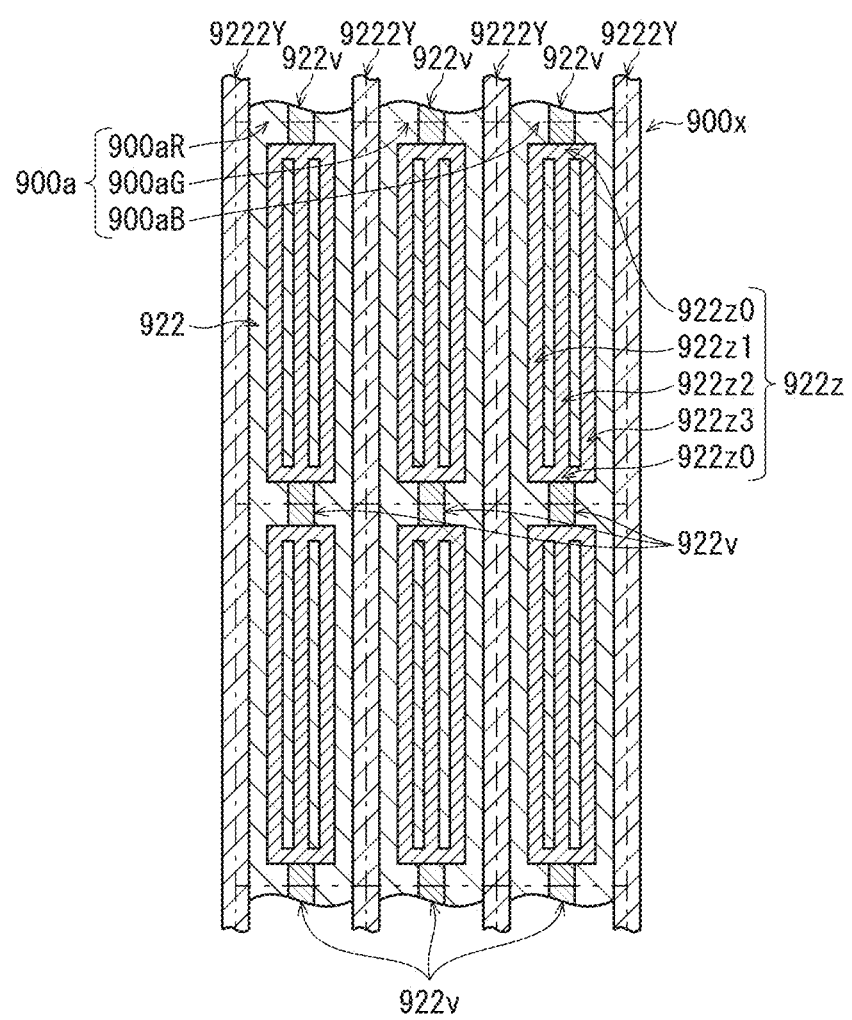
FIG. 29 is a plan view of a pixel of a display panel conceived of by the inventors.

FIG. 29 is a plan view of a pixel of the display panel conceived of by the inventors. As shown in FIG. 29, pixel electrode layers 919 are formed on a substrate 900x so as to one-to-one correspond to subpixels 900aR, 900aG, and 900aB that are arranged in a matrix (hereinafter referred to collectively as subpixels 900a when no distinction is made therebetween). An insulating layer 922 is layered so as to cover the pixel electrode layers 919. The insulating layer 922 has elongated openings 922z1, 922z2, and 922z3, which extend in the column direction and are arranged in the row direction, and openings 922z0, which extend in the column direction and are each communicated with the openings 922z1, 922z2, and 922z3. The insulating layer 922 further has openings 922v that are each communicated with the openings 922z0 in two adjacent subpixels 900a in the column direction. The openings have trapezoidal cross sections, taken along a plane perpendicular to the longitudinal direction, whose width increases upward. The pixel electrode layers 919 are located under the openings 922z1, 922z2, 922z3, and 922z0, and accordingly are exposed in these openings. Meanwhile, no pixel electrode layer 919 is located under the openings 922v, and accordingly is exposed in the openings 922v. Moreover, elongated banks 922Y extending in the column direction are disposed in gaps between adjacent subpixels 900a in the row direction.

The inventors applied an ink containing light emitting layer materials with an inkjet method to the subpixels 900a on the substrate 900x of the display panel, dried the ink, and then measured film thickness of light emitting layers formed in the openings 922z1, 922z2, 922z3, and 922z0.

FIG. 30A shows measurement results of film thickness of the light emitting layers in the subpixels of the substrate of the display panel conceived of by the inventors. In the figure, parts with black colors in the openings 922z1, 922z2, 922z3, and 922z0 represent a film thickness smaller than a predetermined reference value. As shown in FIG. 30A, it can be seen that while the film thickness in the openings 922z1, 922z2, and 922z3, which extend in the column direction, is equal to or greater than the reference value, the film thickness in parts of the openings 922z0 is smaller than the reference value. Especially, among the parts of the openings 922z0 in which the film thickness is smaller than the reference value, parts intersecting with the openings 922z2 has a larger area than the other parts.

The inventors produced a display panel with use of a substrate including light emitting layers 923, and performed a lighting test. FIG. 30B is an image of luminance distribution in subpixels of the display panel. This luminance distribution demonstrates that the openings 922z0 are higher in terms of luminance than the other parts in the subpixels. Especially, the parts where the openings 922z0 and 922z2 intersect with each other are the highest in terms of luminance in the subpixels. Also, as a result of comparison with the thickness distribution in the openings 922z1, 922z2, 922z3, and 922z0 shown in FIG. 30A, it can be seen that parts of the light emitting layers 923 in the openings having a smaller film thickness exhibits a higher luminance. This is considered to be due to an increase in current density of the light emitting layers with a decrease in film thickness of the light emitting layers.

Next, the inventors measured cross-sectional profiles of the light emitting layers 923 in the openings. FIG. 30C is a schematic cross-sectional view taken along a line B4-B4 in FIG. 30A, and FIG. 30D is a schematic cross-sectional view taken along a line B5-B5 in FIG. 30A. Note that these cross-sectional views are schematic enlarged views where the larger scale factor in the Z direction is defined for the X-Z direction and the Y-Z direction, and the aspect ratio differs from the actual one.

As shown in FIGS. 30C and 30D, the light emitting layers 923 have a larger film thickness in the openings 922z1, 922z2, and 922z3 than in the openings 922z0, and have the smallest film thickness around the center in the openings 922z0.

The inventors' study proved that an ink has the highest surface tension in boundary parts (parts circled in the figures) between the insulating layer 922 and the pixel electrode layers 919 in both ends in bottoms of the openings. According to this, it is estimated that since the light emitting layers 923 in the openings 922z1, 922z2, and 922z3 are not distant from the points where the surface tension of the ink is the highest, an ability of retaining the ink (hereinafter referred to as ink retention ability) of the insulating layer 922 is kept high and thus the thickness of the ink is kept large. Meanwhile, it is estimated that since the light emitting layers 923 in the openings 922z0 are relatively distant from the points where the surface tension of the ink is the highest, the ink retention ability of the insulating layer 922 deteriorates and thus the thickness of the ink decreases. It is considered that, in particular, since part of the light emitting layers 923 that is located around the center in the openings 922z0 is the most distant from the points where the surface tension of the ink is the highest, the ink retention ability of the insulating layer 922 is the lowest and thus the thickness of the ink is the smallest.

The above study proved that as the width of the openings provided in the insulating layer 922 increases, the ink retention ability of the insulating layer 922 deteriorates and thus the film thickness of the light emitting layers 923 decreases. Furthermore, the inventors' considered that the ink retention ability might be influenced by factors such as a depth of the openings and a gradient formed by walls of the openings in addition to the width of the openings, and thus it is effective to suppress variation in these factors in each pixel thereby to uniformly retain the ink in the pixel, in order to retrain variation in film thickness to suppress variation in luminance.

In view of these, the inventors earnestly considered a reflector according to which an improved light extraction efficiency of organic EL elements can be exhibited, an ink containing light-emission layer materials can be uniformly applied to the inside of each pixel, and the ink can be uniformly retained in the pixel. As a result, the inventors conceived of the display panel described in the embodiment of the present disclosure.

<<Aspects of the Present Disclosure>>

One aspect of the present disclosure provides an organic electroluminescence (EL) display panel including pixels arranged in a matrix of rows and columns, the organic EL display panel comprising: a substrate; pixel electrode layers that are made of a light-reflective material and are arranged on the substrate in the matrix; an insulating layer that is provided above the substrate and the pixel electrode layers, and has elongated openings and a grooved portion for each of the pixels, the openings extending in a column direction and being arranged in a row direction, the grooved portion having an upper opening and a bottom and being communicated with at least one of the openings in plan view; organic functional layers that are provided above the pixel electrode layers, and include light emitting layers in which organic electroluminescence occurs in the openings; and a light-transmissive counter electrode layer that is provided above the organic functional layers, wherein cross-sectional profiles of the openings taken along the row direction are uniform in the column direction. Also, in another aspect, the grooved portion may be communicated with at least two of the openings in plan view.

Also, in another aspect, the cross-sectional profiles of the openings taken along the row direction may be defined by an upper width in the row direction and a depth of the openings. Also, in another aspect, the cross-sectional profiles of the openings taken along the row direction may be further defined by a rate of change of the width in the row direction to the depth of the openings.

With the above configurations, it is possible to suppress variation in factors that influence the ink retention ability in application of the ink containing organic compound as materials of the light emitting layers during the manufacturing process. As a result, the ink is retained uniformly in the luminous region of each subpixel. Alternatively, it is possible to suppress rapid variation in factors that influence the ink retention ability, and thereby to suppress rapid variation in ink retention ability in the luminous region of the pixel to suppress steep luminance unevenness. This reduces variation in film thickness of the light emitting layers, thereby to suppress luminance unevenness in the pixel. It is possible to achieve the organic EL display panel with an efficiency and a panel service life that are increased owing to the uniform film thickness of the application-type functional layers.

Also, in another aspect, the grooved portion may include: connection grooves that are communicated with the openings in the column direction in plan view; and a bridging groove that is communicated with the connection grooves in the row direction in plan view.

With the above configuration, the bridging groove increases the flow of an ink containing a light emitting layer material between the connection grooves, and thereby to improve uniformity in application amount of the ink in each subpixel. This reduces variation in film thickness of the light emitting layers to suppress luminance unevenness in each pixel.

Also, in another aspect, the connection grooves and the openings may have a substantially equal upper width in the row direction. Also, in another aspect, the connection grooves may each have a width of 1 μm to 8 μm in the column direction.

With the above configurations, it is possible to separate the connection grooves, which influence the ink retention ability, from end parts of the openings by a predetermined distance, and thereby to further uniformly retain the ink at the end parts of the openings. This reduces variation in film thickness of the light emitting layers, thereby to further suppress luminance unevenness.

Also, in the above aspect, the grooved portion may include a bridging groove that is communicated with the openings in plan view.

With the above configuration, varying parts of cross-sectional profiles of the grooved portions in non-luminous regions are separated from the end parts of the openings, it is possible to uniformly retain the ink at the end parts of the openings, and also reduce the length of the non-luminous regions in the column direction thereby to achieve high resolution.

Also, in another aspect, the pixels may each have a luminous region where the openings are provided and a non-luminous region where the grooved portion is provided, and the luminous regions and the non-luminous regions may alternate in the column direction.

With the above configuration, it is possible to achieve the display panel in which the subpixels are arranged in the matrix in which the luminous regions and the non-luminous regions to alternate in the column direction owing to the pixel electrode layers layered on the substrate and the openings of the insulating layer.

Also, in another aspect, the grooved portion may be communicated with the respective openings that are provided in two adjacent luminous regions in the column direction.

With the above configuration, the connection grooves increase the flow of the ink, which contains material of the light emitting layers, in the column direction, to suppress variation in application amount of the ink between the subpixels. This reduces variation in film thickness of the light emitting layers to suppress luminous variation between the subpixels.

Also, in another aspect, the organic functional layers may be in contact with the pixel electrode layers in the openings, and may be separated from the pixel electrode layers in the grooved portions.

With the above configuration, the pixel electrode layers are exposed in the openings so as to be in contact with the hole injection layer, and this allows electrical charge supply in the openings from the pixel electrode layers to the hole injection layer. Thus, the openings correspond to the luminous regions. The pixel electrode layers are not exposed in the bridging grooves and the connection grooves of the insulating layer, which have groove-shaped cross sections and have upper openings and bottoms. Accordingly, electrical charge supply from the pixel electrode layers to the hole injection layer is not performed in the grooved portions. Thus, the grooved portions correspond to the non-luminous regions.

Also, in another aspect, at least one of the following two conditions may be true: cross-sectional profiles of the connection grooves taken along the row direction are smaller in terms of an upper width in the row direction than the cross-sectional profiles of the openings taken along the row direction; and the cross-sectional profiles of the connection grooves are smaller in terms of a rate of change of a width in the row direction to a depth than the cross-sectional profiles of the openings.

With the above configuration, the connection grooves, which have properties of increasing the ink retention ability, are provided near the end parts of the openings. This prevents deterioration of the ink retention ability at the end parts of the openings. This suppresses luminance unevenness in each pixel caused by decrease in film thickness of the light emitting layers.

Also, in another aspect, the organic EL display panel may further comprise a bond layer that is provided above the counter electrode layer and has a rear surface that is convex along the openings, the cross-sectional profiles of the openings taken along the row direction may be each a trapezoid whose width increases upward, and when refractive indices of the bond layer and the insulating layer are represented by $n_1$ and $n_2$, respectively, the following relationships may be satisfied: $1.1 \leq n_1 \leq 1.8$ (Formula 1); and $|n_1-n_2| \geq 0.20$ (Formula 2).

Also, in another aspect, when depth, upper width in the row direction, and lower width in the row direction of the openings are represented by D, $W_h$, and $W_l$, respectively, the following relationships may be satisfied: $0.5 \leq W_l/W_h \leq 0.8$ (Formula 3); and $0.5 \leq D/W_l \leq 2.0$ (Formula 4).

With the above configuration, the openings have trapezoidal cross sections taken along the row direction whose width increases upward, and thus light emitting layers efficiently emit light upward.

One aspect of the present disclosure provides a method of manufacturing an organic electroluminescence (EL) display panel including pixels arranged in a matrix of rows and columns, the method comprising: preparing a substrate; forming pixel electrode layers on the substrate in the matrix, the pixel electrode layers being made of a light-reflective material; forming an insulating layer above the substrate and the pixel electrode layers; providing elongated openings for each of the pixels in the insulating layer by performing exposure on a photosensitive resin through a mask and performing development on the photosensitive resin, the openings extending in a column direction and being arranged in a row direction; providing a grooved portion for each of the pixels in the insulating layer by performing exposure on a photosensitive resin through a halftone mask and performing development on the photosensitive resin, the grooved portion being communicated with at least one of the openings in plan view; forming, at least in the openings of the pixels, organic functional layers including light emitting layers by applying an ink above the pixel electrode layers and drying the ink, the ink containing a material of the light emitting layers; and forming a light-transmissive counter electrode layer above the organic functional layers, wherein in the providing the openings, cross-sectional profiles of the openings taken along the row direction are made to be uniform in the column direction.

With the above configuration, it is possible to manufacture the display panel including the application-type functional layers, in which an efficiency and a panel service life are increased owing to uniform film thickness of the functional layers.

According to the organic EL display panel relating to one aspect of the present disclosure, parts of the pixel electrode layers, which are located near the end parts of the openings that are communicated with the grooved portion, may be separated from the counter electrode layer by a greater distance than a remainder of the pixel electrode layers is.

With the above configuration, an electric field intensity is low in the separated parts, and accordingly no electroluminescence occurs in parts of the light emitting layers that are located above the separated parts. Thus, the separated parts can be included in the non-luminous regions. This size increase of the non-luminous regions further separates the varying parts of the cross-sectional profiles of the grooved portion from the luminous regions. As a result, it is possible to uniformly retain the ink in the openings which constitute the luminous regions.

Embodiment

1. Circuit Configuration of Display Device 1

The following describes circuit configuration of an organic EL display device 1 (hereinafter referred to just as display device 1) relating to an embodiment, with reference to FIG. 1.

Figure 1:
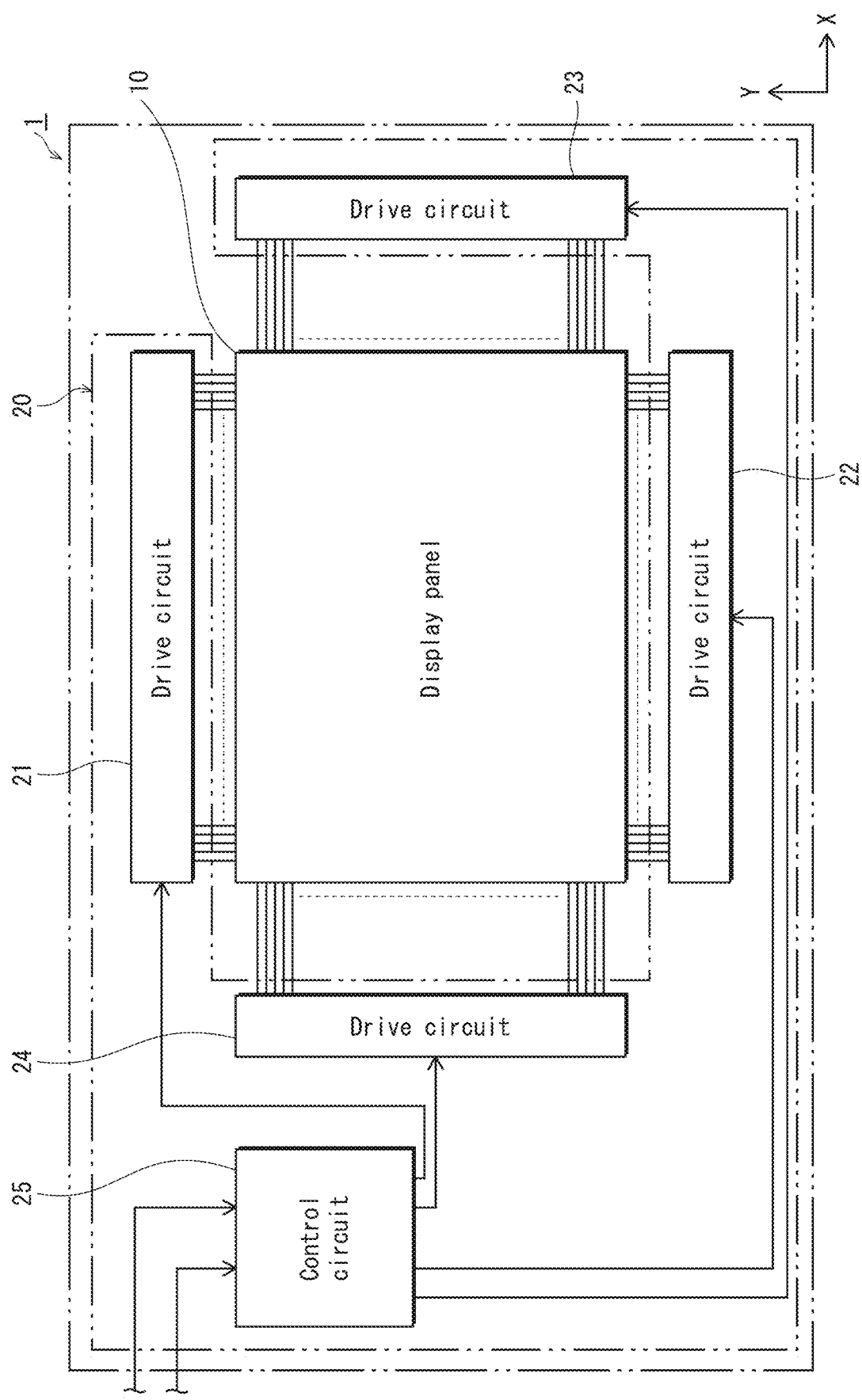
FIG. 1 is a schematic block diagram of circuit configuration of an organic EL display device 1 relating to an embodiment of the present disclosure.

As shown in FIG. 1, the display device 1 includes an organic EL display panel 10 (hereinafter referred to just as display panel 10) and a drive control circuit unit 20 connected thereto.

The display panel 10 is an organic EL panel that makes use of electroluminescence of organic material, in which organic EL elements are arranged in a matrix, for example. The drive control circuit unit 20 includes four drive circuits 21-24 and a control circuit 25.

The arrangement of the circuits of the drive control circuit unit 20 with respect to the display panel 10 in the display device 1 is not limited to the configuration shown in FIG. 1.

2. Circuit Configuration of Display Panel 10

The display panel 10 includes a plurality organic EL elements that are unit pixels 100e each of which are composed of three-color subpixels (not shown) emitting light of red (R), green (G), and blue (B) colors. Circuit configuration of the subpixels 100se is described with reference to FIG. 2.

Figure 2:
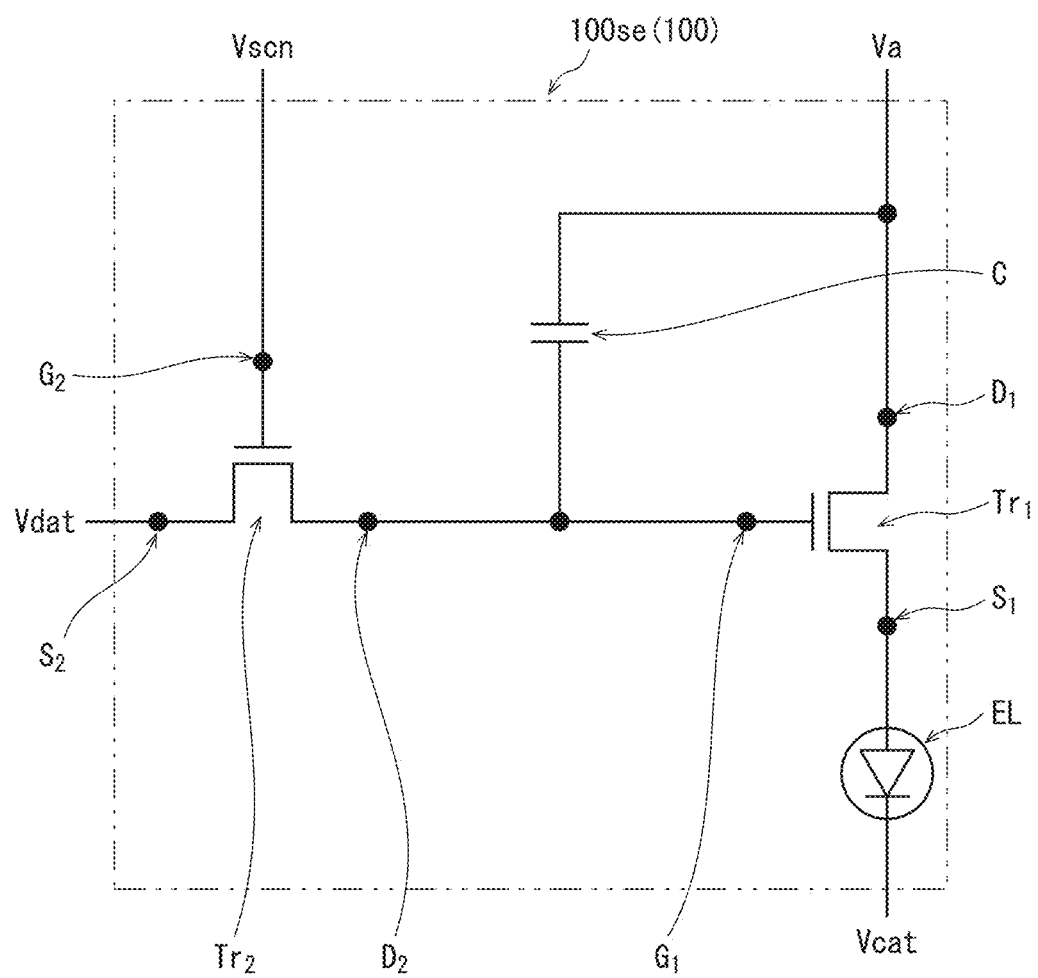
FIG. 2 is a schematic circuit diagram of circuit configuration of each subpixel 100se of an organic EL display panel 10 used in the organic EL display device 1.

FIG. 2 is a schematic circuit diagram showing the circuit configuration of an organic EL element 100 corresponding to the subpixels 100se of the display panel 10 used in the display device 1. The organic EL display elements 100 constituting the unit pixels 100e are arranged in a matrix as a display region of the display panel 10.

In the display panel 10 relating to the present embodiment, as shown in FIG. 2, each subpixel 100se includes two transistors $T_{r1}$ and $T_{r2}$, a single capacitance C, and an organic EL element unit EL as a light emitting unit. The transistor $T_{r1}$ is a drive transistor, and the transistor $T_{r2}$ is a switching transistor.

A gate $G_2$ and a source $S_2$ of the switching transistor $T_{r2}$ are respectively connected to a scanning line Vscn and a data line Vdat. A drain $D_2$ of the switching transistor $T_{r2}$ is connected to a gate $G_1$ of the drive transistor $T_{r1}$.

A drain $D_1$ and a source $S_1$ of the drive transistor $T_{r1}$ are respectively connected to a power line Va and a pixel electrode layer (anode) of the organic EL element unit EL. A counter electrode layer (cathode) of the organic EL element unit EL is connected to a ground line Vcat.

Note that the capacitance C is provided so as to connect between the drain $D_2$ of the switching transistor $T_{r2}$ and the power line Va and connect between the gate $G_1$ of the drive transistor $T_{r1}$ and the power line Va.

In the display panel 10, one unit pixel 100e is composed of a combination of adjacent subpixels 100se (for example, three subpixels 100se of R, G, and B luminescent colors), and a pixel region is composed of the subpixels 100se that are distributed. A gate line GL is extracted from the gate $G_2$ of each subpixel 100se, and is connected to the scanning line Vscn that is connected to the outside of the display panel 10. Similarly, a source line SL is extracted from the source $S_2$ of each subpixel 100se, and is connected to the data line Vdat that is connected to the outside of the display panel 10.

Furthermore, the power line Va and the ground line Vcat of each subpixel 100se are collectively connected to the power line Va and the ground line Vcat.

3. Overall Configuration of Organic EL Display Panel 10

The following describes the display panel 10 relating to the present embodiment with reference to the drawings. Note that the drawings are pattern diagrams and are not necessarily drawn to scale.

Figure 3:
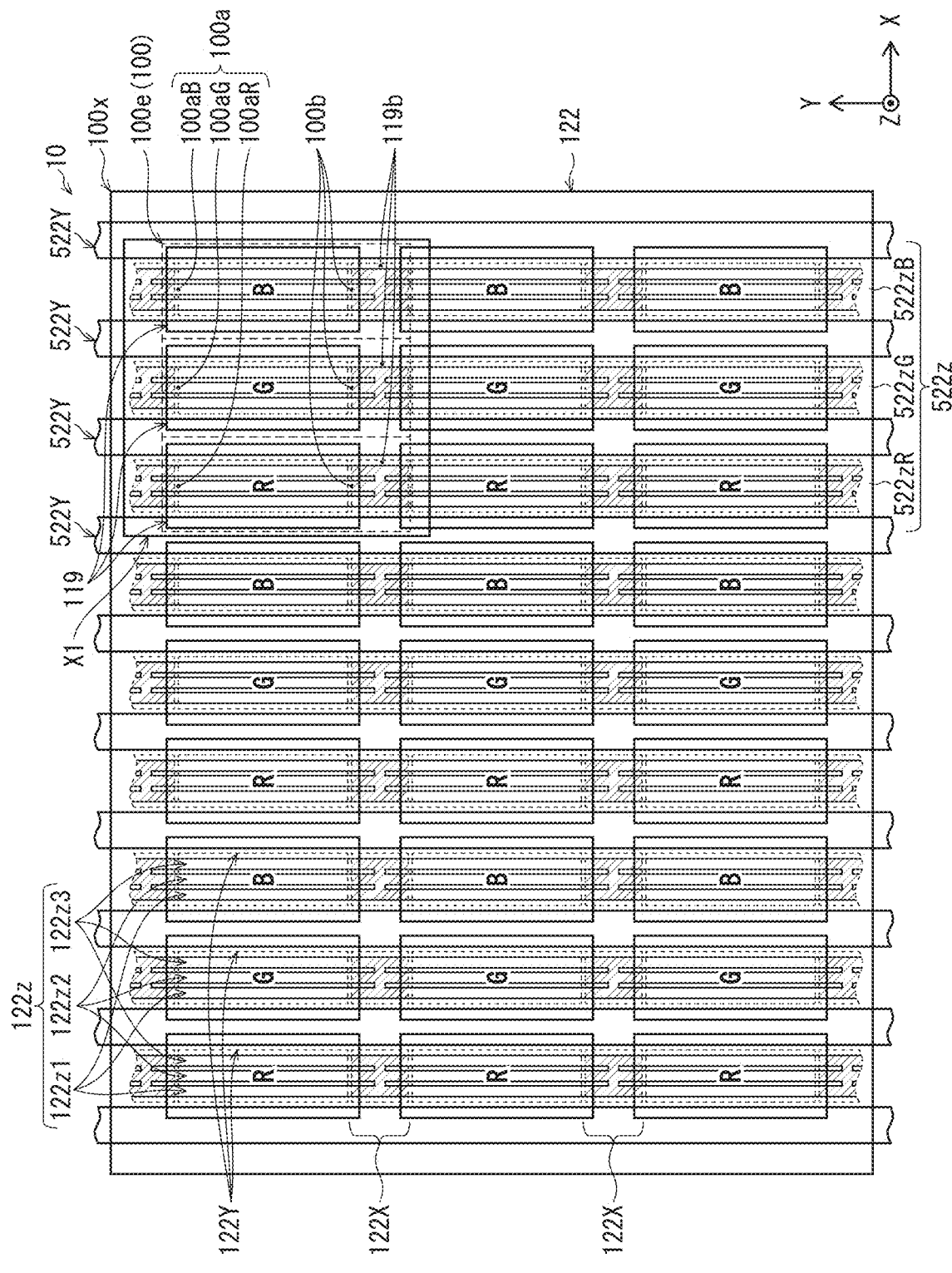
FIG. 3 is a schematic plan view of part of the organic EL display panel 10.
Figure 4A:
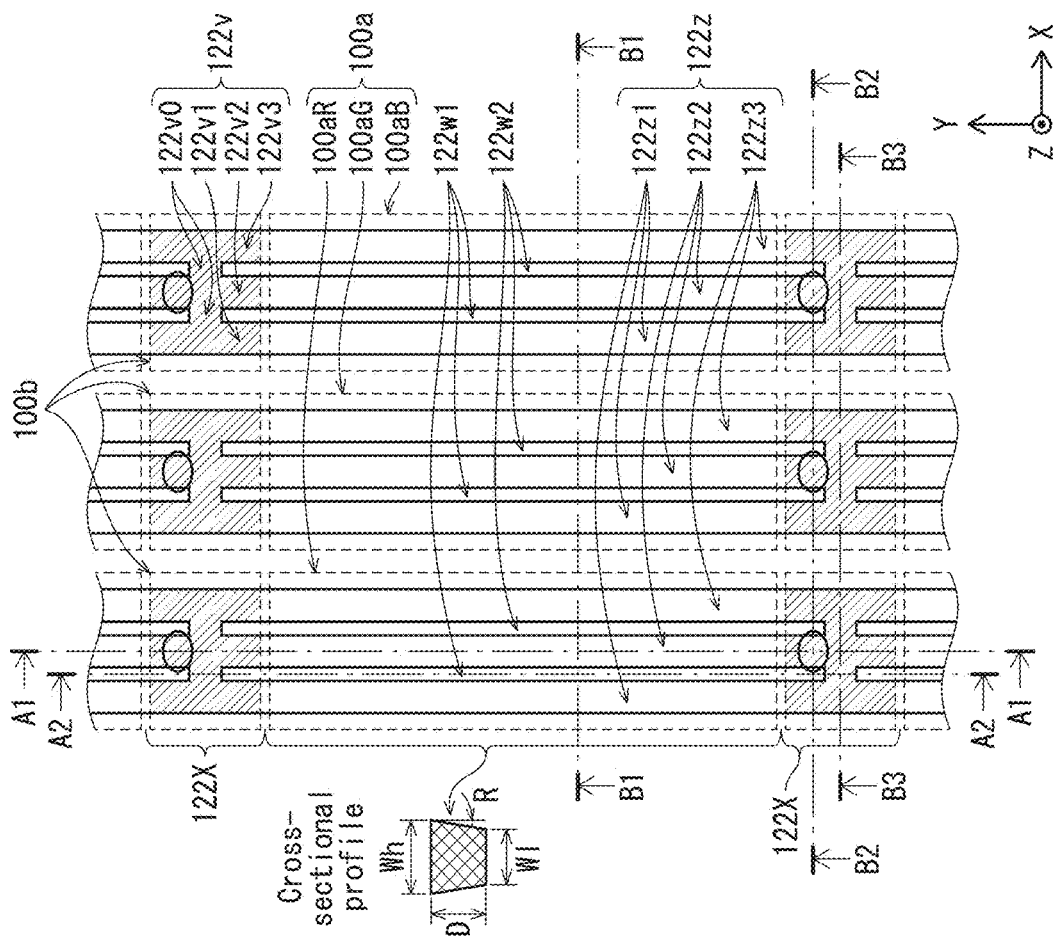
FIG. 4A is an enlarged plan view of a portion X1 in FIG. 3.
Figure 4B:
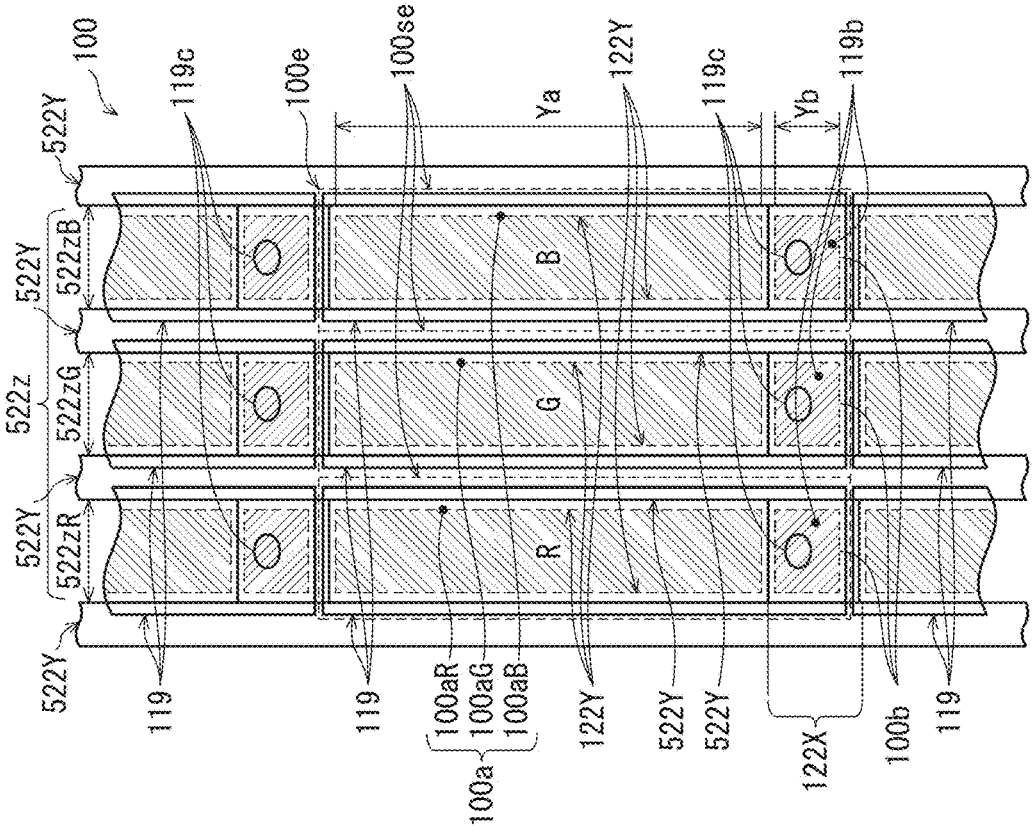
FIG. 4B is an enlarged plan view of the portion X1 viewed from above an insulating layer 122.

FIG. 3 is a schematic plan view showing part of the display panel 10 relating to the present embodiment. FIG. 4A is an enlarged plan view of a portion X1 in FIG. 3 indicating one pixel 100 of the display panel 10. FIG. 4B is an enlarged plan view of the portion X1 viewed from above an insulating layer 122.

The display panel 10 is an organic EL display panel that makes use of electroluminescence of organic compound. In the display panel 10, the organic EL elements 100 each constituting a pixel are arranged in a matrix on a substrate 100x (thin film transistor (TFT) substrate) on which TFTs are formed. The display panel 10 is of the top-emission type and emits light from an upper surface thereof. As shown in FIG. 3, the display panel 10 includes the organic EL elements 100, constituting the pixels, arranged in a matrix. Here, the X-direction, the Y-direction, and the Z-direction in FIG. 3 are respectively referred to as the row direction, the column direction, and the thickness direction in the display panel 10 in the present specification.

As shown in FIG. 3, the display panel 10 includes pixel electrode layers 119 that are arranged on the substrate 100x in a matrix, and includes an insulating layer 122 that covers the pixel electrode layers 119.

In the case where the insulating layer 122 has an upper limit film thickness of 10 μm or less, it is possible to perform shape control at the manufacturing in terms of variation in film thickness and control on bottom line thickness. Furthermore, in the case where the insulating layer 122 has an upper limit film thickness of 7 μm or less, it is possible to suppress an increase in operation process caused by an increase in exposure period during the exposure process, thereby to suppress a decrease in productivity during the mass production process. Also, the insulating layer 122 needs to have the film thickness and the bottom line thickness such that as the film thickness decreases, a difference therebetween decreases to substantially zero. The lower limit film thickness of the insulating layer 122 is determined in accordance with the resolution limit of materials and exposure machines. The insulating layer 122 having a lower limit film thickness of 1 μm or more can be manufactured with use of a semiconductor stepper. The insulating layer 122 having a lower limit film thickness of 2 μm or more can be manufactured with use of a stepper or scanner for flat panels. In view of the above, the insulating layer 122 should preferably have a film thickness of 1 μm to 10 μm, and more preferably a film thickness of 2 μm to 7 μm, for example. In the present embodiment, the insulating layer 122 has a film thickness of approximate 5.0 μm. The pixel electrode layers 119 are rectangular in plan view, and are made of a light-reflective material. The pixel electrode layers 119, which are arranged in a matrix, each correspond to any one of three subpixels 100aR, 100aG, and 100aB that are arranged in the row direction in the stated order (hereinafter referred to collectively as subpixels 100a when no distinction is made therebetween).

The insulating layer 122 is layered above the pixel electrode layers 119 which are arranged in a matrix. Above each of the pixel electrode layers 119, the insulating layer 122 has three elongated openings 122z1, 122z2, and 122z3. Also, as shown in FIG. 4B, the openings functioning as the reflector each have a predetermined trapezoidal cross section taken along a plane perpendicular to the longitudinal direction whose width increases upward. This configuration improves the light extraction efficiency of light emitting layers 123. Effective shape and refractive index conditions of the reflector will be described later.

A rectangular region surrounded by outer edges of the openings 122z1, 122z2, and 122z3 in the row direction and column direction constitutes a luminous region 100a where light is emitted by organic compound. Here, among gaps between the luminous regions 100a, gaps in the row direction between the luminous regions 100a arranged in the column direction are referred to as insulating sublayers 122X, and gaps in the column direction between the luminous regions 100a arranged in the row direction are referred to as insulating sublayers 122Y. Accordingly, outer edges of the luminous regions 100a in the row direction are defined by outer edges of the insulating sublayers 122X in the row direction, and outer edges of the luminous regions 100a in the column direction are defined by outer edges of the insulating sublayers 122Y in the column direction. Hereinafter, outer edges in the row direction and outer edges in the column direction are respectively referred to simply as row outer edges and column outer edges.

The insulating sublayers 122X extending in the row direction (the X-direction in FIG. 3) are each arranged in the column direction above the column outer edges of two pixel electrode layers 119 that are adjacent in the column direction and above a region adjacent to the column outer edges. A region where the insulating sublayer 122X is formed is a non-luminous region 100b. As shown in FIG. 3, the display panel 10 includes the luminous regions 100a and the non-luminous regions 100b that alternate in the column direction. In each of the non-luminous regions 100b, a connection concave part 119c (contact hole) connects the pixel electrode layer 119 and the source $S_1$ of the TFT via a connection electrode layer 117, and the pixel electrode layer 119 has a contact region 119b (contact window) for electrical connection.

The display panel 10 includes banks that are arranged in lines. Column banks 522Y extending in the column direction (the Y-direction in FIG. 3) are arranged in the row direction above the insulating sublayers 122Y, such that each of the column banks 522Y is arranged above the row outer edges of two pixel electrode layers 119 that are adjacent in the row direction and above a region adjacent to the row outer edges.

Each two adjacent column banks 522Y have a gap 522z therebetween, and accordingly the display panel 10 includes a large number of alternating column banks 522Y and gaps 522z.

The display panel 10 has three types of luminous regions 100a, namely luminous regions 100aR, 100aG, and 100aB that respectively emit red light, green light, and blue light (hereinafter referred to collectively as luminous regions 100a when no distinction is made therebetween). The gaps 522z include red gaps 522zR, green gaps 522zG, and blue gaps 522zB that respectively correspond to the luminous regions 100aR, 100aG, and 100aB (hereinafter referred to collectively as gaps 522z when no distinction is made therebetween). One set of the luminous regions 100aR, 100aG, and 100aB, which correspond to respective three subpixels 100se arranged in the row direction, constitutes a unit pixel 100e for color display.

Column light shielding sublayers 129Y are provided above the pixel electrode layers 119 so as to overlap row outer edges of the pixel electrode layers 119. Also, row light shielding sublayers 129X are provided above the pixel electrode layers 119 so as to overlap column outer edges of the pixel electrode layers 119 and so as not to partially overlap the contact regions 119b.

4. Configuration of Components of Display Panel 10

The following describes the configuration of the organic EL elements 100 of the display panel 10 with reference to schematic cross-sectional views in FIGS. 5 to 9. FIGS. 5, 6, 7, 8, and 9 are schematic cross-sectional views respectively taken along a line A1-A1, a line A2-A2, a line B1-B1, a line B2-B2, and a line B3-B3 in FIG. 4B.

The display panel 10 relating to the present embodiment is of an organic EL display panel of the top-emission type, and includes the substrate 100x (TFT substrate) on which the TFTs are formed in a lower part in the Z-axis direction and the organic EL element units are formed thereon.

4.1 Substrate 100x (TFT Substrate)

Figure 5:
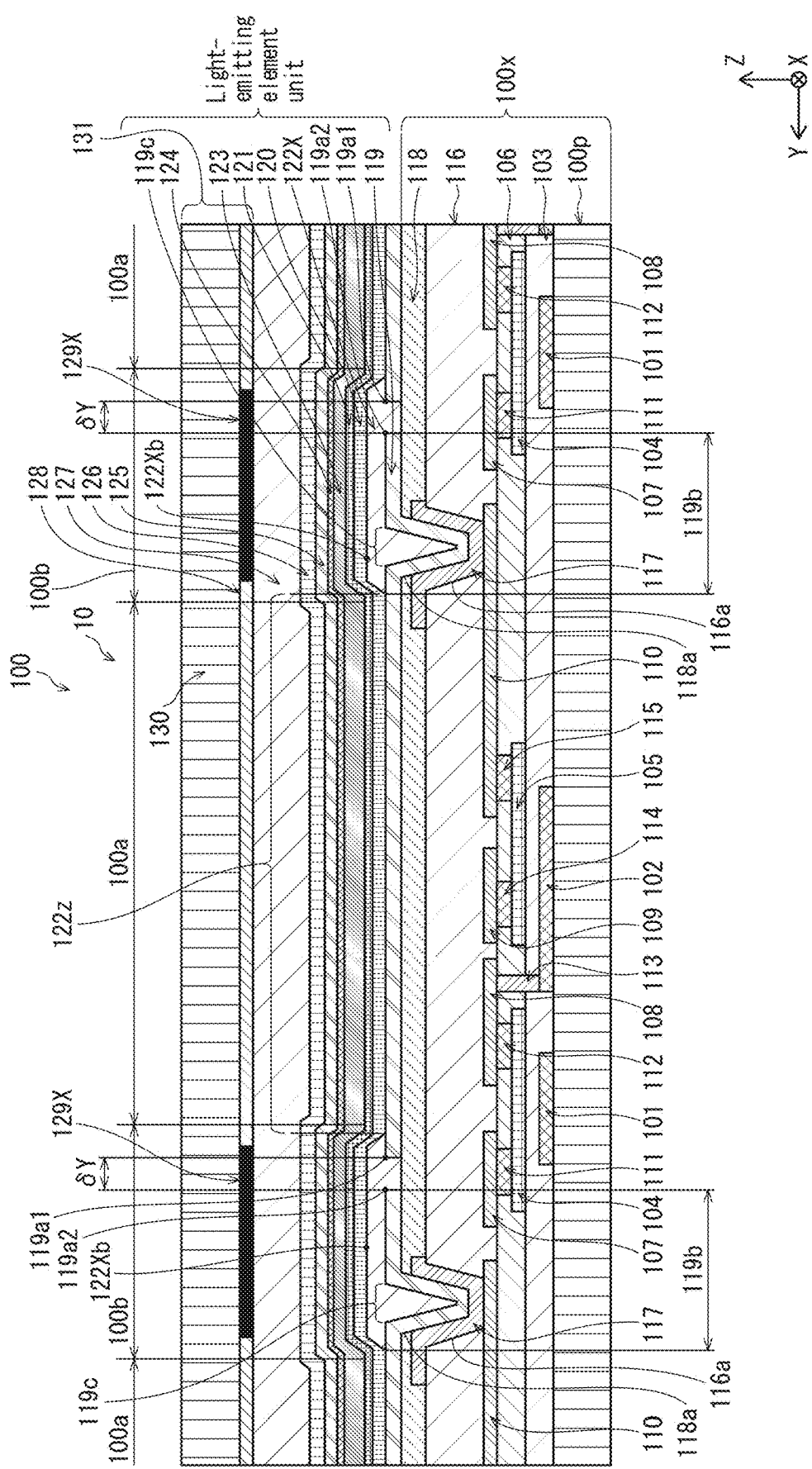
FIG. 5 is a schematic cross-sectional view taken along a line A1-A1 in FIG. 4B.

As shown in FIG. 5, gate electrodes 101 and 102 are formed with an interval therebetween on a lower substrate 100p, and a gate insulating layer 103 is formed so as to cover respective surfaces of the gate electrodes 101 and 102 and the lower substrate 100p. Channel layers 104 and 105 are formed on the gate insulating layer 103 so as to respectively correspond to the gate electrodes 101 and 102. A channel protection layer 106 is formed so as to cover respective surfaces of the channel layers 104 and 105 and the gate insulating layer 103.

Source electrodes 107 and drain electrodes 108 are formed with an interval therebetween on the channel protection layer 106 so as to correspond to the gate electrodes 101 and the channel layers 104. Similarly, source electrodes 110 and drain electrodes 109 are formed with an interval therebetween on the channel protection layer 106 so as to correspond to the gate electrode 102 and the channel layer 105.

Source lower electrodes 111 and 115 are respectively formed below the source electrodes 107 and 110 by being inserted through the channel protection layer 106. Drain lower electrodes 112 and 114 are respectively formed below the drain electrodes 108 and 109 by being inserted through the channel protection layer 106. The source lower electrodes 111 and the drain lower electrodes 112 have low portions in the Z-axis direction that are in contact with the channel layer 104. The drain lower electrodes 114 and the source lower electrodes 115 have low portions in the Z-axis direction that are in contact with the channel layer 105.

Also, the drain electrodes 108 are connected with the gate electrodes 102 via contact plugs 113 that are provided by being inserted through the gate insulating layer 103 and the channel protection layer 106.

Note that the gate electrodes 101, the source electrodes 107, and the drain electrodes 108 respectively correspond to the gate $G_2$, the source $S_2$, and the drain $D_2$ in FIG. 2. Similarly, the gate electrodes 102, the source electrodes 110, and the drain electrodes 109 respectively correspond to the gate $G_1$, the source $S_1$, and the drain $D_1$ in FIG. 2. Accordingly, the switching transistor $T_{r2}$ and the drive transistor $T_{r1}$ are respectively formed leftward and rightward in the Y-axis direction in FIG. 5.

Note that the above configuration is just an example, and the arrangement of the transistors $T_{r1}$ and $T_{r2}$ is not limited to that in FIG. 5 and any configuration may be employed such as top-gate, bottom-gate, channel-etch, and etch-stop.

Passivation layers 116 are formed so as to cover the respective surfaces of the source electrodes 107 and 110, the drain electrodes 108 and 109, and the channel protection layer 106. The passivation layers 116 have contact holes 116a above part of upper portions of the source electrodes 110. The connection electrode layers 117 are layered so as to be along side walls of the contact holes 116a.

The connection electrode layers 117 have lower portions in the Z-axis direction that are connected with the source electrodes 110, and also have upper portions that are partially on the passivation layers 116. An interlayer insulating layer 118 is layered so as to cover respective surfaces of the connection electrode layers 117 and the passivation layers 116.

4.2 Organic EL Element Unit (1) Pixel Electrode Layers 119

The pixel electrode layers 119 are formed in units of subpixels on the interlayer insulating layer 118. The pixel electrode layers 119 are provided for supplying carries to the light emitting layers 123. When functioning as anodes for example, the pixel electrode layers 119 supply holes to the light emitting layers 123. Also, since the display panel 10 is of the top-emission type, the pixel electrode layers 119 are light-reflective. The pixel electrode layers 119 are rectangular and plate-like. The pixel electrode layers 119 are arranged on the substrate 100x with intervals 6X therebetween in the row direction and with intervals 6Y therebetween in the column direction in the gaps 522z. Furthermore, the pixel electrode layers 119 have the connection concave parts 119c that are connected with the connection electrode layers 117 through contact holes 118a that are provided above the connection electrode layers 117 in the inter insulating layer 118. Accordingly, the pixel electrode layers 119 are each connected with the source $S_1$ of the TFT via the connection electrode layer 117. The connection concave parts 119c of the electrode layers 119 are concave toward the substrate 100x.

The pixel electrode layers 119 have column outer edges 119a1 and 119a2, and the connection concave parts 119c are provided on the side of the column outer edges 119a2. The contact regions 119b are ranges from the column outer edges 119a2 to regions including the connection concave parts 119c.

(2) Insulating Layer 122

The insulating layer 122 is made of an insulating material, and is formed so as to cover at least end edges of the pixel electrode layers 119 which are arranged in a matrix.

Figure 7:
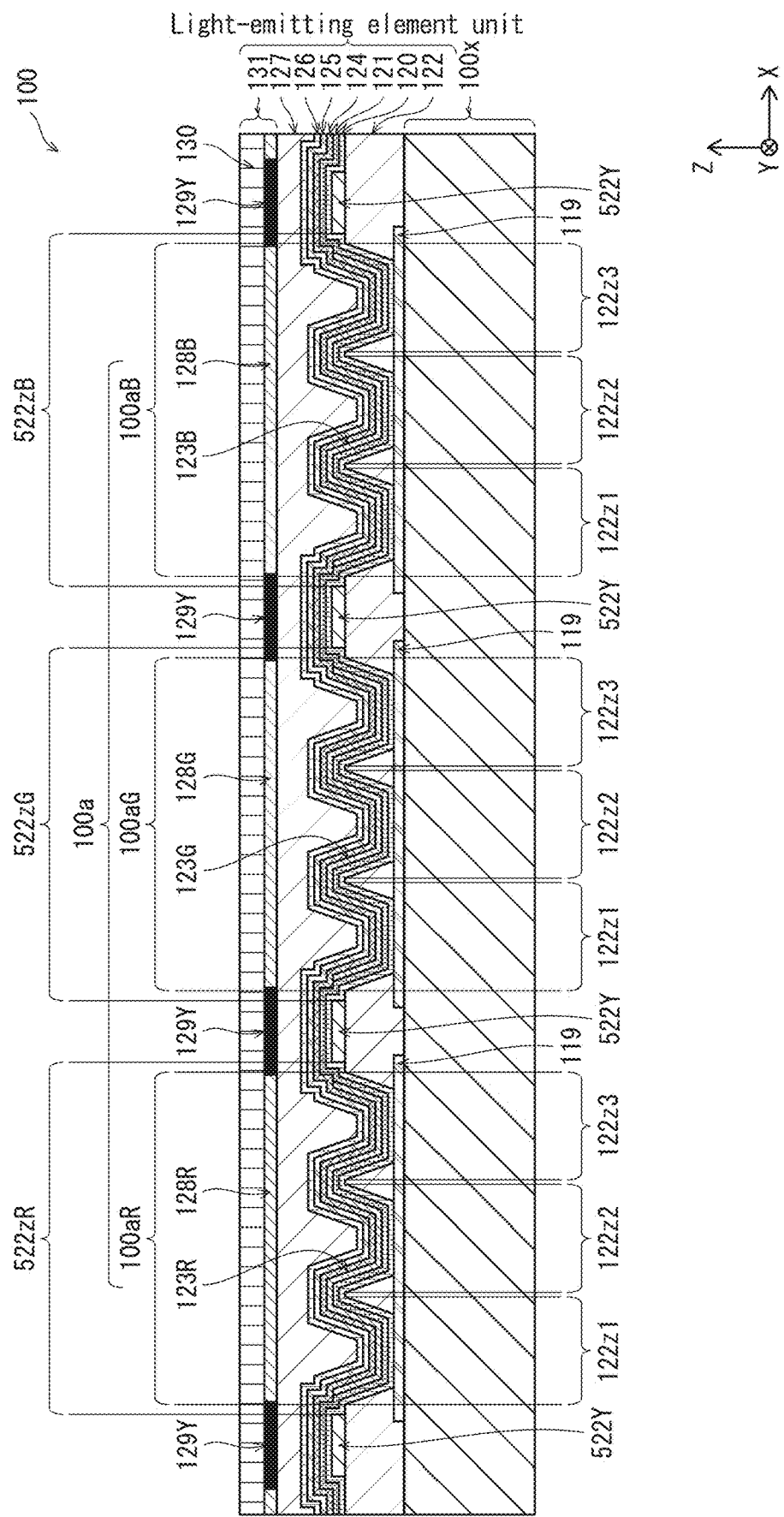
FIG. 7 is a schematic cross-sectional view taken along a line B1-B1 in FIG. 4B.

Above each of the pixel electrode layers 119 except the contact regions 119b, the insulating layer 122 has the elongated openings 122z. As shown in FIG. 7, in the openings 122z1, 122z2, and 122z3, the insulating layer 122 is not located on upper surfaces of the pixel electrode layers 119. The pixel electrode layers 119 are exposed in these openings so as to be in contact with a hole injection layer 120, which is described later. This configuration allows electrical charge supply in these openings from the pixel electrode layers 119 to the hole injection layer 120. Accordingly, the minimum rectangular region including the openings 122z1, 122z2, and 122z3 is the luminous region 100a where light is emitted by organic compound of any of the R, G, and B colors. Also, a gap of the insulating layer 122 between each two luminous regions 100a which are arranged in the column direction is the non-luminous region 100b. The insulating layer 122 has a bar 122w1, which is provided between each pair of the openings 122z1 and 122z2, and has a bar 122w2, which is provided between each pair of the openings 122z2 and 122z3.

Also, the insulating layer 122 includes the insulating sublayers 122Y, which are gaps between luminous regions 100a extending in the column direction and arranged in the row direction. Accordingly, the insulating sublayers 122Y define the row outer edges of the luminous regions 100a in the subpixels 100se. The insulating sublayers 122Y and the bars 122w1 and 122w2 each have a trapezoidal cross section taken along the row direction whose width decreases upward. With this configuration, the light emitting layers 123 efficiently emit light upward.

Also, the insulating layer 122 includes the insulating sublayers 122X (corresponding to the non-luminous regions 100b), which are gaps between luminous regions 100a extending in the row direction and arranged in the column direction. As shown in FIG. 4A, the insulating sublayers 122X are arranged above the contact regions 119b of the pixel electrode layers 119 and above the column outer edges 119a1 and 119a2 of the pixel electrode layers 119 which are adjacent to each other in the column direction. The insulating sublayers 122X cover the column outer edges 119a1 and 119a2 of the pixel electrode layers 119 thereby to prevent electric leakage between the pixel electrode layers 119 and the counter electrode layer 125, and thereby to define the column outer edges of the luminous regions 100a in the subpixels 100se.

Figure 8:
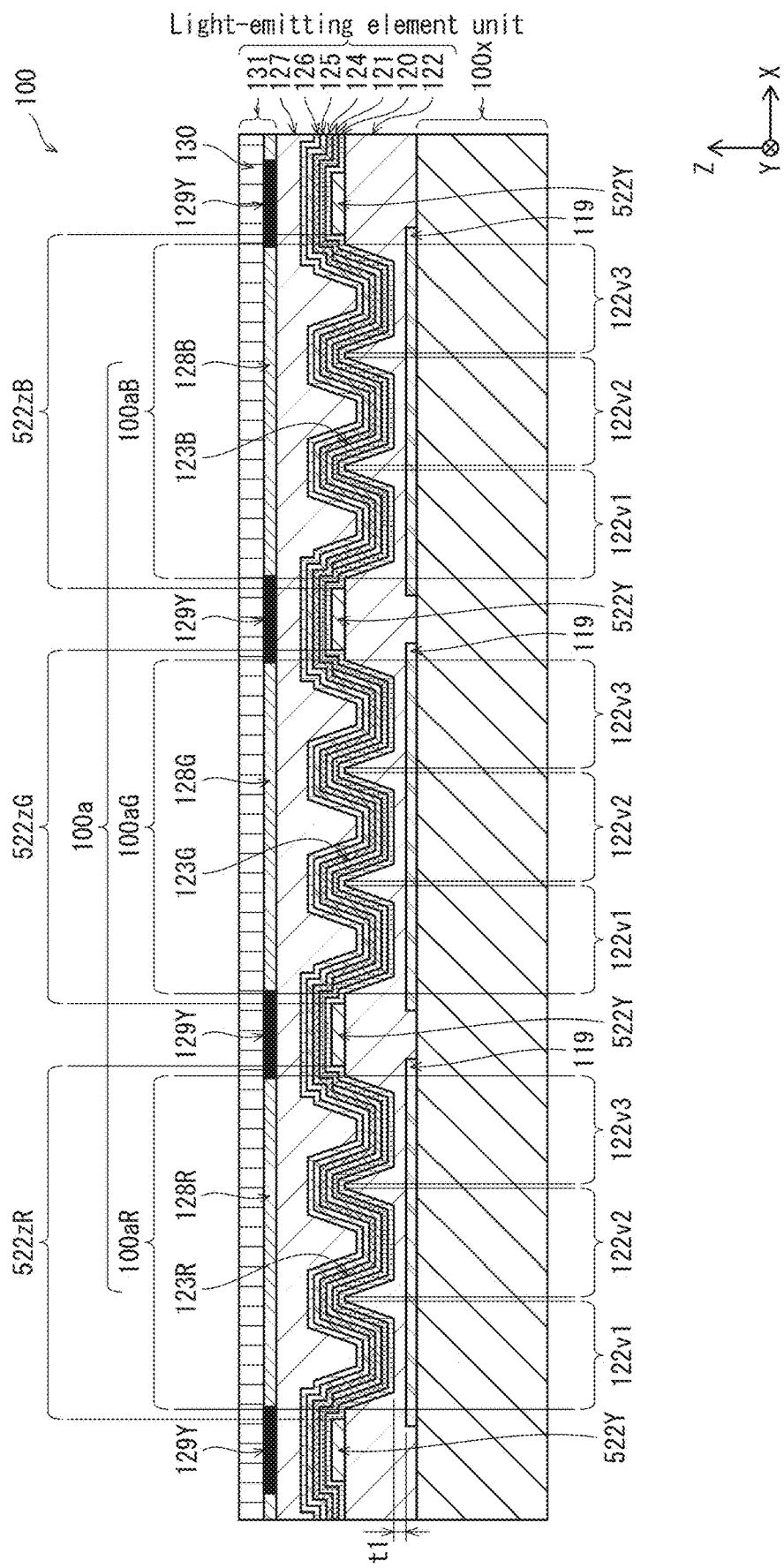
FIG. 8 is a schematic cross-sectional view taken along a line B2-B2 in FIG. 4B.

As shown in FIG. 8, the insulating sublayers 122X each have connection grooves 122v1, 122v2, and 122v3 with upper openings and bottoms. The connection grooves 122v1, 122v2, and 122v3 are respectively communicated with the openings 122z1, 122z2, and 122z3, which are provided in subpixels adjacent in the column direction above the substrate 100x. With this configuration, the connection grooves 122v1, 122v2, and 122v3 increase the flow of the ink, which contains organic compound as materials of the light emitting layers 123, in the column direction, thereby to suppress variation in application amount of the ink between the subpixels.

Figure 9:
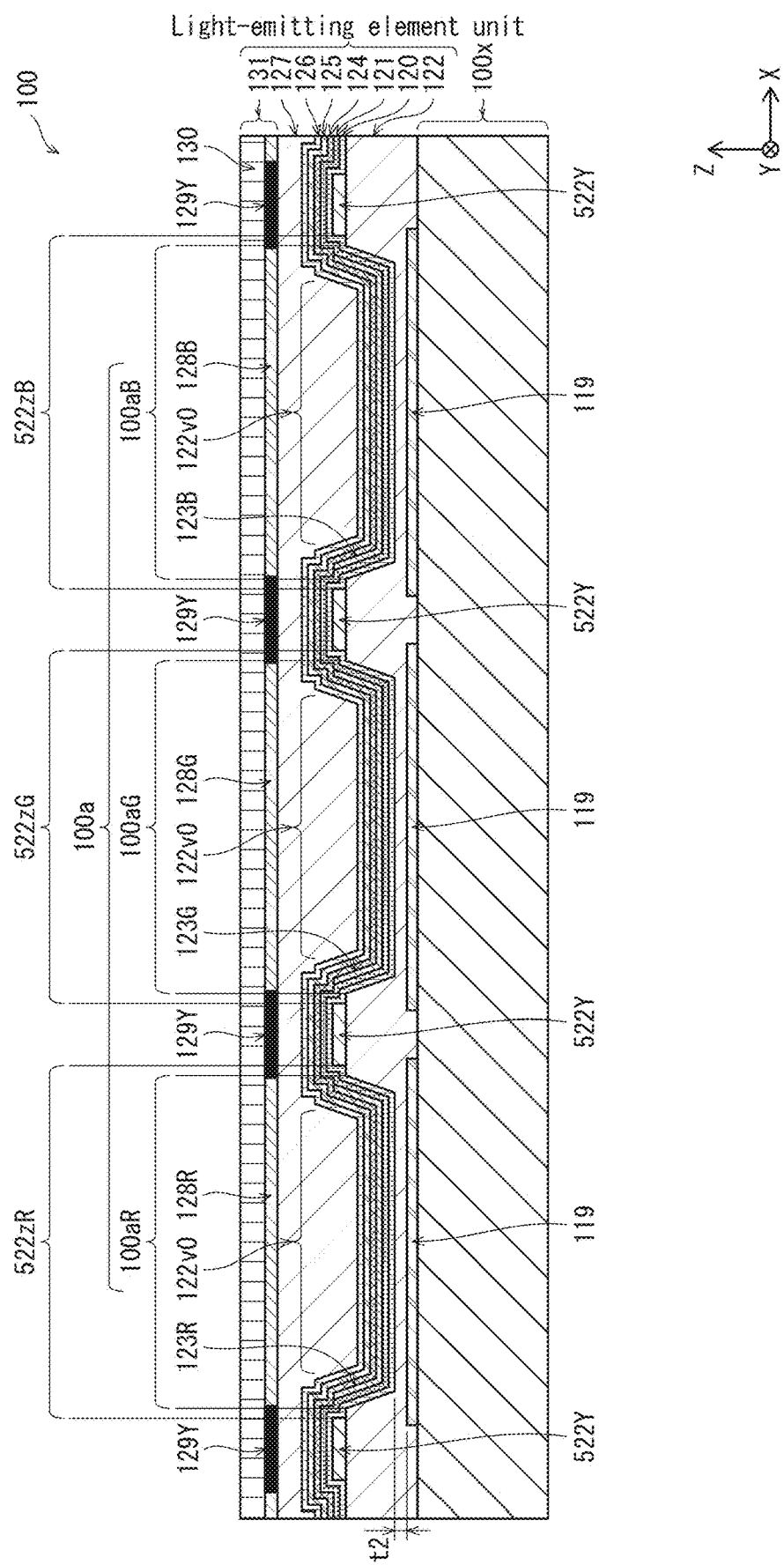
FIG. 9 is a schematic cross-sectional view taken along a line B3-B3 in FIG. 4B.

Also, as shown in FIG. 9, the insulating sublayers 122X each further have a bridging groove 122v0 having a bottom and extending in the row direction. The bridging groove 122v0 is communicated with the connection grooves 122v1, 122v2, and 122v3. With this configuration, the bridging groove 122v0 increases the flow of the ink, which contains organic compound as materials of the light emitting layers 123, between the connection grooves 122v1, 122v2, and 122v3, thereby to improve uniformity in application amount of the ink in each subpixel. Also, the pixel electrode layers 119 are not exposed in the bridging grooves 122v0 and the connection grooves 122v1, 122v2, and 122v3 of the insulating layer 122, which have groove-shape cross sections and have upper openings and bottoms. Accordingly, these grooves do not contribute to light emission.

As shown in FIG. 8, the grooves have trapezoidal cross sections taken along a plane perpendicular to the longitudinal direction whose width increases upward. In light of the ink spread, the upper limit of film thickness t1 of the insulating layer 122 in the connection grooves 122v1, 122v2, and 122v3 and the upper limit of film thickness t2 of the insulating layer 122 in the bridging grooves 122v0 each should preferably be 2 µm or less, and more preferably 1.2 µm or less, which further improves the ink spread. Also, in order to cover end parts of the pixel electrode layers 119 with the insulating layer 122 thereby to achieve manufacturing at a constant yield with no short between the pixel electrode layers 119 and the counter electrode layer 125, the respective lower limits of the film thickness t1 and t2 of the insulating layer 122 each should preferably be 0.1 µm or more, and more preferably 0.2 µm or more, which reduces the above short failure caused by variation in film thickness thereby to achieve stable manufacturing.

Accordingly, the film thickness t1 of the insulating layer 122 in the connection grooves 122v1, 122v2, and 122v3 and the film thickness t2 of the insulating layer 122 in the bridging grooves 122v0 each should preferably be 0.1 µm to 2 µm, and more preferably 0.2 µm to 1.2 µm, for example. In the present embodiment, the film thickness t1 and t2 is approximate 1.0 µm.

Here, the cross-sectional profiles of the openings 122z1, 122z2, and 122z3 are defined by the width in the row direction and the depth of the openings 122z1, 122z2, and 122z3. The cross-sectional profiles of the openings 122z1, 122z2, and 122z3 may be further defined by a rate of change of the width in the row direction to the depth of the openings 122z1, 122z2, and 122z3. According to the cross-sectional profiles of the openings defined by the parameters as above, the surface tension of the ink increases with (i) a decrease in width of the openings in the row direction, (ii) an increase in depth of the openings, or (iii) a decrease in rate of change of the width in the row direction to the depth of the openings. Thus, as the surface tension of the ink increases, the ink retention ability of the insulating layer 122 increases. This results in the light emitting layers 123 having an increased film thickness.

The display panel 10 has the configuration in which the cross-sectional profiles of the openings 122z1, 122z2, and 122z3 taken along the row direction are uniform in the column direction.

With this configuration, it is possible to suppress variation in factors that influence the ink retention ability in application of the ink containing organic compound as materials of the light emitting layers 123 during the manufacturing process. As a result, the ink is uniformly retained in the luminous region 100a of each subpixel, and thus variation in film thickness of the light emitting layers 123 is reduced to suppress luminance unevenness.

Alternatively, the display panel 10 may have the configuration in which the cross-sectional profiles of the openings 122z1, 122z2, and 122z3 may continuously vary along the column direction. Here, with respect to the above description "the cross-sectional profiles of the openings 122z1, 122z2, and 122z3 taken along the row direction are uniform in the column direction or continuously vary along the column direction.", this description means that the openings each have no part where the upper width in the row direction and the depth of the openings discontinuously vary along the column direction.

In the case where the display panel 10 has the configuration in which the cross-sectional profiles of the openings taken along the row direction are prevented from discontinuously varying along the column direction, it is possible to suppress rapid variation in factors that influence the ink retention ability, and thereby to suppress rapid variation in ink retention ability in the luminous regions of each pixel. This suppresses rapid variation in film thickness of the light emitting layers 123, and thereby to suppress steep luminance unevenness.

(3) Column Banks 522Y

The column banks 522Y, extending in the column direction, are arranged in the row direction above the insulating sublayers 122Y. The column banks 522Y define the row outer edges of the light emitting layers 123, which are formed by stemming the flow in the row direction of the ink containing organic compound as the material of the light emitting layers 123. The column banks 522Y are each provided above a pair of the row outer edges 119a3 and 119a4 of two adjacent pixel electrode layers 119 so as to partially overlap the pixel electrode layers 119. The column banks 522Y are linear and each have a trapezoidal cross section taken along the row direction whose width decreases upwards. The column banks 522Y are provided in the column direction so as to be perpendicular to the insulating sublayers 122X, and have upper surfaces that are higher in position than the upper surfaces 122xb of the insulating sublayers 122X.

(4) Hole Injection Layer 120 and Hole Transport Layer 121

A hole injection layer 120 and a hole transport layer 121 are layered in the stated order on the column banks 522Y and on the pixel electrode layers 119 in the openings 122z. The hole transport layer 121 is in contact with the hole injection layer 120. The hole injection layer 120 and the hole transport layer 121 have a function of transporting holes, which are injected from the pixel electrode layers 119, to the light emitting layers 123.

(5) Light Emitting Layers 123

The display panel 10 includes a large number of alternating column banks 522Y and gaps 522z. The light emitting layers 123 extend in the column direction on an upper surface of the hole transport layer 121 in the gaps 522z which are defined by the column banks 522Y. The light emitting layer 123 emitting light of the R, G, and B colors are formed respectively in the red gaps 522zR, the green gaps 522zG, and the blue gaps 522zB, which respectively correspond to the luminous regions 100aR, 100aG, and 100aB.

The light emitting layers 123 are made of organic compound, and have a function of emitting light through recombination of holes and electrons thereinside. In the gaps 522z, the light emitting layers 123 are provided so as to be linear and extend in the column direction.

Light is emitted from only parts of the light emitting layers 123 to which carriers are supplied from the pixel electrode layers 119, and accordingly no electroluminescence of organic compound occurs in regions of the light emitting layers 123 where the insulating layer 122 is provided, which is made of an insulating material. Thus, light is emitted from only parts of the light emitting layers 123, positioned in the openings 122z1, 122z2, and 122z3 where no insulating layer 122 is provided. These minimum rectangular regions including the openings 122z1, 122z2, and 122z3 are the luminous regions 100a.

In the light emitting layers 123, light is not emitted from parts that are located above the insulating sublayers 122X.

In other words, the non-luminous regions 100b correspond to the insulating sublayers 122X that are projected in plan view.

(6) Electron Transport Layer 124

An electron transport layer 124 is formed on the column banks 522Y and on the light emitting layers 123 in the gaps 522z which are defined by the column banks 522Y. In this example, the electron transport layer 124 extends over parts of the column banks 522Y that are exposed from the light emitting layers 123. The electron transport layer 124 has a function of transporting electrons, which are injected from the counter electrode layer 125, to the light emitting layers 123.

(7) Counter Electrode Layer 125

The counter electrode layer 125 is formed so as to cover the electron transport layer 124. The counter electrode layer 125 is continuous over the entire display panel 10, and may be connected to a bus-bar wiring per pixel or per several pixels (not shown). The counter electrode layer 125 and the pixel electrode layers 119 in pairs sandwich the light emitting layers 123 therebetween to form an energizing path to supply carries to the light emitting layers 123. When functioning as a cathode for example, the counter electrode layer 125 supplies electrons to the light emitting layers 123. The counter electrode layer 125 is formed so as to be along a surface of the electron transport layer 124, and is a common electrode for the light emitting layers 123.

Since the display panel 10 is of the top-emission type, the counter electrode layer 125 is made of a light-transmissive and conductive material. The counter electrode layer 125 is made for example of indium tin oxide (ITO) or indium zinc oxide (IZO). Alternatively, the counter electrode layer 125 may be a thin electrode film made of silver (Ag), aluminum (Al), or the like.

(8) Sealing Layer 126

A sealing layer 126 is formed so as to cover the counter electrode layer 125. The sealing layer 126 is provided in order to suppress degradation of the light emitting layers 123 due to exposure to moisture, air, and so on. The sealing layer 126 is provided for the entire display panel 10 so as to cover an upper surface of the counter electrode layer 125. Since the display panel 10 is of the top-emission type, the sealing layer 126 is made of a light-transmissive material such as silicon nitride and silicon oxynitride.

(9) Bond Layer 127

A bond layer 127 bonds the sealing layer 126 and a CF substrate 131 that is provided above the sealing layer 126 in the Z-axis direction. The CF substrate 131 includes an upper substrate 130 that has a lower main surface in the Z-axis direction on which color filter layers 128 and a light shielding layer 129 are formed. The bond layer 127 bonds a rear panel that is composed of the substrate 100X and the layers ranging from the pixel electrode layers 119 to the sealing layer 126, to the CF substrate 131. The bond layer 127 also has a function of preventing the layers from being exposed to moisture, air, and so on.

(10) Upper Substrate 130

The CF substrate 131, which includes the upper substrate 130 on which the color filter layers 128 and the light shielding layer 129 are formed, is bonded onto the bond layer 127. Since the display panel 10 is of the top-emission type, the upper substrate 130 is made of a light-transmissive material such as a cover glass and a transparent resin film. Also, providing the upper substrate 130 for example improves the rigidity of the display panel 10, and prevents moisture, air, and so on from intruding the display panel 10.

(11) Color Filter Layers 128

The color filter layers 128 are formed on the upper substrate 130 so as to correspond in position and color to the luminous regions 100a. The color filter layers 128 are transparent layers that are provided for transmitting visible light of wavelength corresponding to the R, G, and B colors, and have a function of transmitting light emitted from the R, G, and B pixels and correcting chromaticity of the light. In this example, the red color filter layers 128R, the green color filter layers 128G, and the blue color filter layers 128B are respectively formed above the luminous regions 100aR in the red gaps 522zR, the luminous regions 100aG in the green gaps 522zG, and the luminous regions 100aB in the blue gaps 522zB. Specifically, the color filter layers 128 are formed for example through a process of applying an ink containing color filter materials and a solvent to the upper substrate 130, which is made of a cover glass for color filter formation having openings arranged in a matrix in units of pixels.

(12) Light Shielding Layer 129

The light shielding layer 129 is formed on the upper substrate 130 so as to correspond in position to boundaries between the luminous regions 100a in the pixels.

The light shielding layer 129 is a black resin layer that is provided in order to prevent transmission of visible light of wavelength corresponding to the R, G, and B colors. The light shielding layer 129 is made for example of a resin material including black pigment having excellent light absorbing property and light shielding property. The light shielding layer 129 is provided also in order to prevent external light from entering the display panel 10, prevent the internal components from being seen through the upper substrate 130, and suppress reflection of external light thereby to achieve the contrast improvement of the display panel 10, and so on. Note that reflection of external light is a phenomenon caused when external light, which has entered the display panel 10 from above the upper substrate 130, is reflected at the pixel electrode layers 119 and thus is emitted from the upper substrate 130.

Also, the light shielding layer 129 has a function of blocking leakage of light emitted from each of the R, G, and B pixels to an adjacent pixel, thereby to prevent unclear boundaries between the pixels. The light shielding layer 129 further has a function of increasing the color purity of light emitted from the pixels.

The light shielding layer 129 includes the column light shielding sublayers 129Y, which extend in the column direction and are arranged in the row direction, and the row light shielding sublayers 129X, which extend in the row direction and are arranged in the column direction. A lattice shape is formed by the column light shielding sublayers 129Y and the row light shielding sublayers 129X. In the organic EL elements 100, the column light shielding sublayers 129Y are arranged so as to overlap the insulating sublayers 122Y as shown in FIG. 7, and the row light shielding sublayers 129X are arranged so as to overlap the insulating sublayers 122X as shown in FIG. 5.

4.3 Materials of Components

Figure 6:
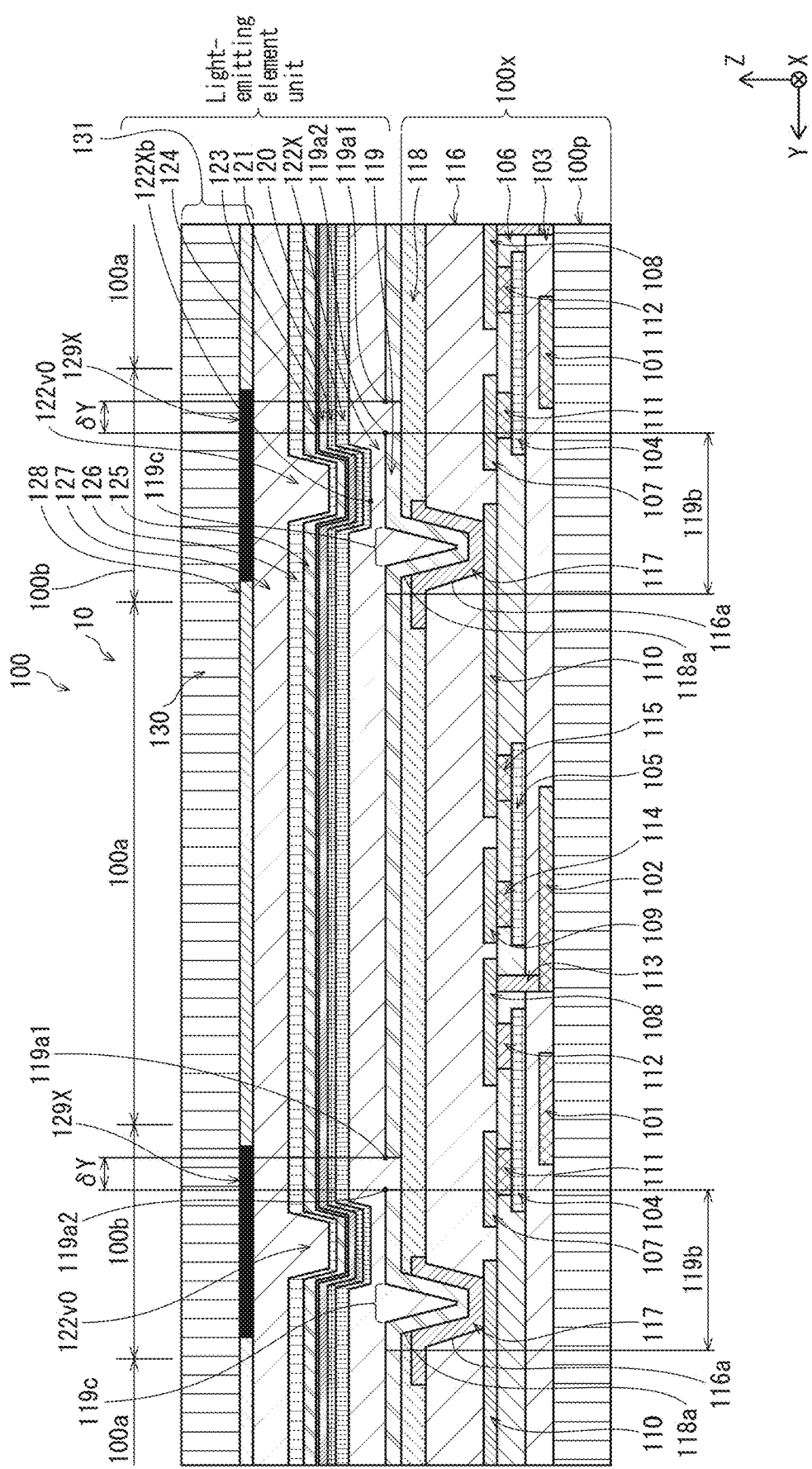
FIG. 6 is a schematic cross-sectional view taken along a line A2-A2 in FIG. 4B.

The following describes an example of materials of the components shown in FIGS. 5 to 7.

(1) Substrate 100x (TFT Substrate)

The substrate 100x is made of a known material for TFT substrate.

The lower substrate 100p is for example a glass substrate, a quartz substrate, a silicon substrate, a metal substrate made of molybdenum sulfide, copper, zinc, aluminum, stainless, magnesium, iron, nickel, gold, or silver, a semiconductor substrate made of gallium arsenide base or the like, or a plastic substrate.

Either thermoplastic resin or thermosetting resin may be used as a plastic material. The plastic material may be for example a single layer of any one type of the following materials or a laminate of any two or more types of the following materials including polyethylene, polypropylene, polyamide, polyimide (PI), polycarbonate, acrylic resin, polyethylene terephthalate (PET), polybutylene terephthalate, polyacetal, other fluororesin, thermoplastic elastomer such as styrene elastomer, polyolefin elastomer, polyvinyl chloride elastomer, polyurethane elastomer, fluorine rubber elastomer, and chlorinated polyethylene elastomer, epoxy resin, unsaturated polyester resin, silicone resin, polyurethane, or copolymer, blend, polymer alloy or the like mainly including such a material.

The gate electrodes 101 and 102 are made for example of a laminate of copper (Cu) and molybdenum (Mo). Alternatively, other metal material is adoptable.

The gate insulating layer 103 is made for example of any known electrically-insulating material such as silicon dioxide ($SiO_2$) and silicon nitride (SiNx), regardless of whether the material is organic or inorganic.

The channel layers 104 and 105 are made of oxide semiconductor including at least one of indium (In), gallium (Ga), and zinc (Zn).

The channel protection layer 106 is made for example of silicon oxynitride (SiON), silicon nitride (SiN), or aluminum oxide (AlOx).

The source electrodes 107 and 110 and the drain electrodes 108 and 109 are made for example of a laminate of copper-manganese (CuMn), copper (Cu), and molybdenum (Mo).

The similar material is adoptable for the source lower electrodes 111 and 115 and the drain lower electrodes 112 and 114.

The passivation layers 116 are made for example of silicon dioxide ($SiO_2$), a combination of silicon nitride (SiN) and silicon oxynitride (SiON), or a combination of silicon oxide (SiO) and silicon oxynitride (SiON).

The connection electrode layers 117 are made for example of a laminate of copper-manganese (CuMn), copper (Cu), and molybdenum (Mo). Alternatively, the material of the connection electrode layers 117 may be appropriately selected from conductive materials.

The interlayer insulating layer 118 is made for example of an organic compound such as polyimide, polyamide, and acrylic resin, and has a film thickness of 2000 nm to 8000 nm for example.

(2) Pixel Electrode Layers 119

The pixel electrode layers 119 are made of a metal material. The display panel 10 relating to the present embodiment, which is of the top-emission type, should preferably have a surface part that is highly light-reflective. In the display panel 10 relating to the present embodiment, the pixel electrode layers 119 each may be a laminate including layers selected from a metal layer, an alloy layer, and a transparent conductive layer. The metal layer is made for example of a metal material including silver (Ag) or aluminum (Al). The alloy layer is made for example of alloy of silver, palladium, and copper (APC), alloy of silver, rubidium, and gold (ARA), alloy of molybdenum and chromium (MoCr), or alloy of nickel and chromium (NiCr). The transparent conductive layer is made for example of indium tin oxide (ITO) or indium zinc oxide (IZO).

(3) Insulating Layer 122

The insulating layer 122 is made of an insulating material. The organic material of the insulating layer 122 is for example an organic photosensitive resin material such as acrylic resin, polyimide resin, and novolac phenolic resin. Acrylic resin should preferably be used because of having a low refractive index and thus being desirable as a reflector. In the case where the insulating layer 122 is made of an inorganic material, silicon oxide (SiO) for example should preferably be used in terms of refractive index. The insulating layer 122 has a film thickness of approximate 5 μm. The film thickness of the insulating layer 122 is not limited to this, and alternatively may fall within a range of for example 0.1 μm to 10 μm.

(4) Column Banks 522Y

The column banks 522Y are made of an insulating organic material such as resin. Examples of the organic material of the column banks 522Y include acrylic resin, polyimide resin, and novolac phenolic resin. The column banks 522Y should preferably have an organic solvent resistance. Also, the column banks 522Y sometimes undergo an etching process, a baking process, and so on during the manufacturing process, and accordingly should preferably be made of a highly resistant material in order to avoid excessive distortion, transformation, and the like due to such processes. Also, fluorine processing may be performed on surfaces of the column banks 522Y in order to provide the surfaces with water repellency. Alternatively, the column banks 522Y may be made of a material containing fluorine.

(5) Hole Injection Layer 120

The hole injection layer 120 is made for example of oxide of a metal such as silver (Ag), molybdenum (Mo), chromium (Cr), vanadium (V), tungsten (W), nickel (Ni), and iridium (Jr), or a conductive polymer material such as polyethylenedioxythiophene (PEDOT).

In the case where the hole injection layer 120 is made of oxide of transition metal, the hole injection layer 120 has energy levels because oxide of transition metal has oxidation numbers. This facilitates hole injection, and thus reduces driving voltage.

(6) Hole Transport Layer 121

The hole transport layer 121 is made for example of a high-molecular compound such as polyfluorene, polyfluorene derivative, polyallylamine, and polyallylamine derivative.

(7) Light Emitting Layers 123

The light emitting layers 123 have a function of emitting light by excitation resulting from injection and recombination of holes and electrons, as described above. The light emitting layers 123 need to be made of a luminous organic material by a wet printing method.

Specifically, the light emitting layers 123 should preferably be made for example of a fluorescent substance disclosed in Japanese Patent Application Publication No. H05-163488, such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, and metal complex of 8-hydroxyquinoline compound, metal complex of 2-bipyridine compound, complex of a Schiff base and group III metal, oxine metal complex, and rare earth complex.

(8) Electron Transport Layer 124

The electron transport layer 124 is made for example of oxydiazole derivative (OXD), triazole derivative (TAZ), or phenanthroline derivative (BCP Bphen).

(9) Counter Electrode Layer 125

The counter electrode layer 125 is made for example of indium tin oxide (ITO) or indium zinc oxide (IZO). Alternatively, the counter electrode layer 125 may be a thin electrode film made of silver (Ag), aluminum (Al), or the like.

(10) Sealing Layer 126

The sealing layer 126 has a function of preventing the organic layers such as the light emitting layers 123 from being exposed to moisture, air, and so on. The sealing layer 126 is made for example of a light-transmissive material such as silicon nitride (SiN) and silicon oxynitride (SiON). Also, a resin sealing layer that is made of a resin material such as acrylic resin and silicone resin may be provided on a layer that is made of a material such as silicon nitride (SiN) and silicon oxynitride (SiON).

Since the display panel 10 relating to the present embodiment is of the top-emission type, the sealing layer 126 needs to be made of a light-transmissive material.

(11) Bond Layer 127

The bond layer 127 is made for example of a resin adhesive. A light-transmissive resin material is adoptable such as acrylic resin, silicone resin, and epoxy resin.

(12) Upper Substrate 130

The upper substrate 130 is made for example of a light-transmissive material such as glass, quartz, and plastic.

(13) Color Filter Layers 128

The color filter layers 128 are made of a known resin material (for example, the color resist manufactured by JSR Corporation) or the like.

(14) Light Shielding Layer 129

The light shielding layer 129 is made mainly of an ultraviolet curable resin, such as an ultraviolet curable acrylic resin, to which black pigment is added. The black pigment is for example carbon black pigment, titanium black pigment, metal oxide pigment, or organic pigment.

4.4 Improvement of Light Extraction Efficiency by Reflector

The display panel 10 includes: the reflector (reflective structure) that is constituted from the insulating layer 122, which has the openings 122z, and the bond layer 127, which has a rear surface that is convex along the openings 122z of the insulating layer 122; and the light emitting layers 123, which are provided between the insulating layer 122 and the bond layer 127. The openings 122z have profiles of trapezoidal cross sections taken along the row direction whose width increase upward. When the refractive indices of the bond layer 127 and the insulating layer 122 are represented by $n_1$ and $n_2$, respectively, the following relationships are satisfied.

$$1.1 \leq n_1 \leq 1.8 \quad \text{(Formula 1)}$$

$$|n_1 - n_2| \geq 0.20 \quad \text{(Formula 2)}$$

Here, the refractive index $n_2$ should preferably be 1.4 to 1.6.

Also, when a depth, an upper width, and a lower width in the cross section of the openings 122z are represented by D, $W_h$, and $W_l$, respectively, the following relationships should preferably be satisfied.

$$0.5 \leq W_l/W_h \leq 0.8 \quad \text{(Formula 3)}$$

$$0.5 \leq D/W_l \leq 2.0 \quad \text{(Formula 4)}$$

With the above shape and refractive index conditions, it is possible to improve the light extraction efficiency of the light emitting layers 123 owing to the openings 122z of the insulating layer 122, which function as the reflector. According to the inventors' consideration, this results in increase of luminance per subpixel by 1.2 times to 1.5 times of that in display panels with no reflector.

Figure 10A:
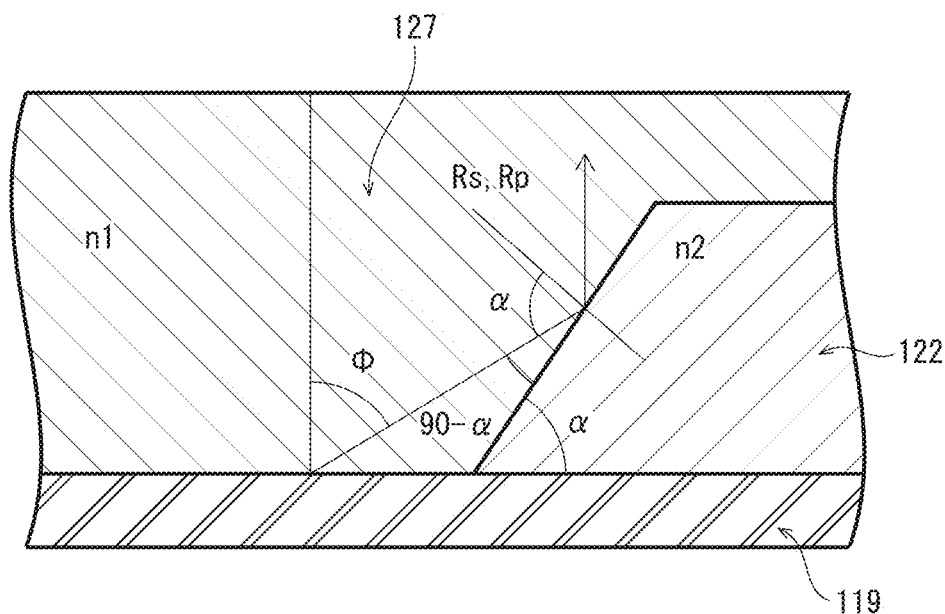
FIG. 10A is a schematic view showing a method of calculating a gradient α formed by walls of openings 122z for achieving total reflection in organic EL elements 100.
Figure 10B:
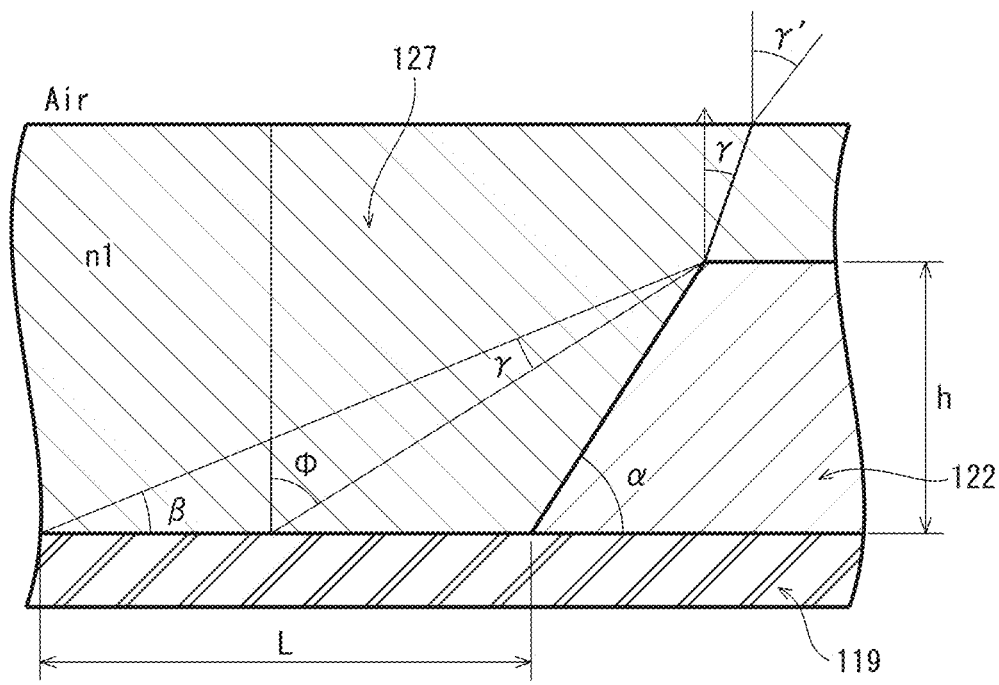
FIG. 10B is a schematic view showing a method of calculating an effective luminous range L where emitted light is reflected at the walls of the openings 122z to reach an effective viewing angle γ'.

FIG. 10A is a schematic view showing a method of calculating a gradient α formed by the walls of the openings 122z for achieving total reflection in the organic EL elements 100 with the reflector. FIG. 10B is a schematic view showing a method of calculating an effective luminous range L where emitted light is reflected at the walls of the openings 122z to reach an effective viewing angle γ'.

When an incident angle at the walls of the openings 122z is represented by φ in FIG. 10A, the following relationships are satisfied.

$$\varphi = 2(90 - \alpha) = 180 - 2\alpha \quad \text{(Formula 7)}$$

$$\alpha = 90 - \varphi/2 \quad \text{(Formula 8)}$$

A gradient $\alpha_z$ for achieving total reflection is calculated by the following relationship.

$$\alpha_z = a\sin(n_2/n_1) \quad \text{(Formula 9)}$$

The effective luminous range L, which is a range where emitted light is reflected at the walls of the openings 122z to reach the effective viewing angle γ', in FIG. 10B is calculated by the following relationships.

$$\gamma = \sin^{-1}(\sin \gamma'/n_1)) \quad \text{(Formula 10)}$$

$$\beta = 90 - \varphi - \gamma \quad \text{(Formula 11)}$$

$$L = h(1/\tan \beta - 1/\tan \alpha) \quad \text{(Formula 12)}$$

For example, relationships $n_1=1.8$, α=70°, γ'=20°, and h=5 μm are satisfied, the following relationships are satisfied: φ=40°, γ=11°, β=39°, and L=4.4 μm.

5. Manufacturing Method of Display Panel 10

The following describes a manufacturing method of the display panel 10 with reference to the drawings. FIGS. 11A to 11E, FIGS. 12A to 12D, and FIGS. 13A to 13C are schematic cross-sectional views showing the processes of manufacturing the display panel 10, taken along a line at the same position as the line A1-A1 in FIG. 4B. FIGS. 15A to 15D and FIGS. 16A to 16C are schematic cross-sectional views showing the processes of manufacturing the display panel 10, taken along a line at the same position as the line A2-A2 in FIG. 4B. FIGS. 18A to 18D and FIGS. 19A to 19D are schematic cross-sectional views showing the processes of manufacturing the display panel 10, taken along a line at the same position as the line B1-B1 in FIG. 4B.

(1) Formation of Substrate 100x (TFT Substrate)

Figure 11A:
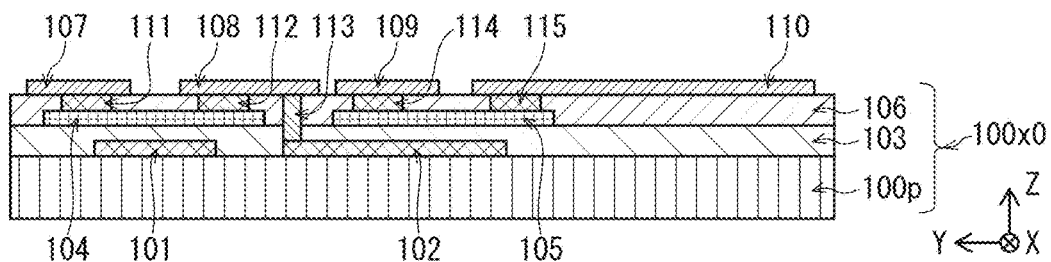
FIGS. 11A to 11E are schematic cross-sectional views of the organic EL display panel 10 during manufacture, taken along a line at the same position as the line A1-A1 in FIG. 4B.

First, a substrate 100x0 is prepared. The substrate 100x0 has formed thereon components from drain electrodes 101 and 102 to source electrodes 107 and 110 and drain electrodes 108 and 109. The substrate 100x0 is manufactured by a known TFT manufacturing method (FIG. 11A).

Figure 11B:
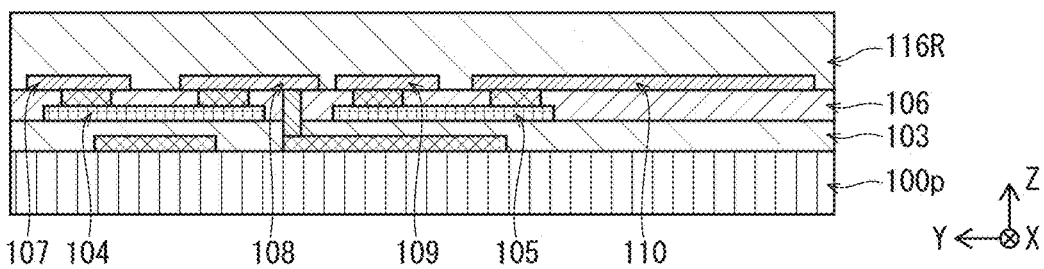

Next, passivation layers 116 are formed for example with a plasma CVD method or a sputtering method so as to cover the source electrodes 107 and 110, the drain electrodes 108 and 109, and a channel protection layer 106 (FIG. 11B).

Figure 11C:
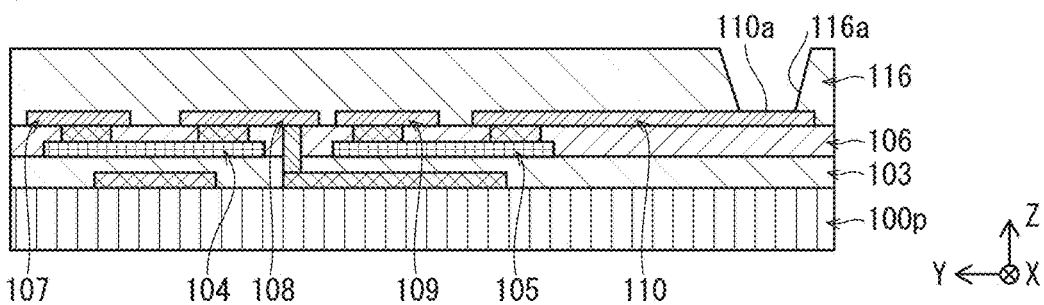

Next, a contact hole 116a is provided in each of the source electrodes 110 in the passivation layers 116 with a dry etching method (FIG. 11C). The contact hole 116a is provided so as to have a bottom in which a surface of the source electrode 110 is exposed.

Figure 11D:
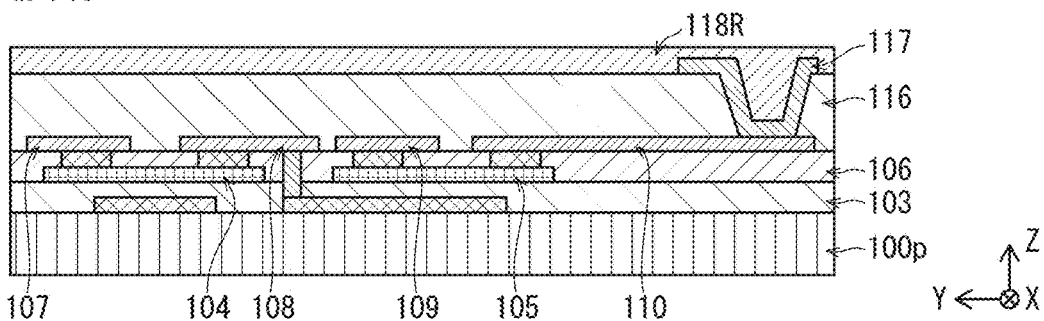

Next, connection electrode layers 117 are formed so as to be along inner walls of the contact holes 116a provided in the passivation layers 116. The connection electrode layers 117 have upper portions that are partially on the passivation layers 116. The connection electrode layers 117 are formed by forming a metal film with for example the sputtering method, and then patterning the metal film with a photolithography method and a wet etching method. Furthermore, an interlayer insulating layer 118 is formed by applying an organic material onto the connection electrode layers 117 and the passivation layers 116 so as to cover these layers and planarizing a surface of the applied organic material (FIG. 11D).

(2) Formation of Pixel Electrode Layers 119

Figure 11E:
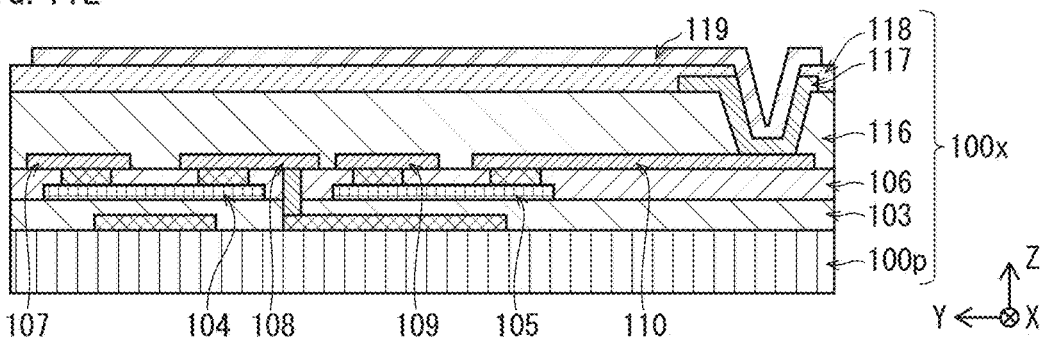

Contact holes are provided above the connection electrode layers 117 in the interlayer insulating layer 118. Then, pixel electrode layers 119 are formed in the contact holes (FIG. 11E). The pixel electrode layers 119 are formed by forming a metal film with the sputtering method, a vacuum deposition method, or the like, and then patterning the metal film with the photolithography method. Note that the pixel electrode layers 119 are electrically connected with the connection electrode layers 117.

(3) Formation of Insulating Layer 122

Figure 15A:
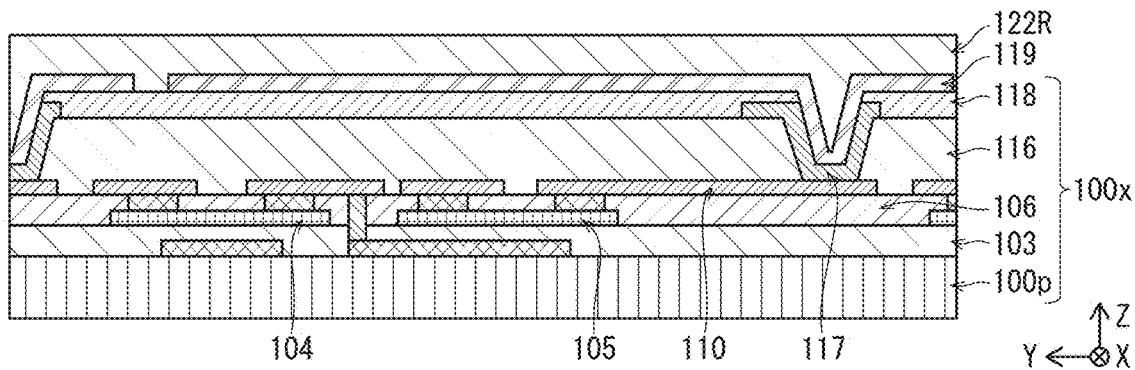
FIGS. 15A to 15D are schematic cross-sectional views of the organic EL display panel 10 during manufacture, taken along a line at the same position as the line A2-A2 in FIG. 4B.
Figure 15B:
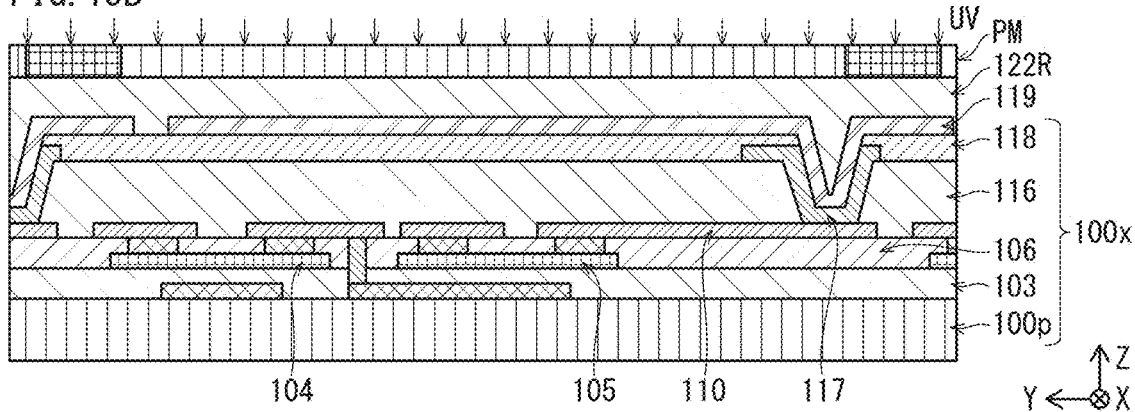
Figure 18A:
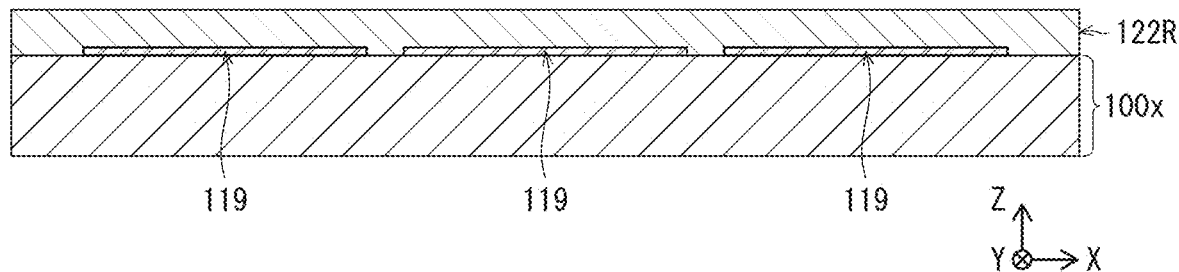
FIGS. 18A to 18D are schematic cross-sectional views of the organic EL display panel 10 during manufacture, taken along a line at the same position as the line B1-B1 in FIG. 4B.

In a formation process of an insulating layer 122, a photosensitive resin film 122R is formed using an organic photosensitive resin material such as acrylic resin, polyimide resin, and novolac phenolic resin (FIGS. 12A, 15A, and 18A). Then, the photosensitive resin film 122R is dried and a solvent thereof is vaporized to a certain degree. Then, a photomask PM having predetermined openings is overlaid above the photosensitive resin film 122R. Ultraviolet irradiation is performed on the photomask PM thereby to expose a photoresist made of photosensitive resin or the like to transfer patterns of the photomask PM to the photoresist (FIGS. 12B and 15B).

In the present embodiment, the photomask PM is for example a halftone mask for positive photoresists that includes transmissive parts (vertical stripe portions in the figures) corresponding to openings 122z and semi-transmissive parts (lattice portions in the figures) corresponding to grooved portions 122v. The transmissive parts are parts through which light transmits. The semi-transmissive parts are intermediate between the transmissive parts and light shielding parts in terms of transmissivity. As a result of the exposure, the photoresist has opening patterns corresponding in shape to the transmissive parts, which correspond to the openings 122z, and has groove patterns having an intermediate exposure amount and corresponding in shape to the semi-transmissive parts, which correspond to the grooved portions 122v. With use of the halftone mask, it is possible to form patterns having different exposure amounts in a photoresist by a single exposure.

Figure 15C:
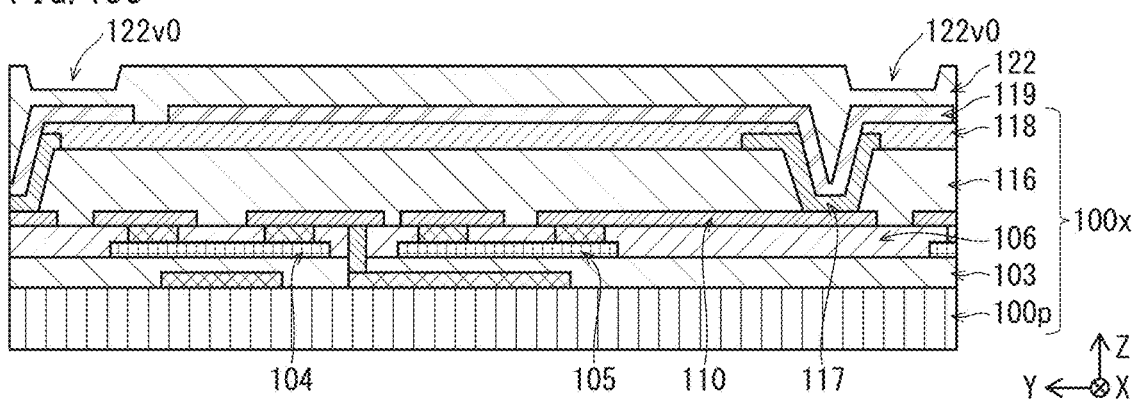
Figure 18B:
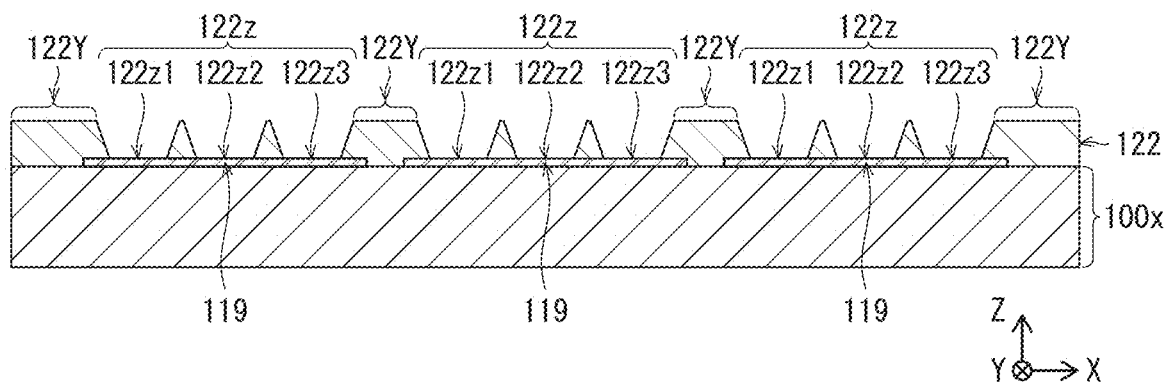

Next, development and firing are performed on the photoresist on which patterns of insulating sublayers 122X and 122Y, openings 122z, and grooves parts 122v are formed. As a result, an insulating layer 122 is complete (FIGS. 12C, 15C, and 18B). Parts of the photoresist, which have the opening patterns with the highest exposure amount, are developed and removed, and this results in no insulating layer 122. Parts of the photoresist, which have the groove patterns with the intermediate exposure amount, are developed and fired, and thus result in the insulating layer 122 having a film thickness of approximate 1 μm. At this time, the opening 122z and the grooved portions 122v each have a trapezoidal cross-section taken along a plane perpendicular to the longitudinal direction whose width increases upward, as described above. Meanwhile, parts of the photoresist, which are not exposed, result in the insulating layer 122. In this way, patterning for the insulating layer 122 is performed such that the insulating sublayers 122X and 122Y surround regions defining pixels, the surfaces of the pixel electrode layers 119 are exposed in the openings 122z, and the insulating layer 122 has the film thickness of approximate 1 μm in the bottoms of the grooved portions 122v.

(4) Formation of Column Banks 522Y

Figure 15D:
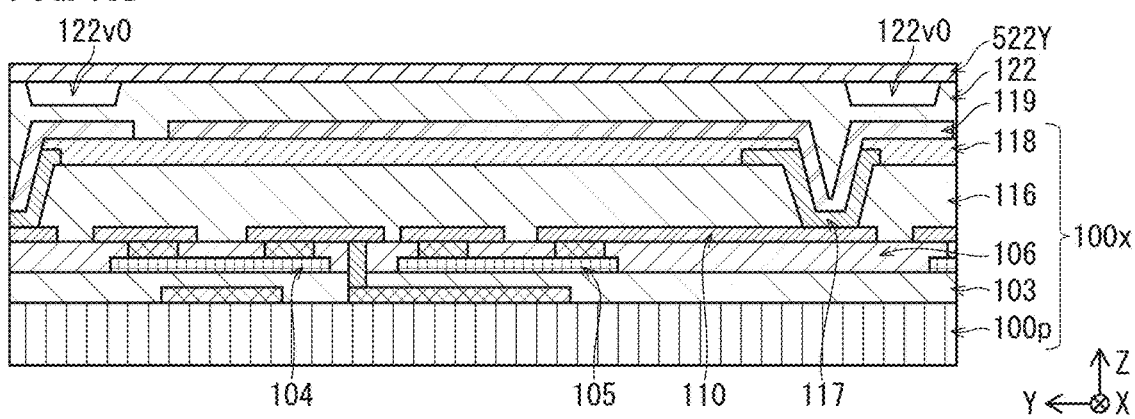
Figure 18C:
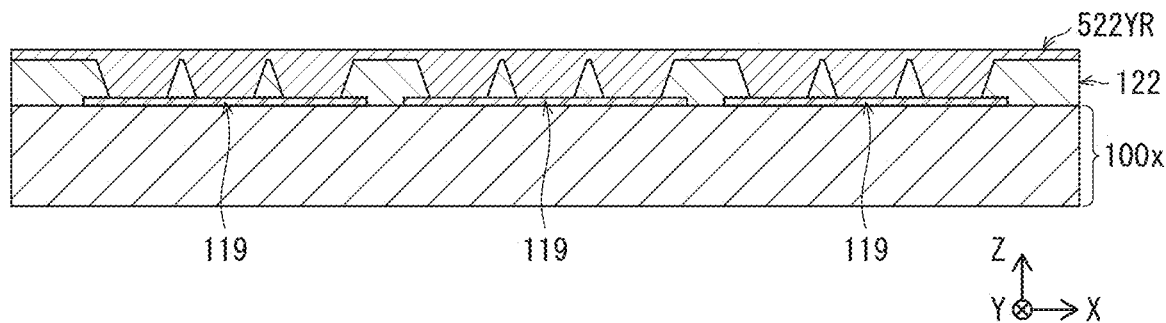
Figure 18D:
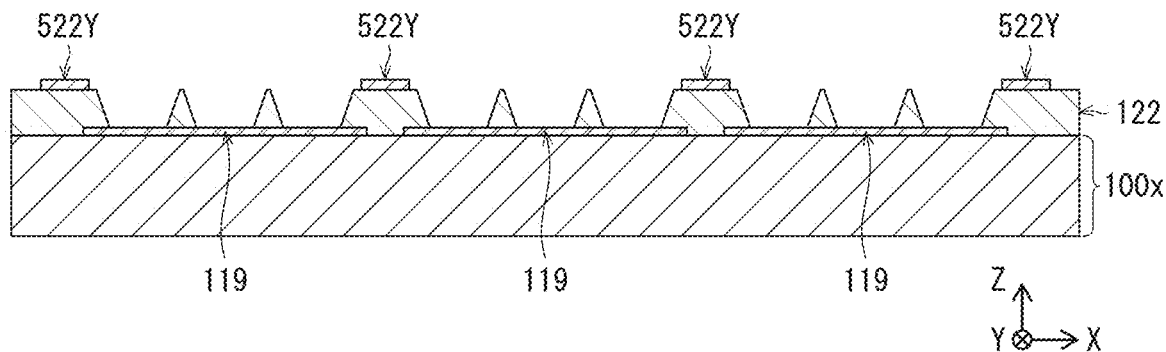

Column banks 522Y are formed as follows. First, a film 522YR made of a material of the column banks 522Y such as a photosensitive resin material is formed on the insulating layer 122 with a spin coat method, a slit coat method, or the like (FIG. 18C). Then, the film 522YR is patterned to such that gaps 522z are provided. As a result, the column banks 522Y are formed (FIGS. 12D, 15D, and 18D). The gaps 522z are provided by performing exposure through a mask overlaid above the film 522YR and then performing development. The column banks 522Y, extending in the column direction along upper surfaces of the insulating sublayers 122Y, are arranged with the gaps 522z therebetween in the row direction.

(5) Formation of Hole Injection Layer 120 and Hole Transport Layer 121

Figure 13A:
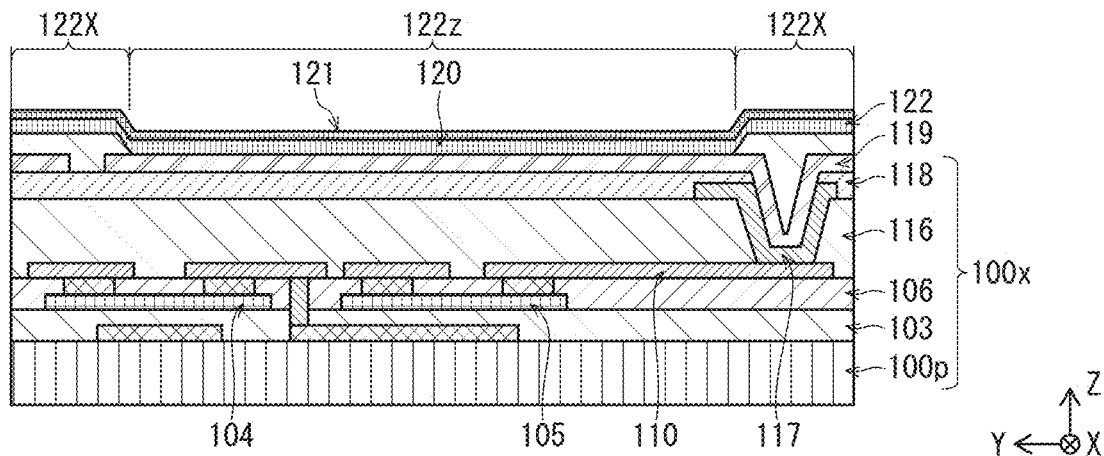
FIGS. 13A to 13C are schematic cross-sectional views of the organic EL display panel 10 during manufacture, taken along a line at the same position as the line A1-A1 in FIG. 4B.
Figure 16A:
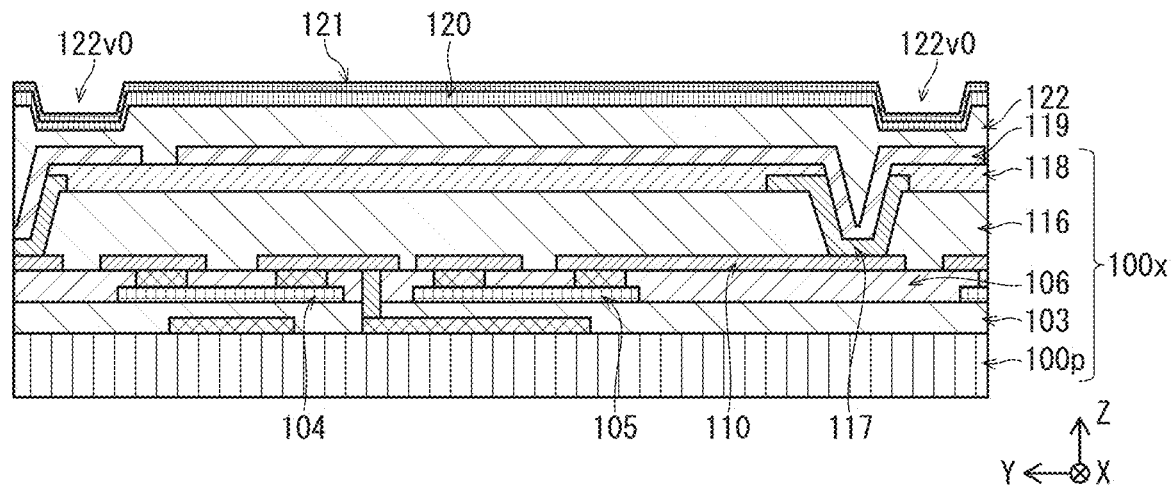
FIGS. 16A to 16C are schematic cross-sectional views of the organic EL display panel 10 during manufacture, taken along a line at the same position as the line A2-A2 in FIG. 4B.
Figure 19A:
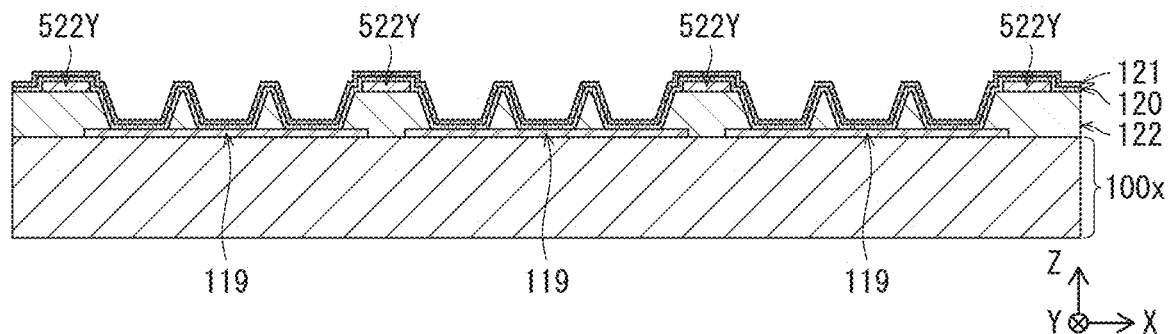
FIGS. 19A to 19D are schematic cross-sectional views of the organic EL display panel 10 during manufacture, taken along a line at the same position as the line B1-B1 in FIG. 4B.

An injection layer 120 and a hole transport layer 121 are formed on the pixel electrode layers 119, the insulating layer 122, and the column banks 522Y (FIGS. 13A, 16A, and 19A). In the process of forming the injection layer 120 and the hole transport layer 121, metal oxide films such as tungsten oxide films are deposited with the sputtering method. Note that, after the deposition, the films may be patterned in units of pixels with the photolithography method and an etching method.

(6) Formation of Light Emitting Layers 123

In the gaps 522z which are defined by the column banks 522Y, light emitting layers 123 and an electron transport layer 124 are formed on the hole transport layer 121 in the stated order.

The light emitting layers 123 are formed by applying an ink containing a material of the light emitting layers 123 onto the inside of the gaps 522z, which are defined by the column banks 522Y, with the ink jet method, and then firing the ink.

Figure 13B:
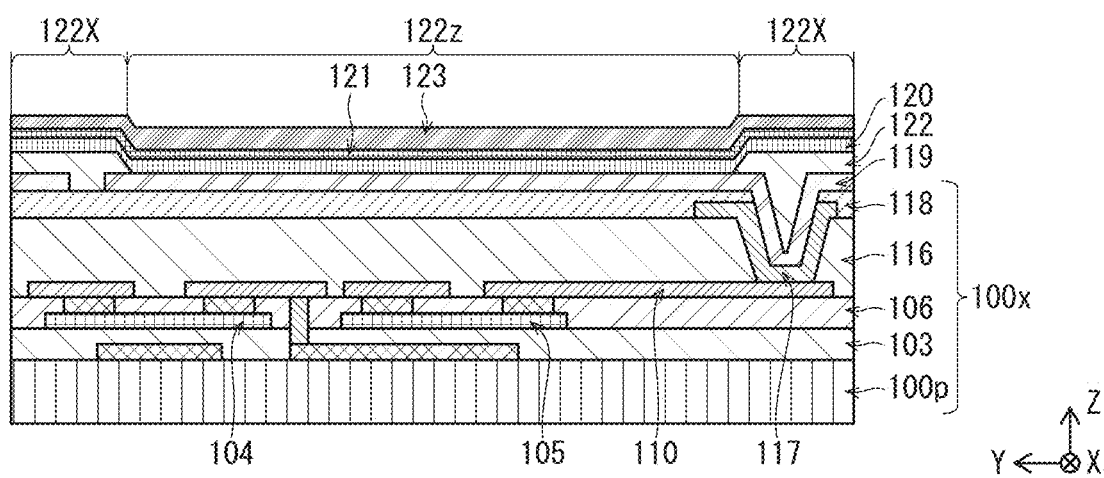
Figure 16B:
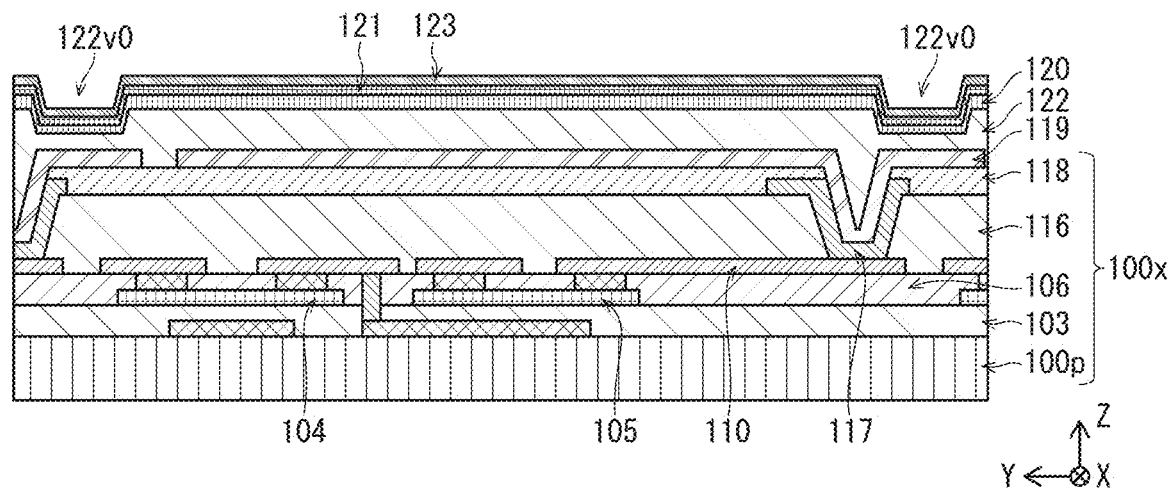
Figure 19B:
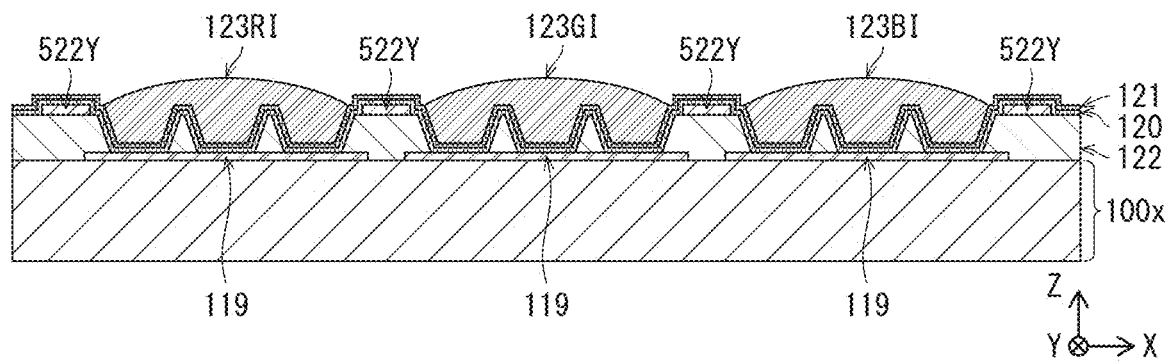
Figure 19C:
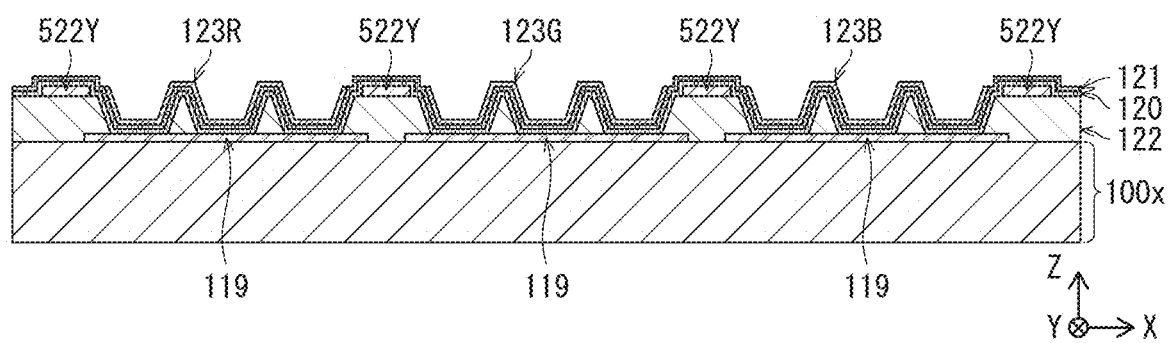

In formation of the light emitting layers 123, a solution for forming the light emitting layers 123 is first applied with use of an ink discharge device. Specifically, light emitting layers of the R, G, and B colors alternate above the substrate 100x in line in the stated order in the lateral direction in the figures. In this process, the gaps 522z, which are regions where subpixels are to be formed, are each filled using the ink jet method with any of inks 123RI, 123GI, and 123BI respectively containing materials of organic light emitting layers of the R, G, and B colors (FIG. 19B). Then, the inks are dried under a reduced pressure and are baked. As a result, the light emitting layers 123R, 123G, and 123B are complete (FIGS. 13B, 16B, and 19C).

(Method of Applying Solution for Light Emitting Layer Formation)

Figure 21A:
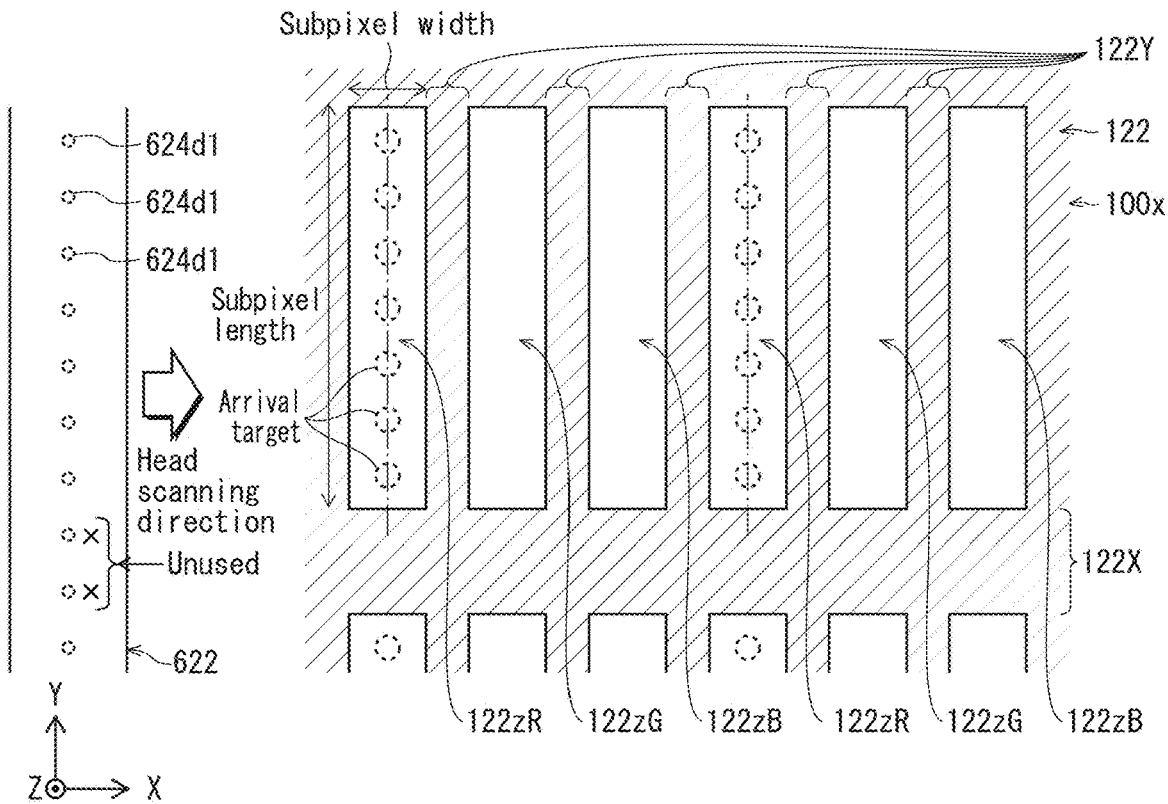
FIGS. 21A and 21B are schematic views of the organic EL display panel 10 during manufacture, showing a process of applying inks for light emitting layer formation to substrates, where
Figure 21B:
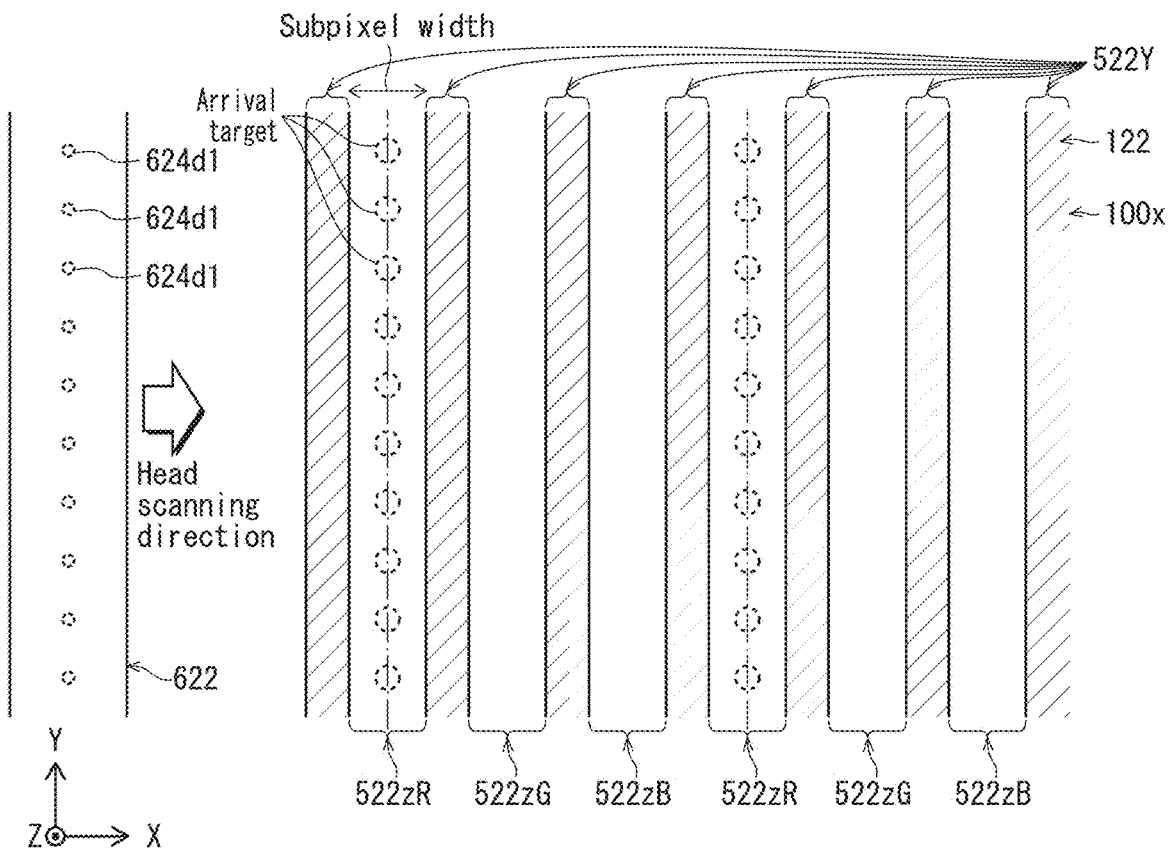

The following describes a process of forming the light emitting layers 123 with the ink jet method for mass production. FIGS. 21A and 21B are schematic views showing a process of applying inks for light emitting layer formation to the substrate. Specifically, FIG. 21A shows a case where the inks are uniformly applied to the gaps 522z between the column banks 522Y, and FIG. 21B shows a case where the inks are applied to regions of a lattice shape defined by the insulating sublayers 122X and 122Y.

In formation of the light emitting layers 123, light emitting layers of the R, G, and B colors are formed in the regions defined by the banks arranged in lines, with use of three color inks, namely, the red ink 123RI, the green ink 123GI, and the blue ink 123BI, which are solutions for forming the light emitting layers 123.

For the purpose of simplifying the description, the three color inks are applied in order by the following application method. First, one of the inks is applied over substrates. Then, another one of the inks is applied over the substrates. Lastly, the last one of the inks is applied over the substrates.

The following describes an application process of one of the three color inks, namely, the red ink onto substrates as a representative.

[Uniform Ink Application to Gaps 522z Between Column Banks 522Y]

The light emitting layers 123 are located not only above the luminous regions 100a but also above the non-luminous region 100b, which are located between the luminous regions 100a. In other words, the light emitting layers 123 continuously extend over the luminous regions 100a and the non-luminous region 100b. With this configuration, when forming the light emitting layers 123, an ink applied to the luminous regions 100a can flow in the column direction via an ink applied to the non-luminous regions 100b. This results in uniform film thickness between the pixels in the column direction. Note that the insulating sublayers 122X approximately suppress the ink flow in the non-luminous regions 100b. Thus, a large degree of film thickness unevenness is unlikely to occur in the column direction, and this improves luminance evenness between pixels.

According to this application method, as shown in FIG. 21A, the substrate 100x is placed on a work table of the ink discharge device such that the column banks 522Y are arranged in the Y direction. The ink discharge device performs ink application by, while scanning in the X direction with use of an ink jet head 622 having discharge ports 624d1 arranged in line in the Y direction, discharging ink from the discharge ports 624d1 toward arrival targets that are set in the gaps 522z between the column banks 522Y.

Note that the red ink is applied to one of each three regions that are adjacent to each other in the X-direction.

After application of the one of the three color inks to the substrate 100x is complete, another one of the three color inks is applied to the substrate 100x. Lastly, the last one of the three color inks is applied to the substrate 100x. In this way, the three color inks are applied in order.

[Ink Application to Regions of Lattice Shape Defined by Insulating Sublayers 122X and 122Y]

The ink may be applied to the regions of a lattice shape defined by the insulating sublayers 122X and 122Y.

According to this application method, as shown in FIG. 21B, the substrate 100x is placed such that the longitudinal direction and the width direction of the subpixels 100se respectively coincide with the Y-direction and the X-direction. The ink discharge device performs ink application by, while scanning in the X direction with use of the ink jet head 622, discharging ink from the discharge ports 624d1 toward arrival targets that are set in the regions of a lattice shape which are defined by the insulating sublayers 122X and 122Y. In FIG. 21B, the red subpixels 100se include arrival target positions onto which the red ink is to be applied.

Note that, among the discharge ports 624d1 of the ink jet head 622, only discharge ports 624d1, which pass above regions between each two adjacent insulating sublayers 122X, are used. Meanwhile, discharge ports 624d1 (indicated by sign x in FIG. 21B), which pass above the insulating sublayers 122X, are always unused. This is the difference from the above uniform ink application to the gaps 522z. According to the example shown in FIG. 21B, seven arrival targets are set in each of the regions of the subpixel, and ink droplets are discharged from seven discharge ports 624d1.

After application of one of the three color inks over the substrate 100x completes, application of another one of the inks is performed over the same substrate 100x, and lastly application of the last one of the inks is performed above the same substrate 100x. This application process of the three color inks is repeatedly performed for each of the substrates 100x.

Alternatively, the three color inks may be applied in order in the following manner. Specifically, when application of one of the inks above all of the substrates 100x is complete, the application process may be repeatedly performed to apply another one of the inks onto the substrates 100x, and then apply the other ink onto the substrate 100x.

(7) Formation of Electron Transport Layer 124, Counter Electrode Layer 125, and Sealing Layer 126

Figure 13C:
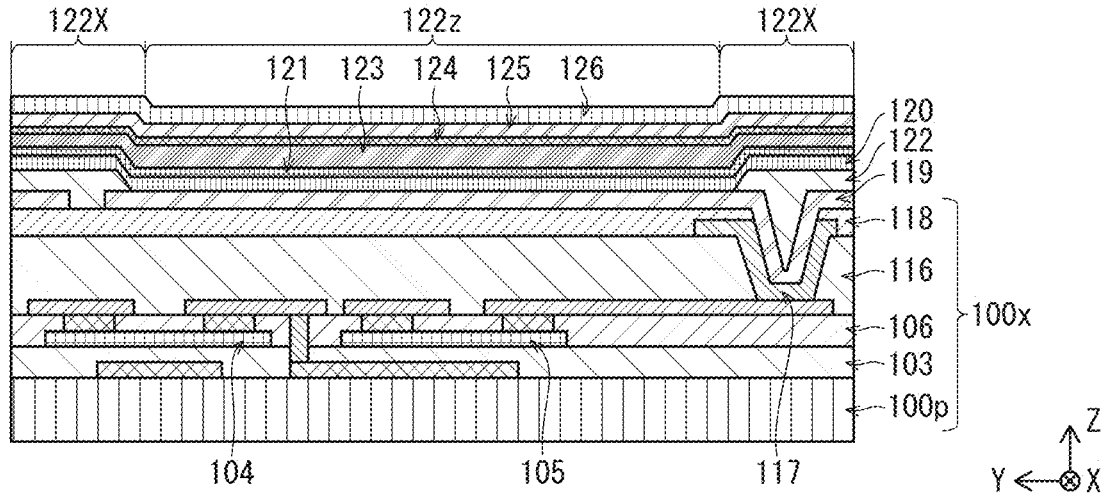
Figure 16C:
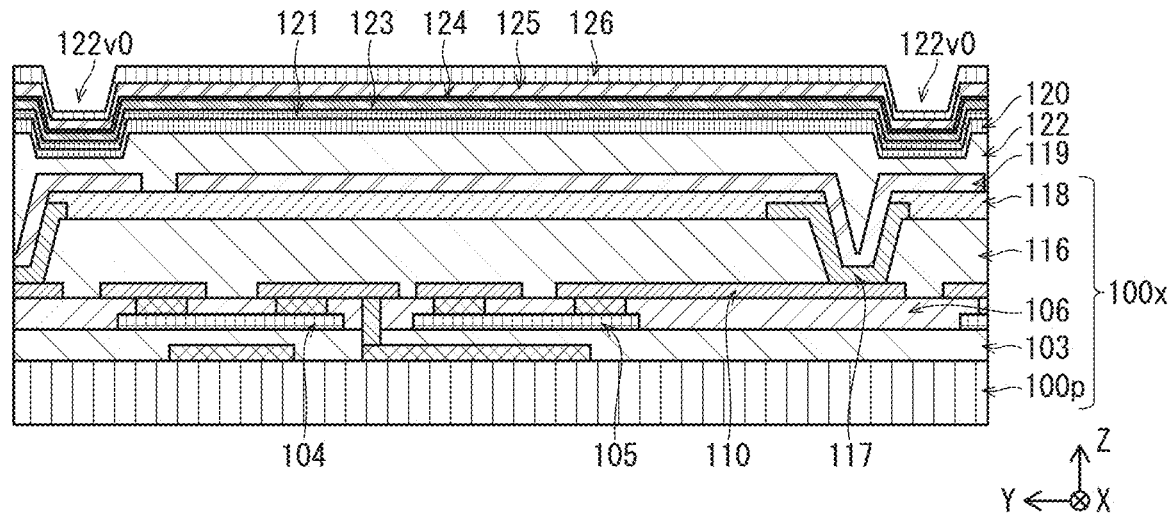
Figure 19D:
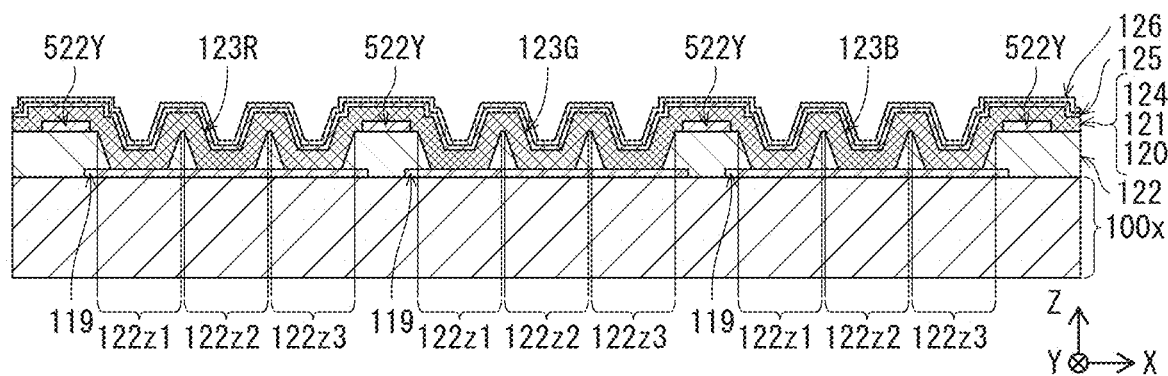

An electron transport layer 124 is formed with the vacuum deposition method or the like. Then, a counter electrode layer 125 and a sealing layer 126 are formed in the stated order so as to cover the electron transport layer 124 (FIGS. 13C, 16C, and 19D). The counter electrode layer 125 and the sealing layer 126 are formed with the CVD method, the sputtering method, or the like.

(8) Formation of CF Substrate 131

The following exemplifies a process of manufacturing a CF substrate 131 with reference to the figures. FIGS. 22A to 22F are schematic cross-sectional views of the organic EL display panel 10 during manufacture, showing manufacturing of the CF substrate 131.

Figure 22A:
FIGS. 22A to 22F are schematic cross-sectional views of the organic EL display panel 10 during manufacture, showing manufacturing of the CF substrate 131.

A light shielding layer paste 129R is prepared by dispersing in a solvent a material of a light shielding layer 129 mainly containing ultraviolet curable resin (for example, ultraviolet curable acrylic resin). The light shielding layer paste 129R is applied onto one of surfaces of a transparent upper substrate 130 (FIG. 22A).

Figure 22B:
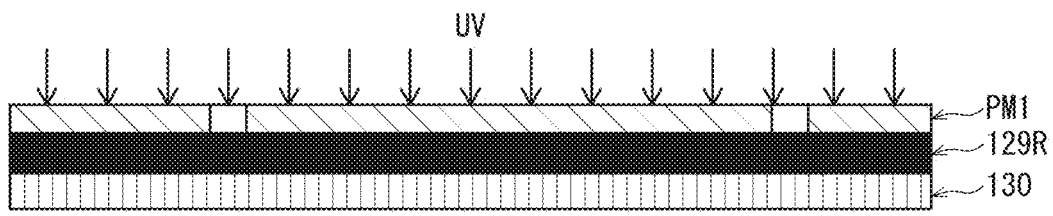

The applied light shielding layer paste 129R is dried and the solvent is vaporized to a certain degree. Then, a pattern mask PM1 having predetermined openings is overlaid above the light shielding layer paste 129R, and ultraviolet irradiation is performed on the pattern mask PM1 (FIG. 22B).

Figure 22C:

Then, the light shielding layer paste 129R, which has been applied and from which the solvent has been removed, is fired, and development is performed for removing the pattern mask PM1 and uncured parts of the light shielding layer paste 129R. Then, the light shielding layer paste 129R is cured. As a result, the light shielding layer 129 having a rectangular cross-section is complete (FIG. 22C).

Next, a paste 128R is prepared by dispersing in a solvent a material of color filter layers 128 (for example, color filter layers 128G,) mainly containing an ultraviolet curable resin component. The paste 128R is applied onto the surface of the upper substrate 130 on which the light shielding layer 129 is formed. The solvent is removed to a certain degree, and then a predetermined pattern mask PM2 is overlaid above the paste 128R and ultraviolet irradiation is performed on the pattern mask PM2 (FIG. 22D).

Then, development is performed for removing the pattern mask PM2 and uncured parts of the paste 128R, and the paste 128R is cured. As a result, the color filter layers 128G are complete (FIG. 22E).

Figure 22D:
Figure 22E:
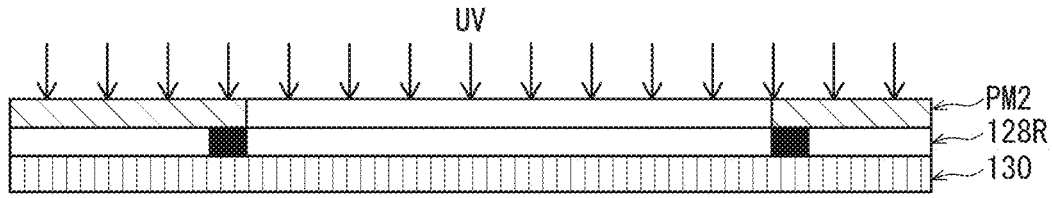
Figure 22F:
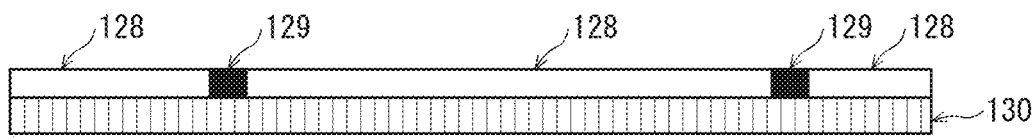

Color filter layers 128R and 128B are also formed by similarly repeating the processes in FIGS. 22D and 22E on color filter materials of the R and B colors. Note that any commercially available color filter products may be used instead of using the paste 128R.

This completes the CF substrate 131.

(9) Bonding of CF Substrate 131 and Rear Panel

Figure 14A:
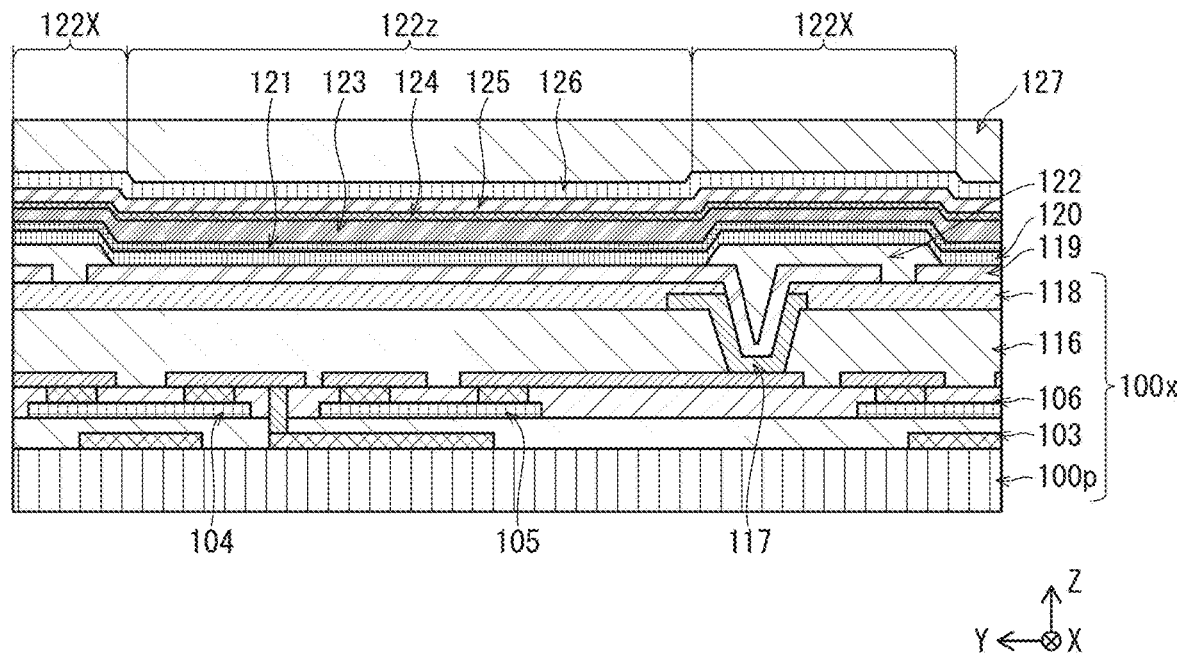
FIGS. 14A and 14B are schematic cross-sectional views of the organic EL display panel during manufacture, taken along a line at the same position as the line A1-A1 in FIG. 4B, showing bonding of a CF substrate 131 to a rear panel.
Figure 14B:
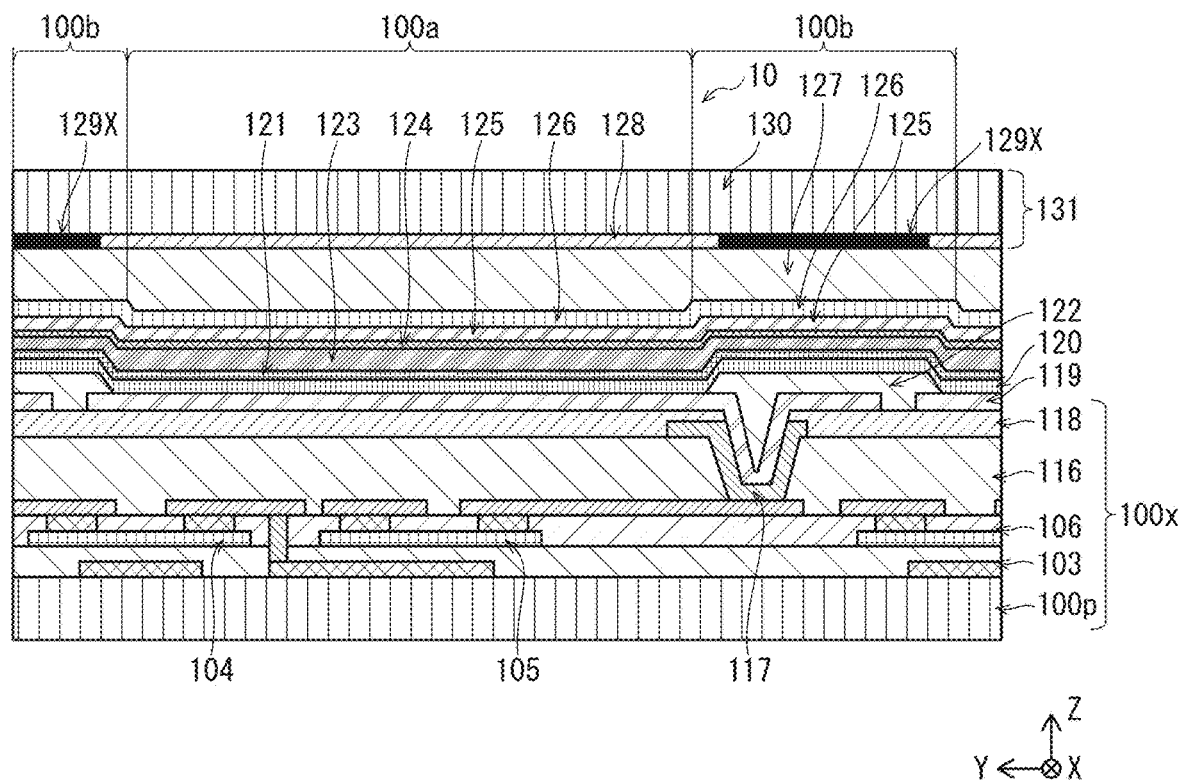
Figure 17A:
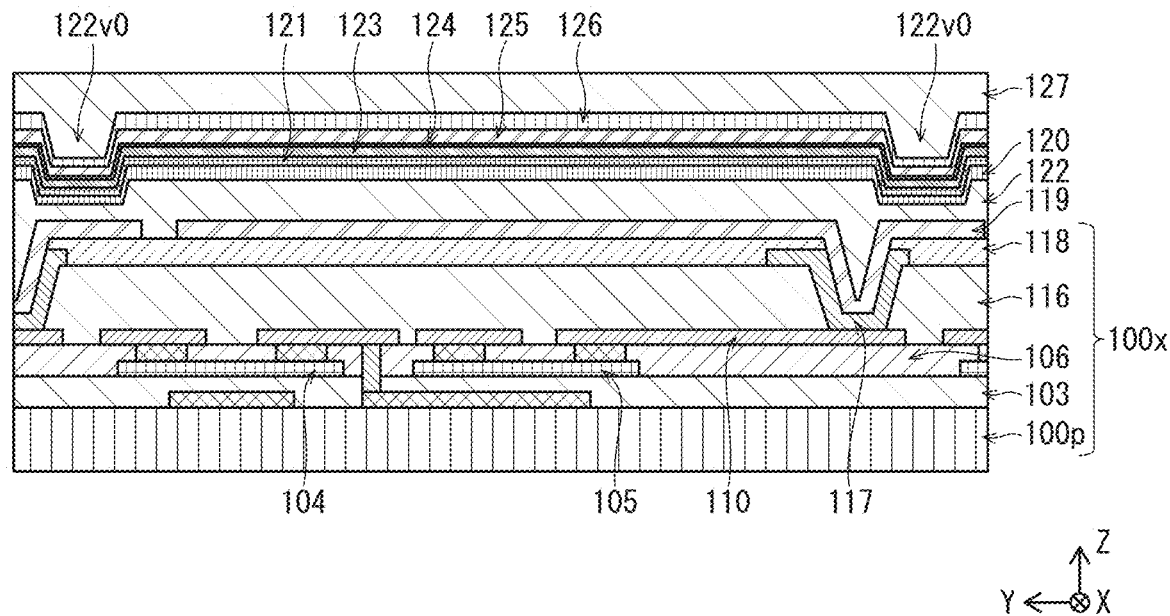
FIGS. 17A and 17B are schematic cross-sectional views of the organic EL display panel 10 during manufacture, taken along a line at the same position as the line A2-A2 in FIG. 4B, showing bonding of the CF substrate 131 to the rear panel.
Figure 17B:
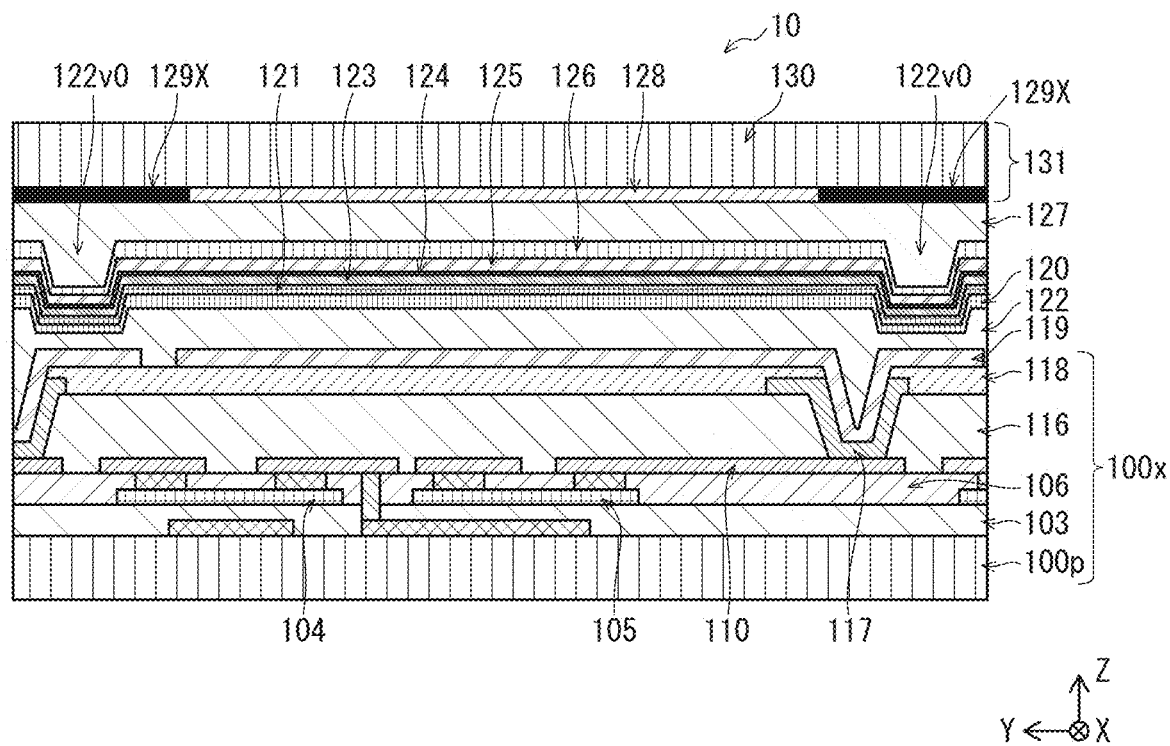
Figure 20A:
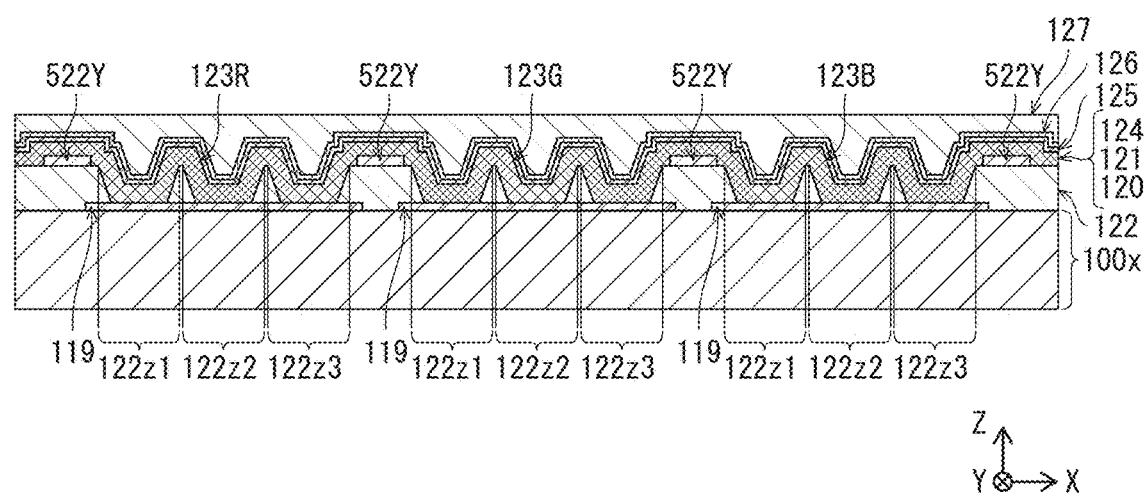
FIGS. 20A and 20B are schematic cross-sectional views of the organic EL display panel 10 during manufacture, taken along a line at the same position as the line B1-B1 in FIG. 4B, showing bonding of the CF substrate 131 to the rear panel.
Figure 20B:
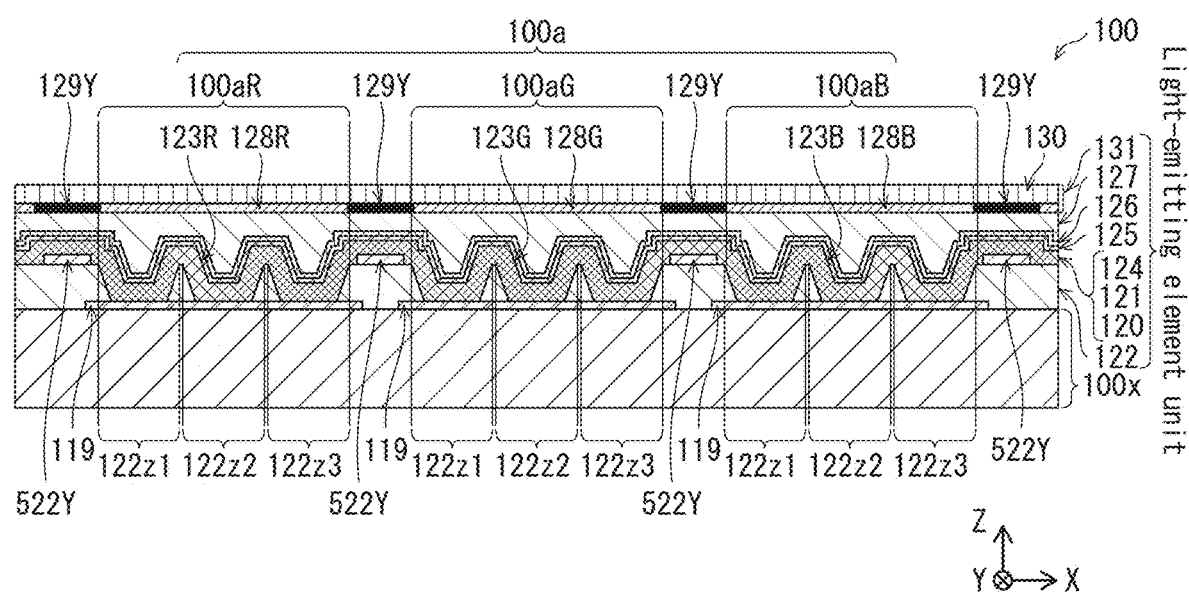

The following describes a bonding process of the CF substrate 131 and a rear panel in manufacturing the display panel 10. FIGS. 14A and 14B are schematic cross-sectional views taken along a line at the same position as the line A1-A1 in FIG. 4B. FIGS. 17A and 17B are schematic cross-sectional views taken along a line at the same position as the line A2-A2 in FIG. 4B. FIGS. 20A and 20B are schematic cross-sectional views taken along a line at the same position as the line B1-B1 in FIG. 4B.

First, a material of a bond layer 127 mainly containing light-transmissive ultraviolet curable resin is applied onto the rear panel, which is composed of the substrate 100x and the layers ranging from the pixel electrode layers 119 to the sealing layer 126 (FIGS. 14A, 17A, and 19A). The light-transmissive ultraviolet curable resin is for example acrylic resin, silicone resin, or epoxy resin.

Subsequently, ultraviolet irradiation is performed on the applied material such that the CF substrate 131 and the rear panel are bonded to each other while positions relative to each other are maintained. At this time, intrusion of gas therebetween needs to be prevented. Then, the CF substrate 131 and the rear panel are fired. This completes a sealing process (FIGS. 14B, 17B, and 19B).

The display panel 10 is complete through the above processes.

6. Effect of Display Panel 10

Figure 23A:
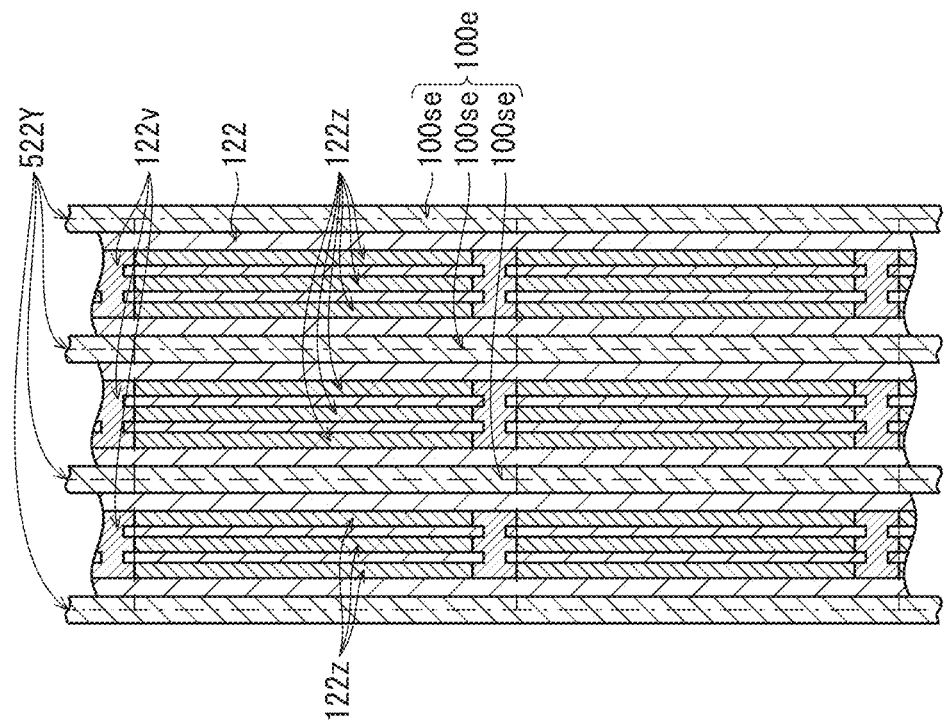
FIG. 23A is a schematic plan view of part of the organic EL display panel 10.
Figure 23B:
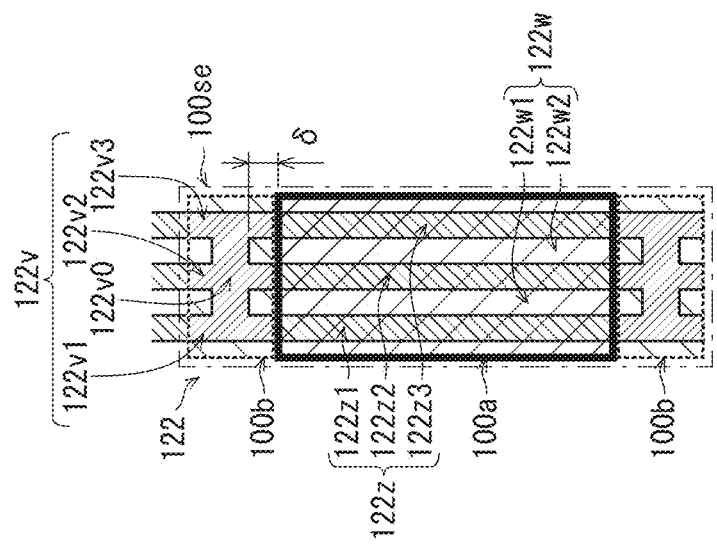
FIG. 23B is an enlarged plan view of one subpixel in FIG. 23A.

6.1 Suppression of Luminance Variation in Openings 122z in Subpixels 100se (1) Effect Exhibited by Uniform Cross-Sectional Profiles of Openings 122z in Column Direction The following describes the effect of the display panel 10. FIG. 23A is a schematic plan view of part of the display panel 10, and FIG. 23B is an enlarged plan view of one subpixel in FIG. 23A.

As described above, the insulating layer 122 has, in each of the subpixels 100se, the elongated openings 122z1, 122z2, and 122z3, which extend in the column direction and are arranged in the row direction. Organic functional layers including the hole injection layer 120 and the light emitting layers 123 are formed in the openings 122z1, 122z2, and 122z3. The pixel electrode layers 119 are exposed in the openings 122z1, 122z2, and 122z3 so as to be in contact with the hole injection layer 120. This configuration allows electrical charge supply in these openings from the pixel electrode layers 119 to the hole injection layer 120.

The insulating layer 122 further has the connection grooves 122v1, 122v2, and 122v3, which have upper openings and bottoms and are respectively communicated with the openings 122z1, 122z2, and 122z3 when viewed in plan. The organic functional layers including the hole injection layer 120 and the light emitting layers 123 are also located in the bridging groove 122v0 and the connection grooves 122v1, 122v2, and 122v3 of the grooved portion 122v. However, the pixel electrode layers 119 are not exposed in these grooves, which have groove-shaped cross sections and have upper openings and bottoms. With this configuration, the pixel electrode layers 119 are not in contact with the hole injection layer 120, and thus electrical charge supply from the pixel electrode layers 119 to the hole injection layer 120 is not performed in the grooved portions 122v.

Light is emitted from only parts of the light emitting layers 123 to which carriers are supplied from the pixel electrode layers 119, and accordingly no electroluminescence of organic compound occurs in regions of the light emitting layers 123 where the insulating layer 122 is provided, which is made of an insulating material. Thus, light is emitted from only parts of the light emitting layers 123, positioned in the openings 122z1, 122z2, and 122z3, where no insulating layer 122 is provided. These minimum rectangular regions including the openings 122z1, 122z2, and 122z3 are the luminous regions 100a. Regions other than the luminous regions 100a in the subpixels 100se are the non-luminous regions 100b. In other words, the display panel 10 has the configuration in which the subpixels 100se are arranged in a matrix where the luminous regions 100a and the non-luminous regions 100b alternate in the column direction, owing to the pixel electrode layers 119 layered on the substrate 100x and the openings 122z provided in the insulating layer 122.

Also, the openings 122z1, 122z2, and 122z3 each have a predetermined trapezoidal cross-section taken along the row direction whose width increases upward. With this configuration, the light emitting layers 123 efficiently emit light upward.

Furthermore, the cross-sectional profiles of the openings 122z1, 122z2, and 122z3 taken along the row direction are uniform in the column direction or continuously vary along the column direction. With this configuration, it is possible to suppress variation in factors that influence the ink retention ability in application of the ink containing organic compound as materials of the light emitting layers during the manufacturing process. As a result, the ink is retained uniformly in the luminous regions 100a of each pixel. This reduces variation in film thickness of the light emitting layers 123, thereby to suppress luminance unevenness in the pixel.

Alternatively, the cross-sectional profiles of the openings 122z1, 122z2, and 122z3 taken along the row direction may continuously vary along the column direction. With this configuration, it is possible to suppress rapid variation in factors that influence the ink retention ability, and thereby to suppress rapid variation in ink retention ability in the luminous regions 100a of each pixel. This suppresses rapid variation in film thickness of the light emitting layers 123, thereby to suppress steep luminance unevenness.

(2) Effect Exhibited by Separating Bridging Grooves 122v0 from End Parts of Openings 122z In the display panel 10, in plan view of the substrate 100x, the grooved portions 122v include the connection grooves 122v1, 122v2, and 122v3, which are respectively communicated with the openings 122z1, 122z2, and 122z3 in the column direction, and the bridging grooves 122v0, which are communicated with the connection grooves 122v1, 122v2, and 122v3 in the row direction. The upper width of the connection grooves 122v1, 122v2, and 122v3 in the row direction is equal or substantially equal to the upper width of the openings 122z1, 122z2, and 122z3 in the row direction. Also, the width of the connection grooves 122v1, 122v2, and 122v3 in the column direction is 1 µm to 8 µm. With this configuration, the cross-sectional profiles of the connection grooves 122v1, 122v2, and 122v3 do not influence the ink retention ability at the end parts of the openings 122z1, 122z2, and 122z3. Furthermore, the bridging grooves 122v0, which influence the ink retention ability, are separated from the end parts of the openings 122z1, 122z2, and 122z3 by a certain distance. As a result, the ink is further uniformly retained at the end parts of the openings 122z1, 122z2, and 122z3. This reduces variation in film thickness of the light emitting layers 123, thereby to further suppress luminance unevenness in each pixel.

6.2 Suppression of Luminance Variation Between Openings 122z in Each Subpixel 100se In the display panel 10, the bridging grooves 122v0 with bottoms are provided in the non-luminous regions 100b. The bridging grooves 122v0 extend in the row direction and are communicated with the connection grooves 122v1, 122v2, and 122v3. With this configuration, the bridging grooves 122v0 increase the flow of the ink containing material of the light emitting layers 123 between the connection grooves 122v1, 122v2, and 122v3, and thereby to improve uniformity in application amount of the ink in each subpixel. This reduces film thickness variation of the light emitting layers 123 to suppress luminous variation in each pixel.

6.3 Suppression of Luminance Variation Between Subpixels 100se

In the display panel 10, the connection grooves 122v1, 122v2, and 122v3 provided in each of the non-luminous regions 100b are respectively communicated with the openings 122z1, 122z2, and 122z3 that are provided in two adjacent subpixels in the column direction. With this configuration, the connection grooves 122v1, 122v2, and 122v3 increase the flow of the ink, which contains material of the light emitting layers 123, in the column direction, thereby to suppress variation in application amount of the ink between the subpixels. This reduces film thickness variation of the light emitting layers 123 to suppress luminous variation between the subpixels.

6.4 Improvement in Aperture Ratio

According to the display panel 10 relating to the present embodiment, it is possible to increase an aperture ratio in each subpixel.

In the reflector of the display panel the inventors conceived of at their idea level as shown in FIGS. 29 and 30A, a light emitting unit in each subpixel has two elongated openings 922z0, which extend in the row direction and are communicated with the openings 922z1, 922z2, and 922z3. This is because, in order to equalize film thickness of the light emitting layer 923 in the light emitting unit, the openings 922z0 need to be provided near the end parts in the column direction in the light emitting unit.

In contrast, in the reflector of the display panel 10 as shown in FIG. 23B, the insulating layer 122 has, above the pixel electrode layer 119 in one luminous region 100a, elongated openings 122z1, 122z2, and 122z3, which extend in the column direction and are arranged in the row direction. The insulating layer 122 also has, above the pixel electrode layer 119 in one non-luminous region 100b, connection grooves 122v1, 122v2, and 122v3 that are respectively communicated with the openings 122z1, 122z2, and 122z3, and one bridging groove 122v0 that is communicated with the connection grooves 122v1, 122v2, and 122v3 in the column direction. In this way, the display panel 10 has the configuration in which one bridging groove 122v0 is provided in each subpixel instead of the two openings 922z0, which is provided in each subpixel. Owing to this configuration of the display panel 10, it is possible to reduce an area of the non-luminous region 100b corresponding to an area of one opening 922z01, thereby to exhibit a higher aperture ratio in the subpixel than the reflector shown in FIGS. 29 and 30A. As a result, it is possible to decrease the current density at the same luminance in the subpixel thereby to increase a light-emission lifetime. Alternatively, in the case where the upper limit for the current density is defined in accordance with the light-emission lifetime or the like, it is possible to improve the maximum luminance.

According to the display panel 10, as described above, it is possible to achieve a high efficiency and a long panel service life by uniformizing the film thickness of the application-type functional layers.

<<Modifications>>

In the above embodiment, the display panels 10 is described. However, the present disclosure is not limited to the above embodiment except the essential characteristic compositional elements thereof. The following describes modifications of the display panel 10 as examples of such an embodiment.

(1) Connection Grooves 122v1, 122v2, and 122v3 Provided Near Openings 122z for Increasing Ink Retention Ability At least one of the following two conditions may be true: (i) the cross-sectional profiles of the connection grooves 122v1, 122v2, and 122v3 taken along the row direction are smaller in terms of upper width in the row direction than the cross-sectional profiles of the openings 122z1, 122z2, and 122z3 taken along the row direction; and (ii) the cross-sectional profiles of the connection grooves 122v1, 122v2, and 122v3 are smaller in terms of rate of change of the width in the row direction to the depth than the cross-sectional profiles of the openings 122z1, 122z2, and 122z3. With this configuration, the connection grooves 122v1, 122v2, and 122v3, which have properties of increasing the ink retention ability, are respectively provided near the end parts of the openings 122z1, 122z2, and 122z3. This prevents deterioration of the ink retention ability at the end parts of the openings 122z1, 122z2, and 122z3. As a result, it is possible to suppress luminance unevenness in each pixel caused by decrease in film thickness of the light emitting layers 123.

Here, in the case where the connection grooves 122v1, 122v2, and 122v3 are provided by using halftone masks with the opening width equal to that of masks for the openings 122z1, 122z2, and 122z3, the upper width of the connection grooves 122v1, 122v2, and 122v3 in the row direction can be reduced easily.

(2) Openings and Grooves in Different Number

In the display panel 10 relating to the embodiment, the insulating layer 122 has: above each of the pixel electrode layers 119, (i) the three elongated openings 122z1, 122z2, and 122z3, which extend in the column direction and are arranged in the row direction; (ii) the connection grooves 122v1, 122v2, and 122v3 with the upper openings and the bottoms, which are respectively communicated with the openings 122z1, 122z2, and 122z3; and (iii) the bridging groove 122v0 with the bottom, which extend in the row direction and are communicated with the connection grooves 122v1, 122v2, and 122v3.

Alternatively, the number of the openings and the grooves of each grooved portion may be modified. Specifically, as shown in FIG. 24A for example, the insulating layer 122 may have: above each of the pixel electrode layers 119, (i) two openings 122z1 and 122z2; (ii) connection grooves 122v1 and 122v2 that are respectively communicated with the openings 122z1 and 122z2; and (iii) a bridging groove 122v0 that is separated by a distance δ from the openings 122z1 and 122z2 in the column direction. As described later, FIGS. 24B and 24C show configurations in which the insulating layer 122 has two bridging grooves 122v0 in each of the non-luminous regions 100b. Compared with these configurations, the configuration of providing one bridging groove 122v0 in the non-luminous region 100b reduces an area of the non-luminous region 100b corresponding to an area of one bridging groove 122v0. This increases the aperture ratio in each subpixel. As a result, it is possible to decrease the current density at the same luminance in the subpixel thereby to increase a light emitting lifetime as described above. Alternatively, in the case where the upper limit for the current density is defined in accordance with the light-emission lifetime or the like, it is possible to improve the maximum luminance.

(3) Grooves Concentrated or Divided into Groove Pieces in Column Direction

Grooves of a grooved portion may be concentrated or divided into groove pieces in each non-luminous region 100b in the column direction. Specifically, as shown in FIGS. 24B and 24C for example, the insulating layer 122 may have groove pieces divided from each of connection grooves 122v1 and 122v2 in the column direction, two bridging grooves 122v0, and a connection groove 122v9 in the non-luminous region 100b. The respective bridging grooves 122v0 are communicated with the groove pieces divided from the connection grooves 122v1 and 122v2. Moreover, the bridging grooves 122v0 are separated from openings 122z by a distance δ in the column direction.

(4) Grooves Intersecting with Each Other

Figure 25A:
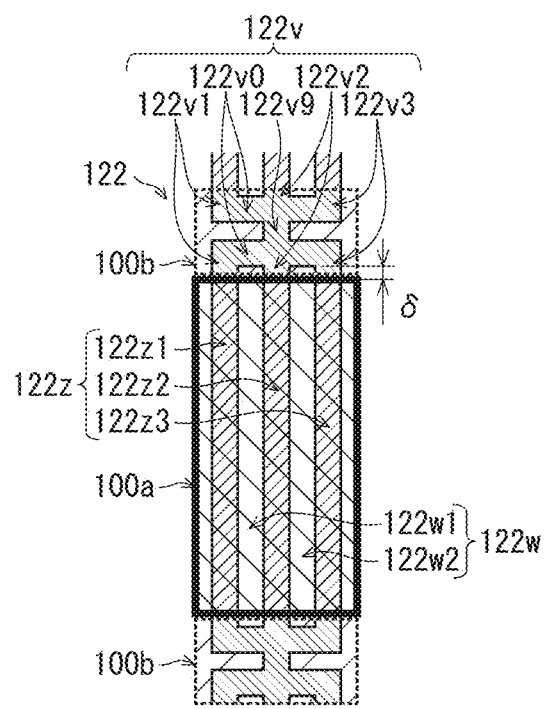
FIGS. 25A and 25B are enlarged plan views of subpixels relating to a modification.
Figure 25B:
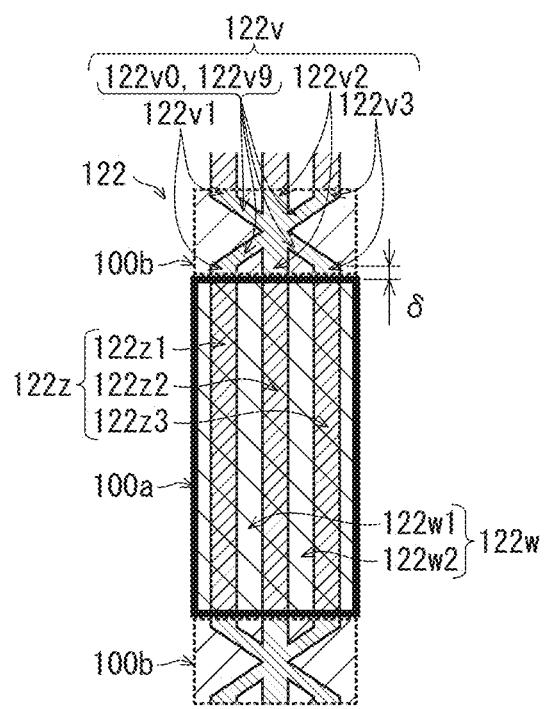

Grooves of a grooved portion may intersect with each other in each non-luminous region 100b. Specifically, as shown in FIG. 25A for example, the insulating layer 122 may have a connection groove 122v9 and two bridging grooves 122v0 in the non-luminous region 100b. The connection groove 122v9 intersects with each of the bridging grooves 122v0. Alternatively, as shown in FIG. 25B for example, the insulating layer 122 may have, in the non-luminous region 100b, three grooves (one vertical groove and two diagonal grooves) that have functions of both the connection groove 122v9 and the bridging grooves 122v0. Moreover, the bridging grooves 122v0 are separated from openings 122z by a distance δ in the column direction.

(5) Grooves with Increased or Decreased Area

Figure 26A:
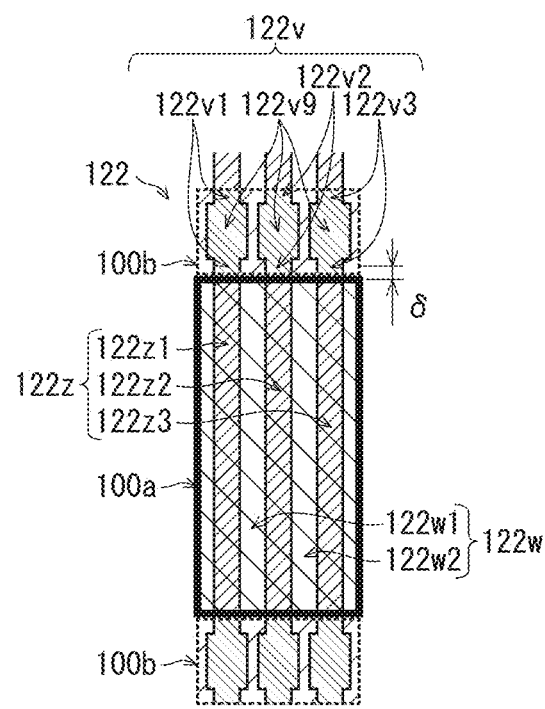
FIGS. 26A and 26B are enlarged plan views of subpixels relating to a modification.
Figure 26B:
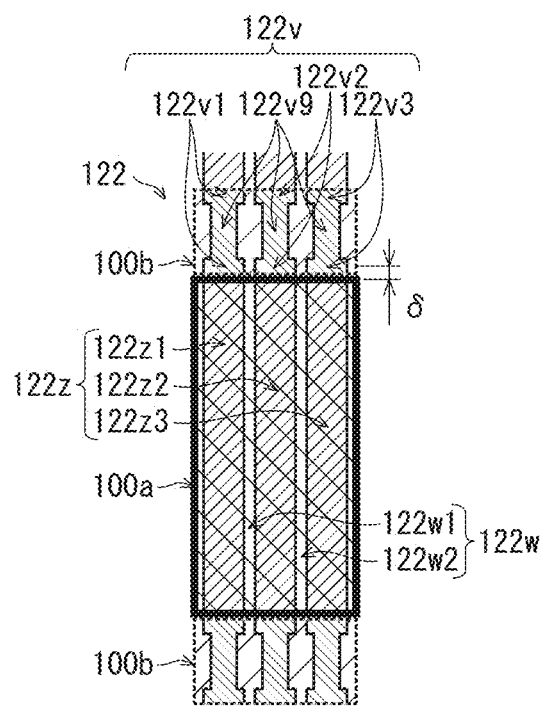

The connection grooves 122v in each of the non-luminous regions 100b may have an increased area and a decreased area as respectively shown in FIGS. 26A and 26B. Moreover, the connection grooves 122v whose area increases or decreases may be separated from openings 122z by a distance δ in the column direction. Moreover, a bridging groove 122v0 may be further provided that is communicated with the connection grooves 122v.

(6) Grooves with Varying Cross-Sectional Profiles

Figure 27A:
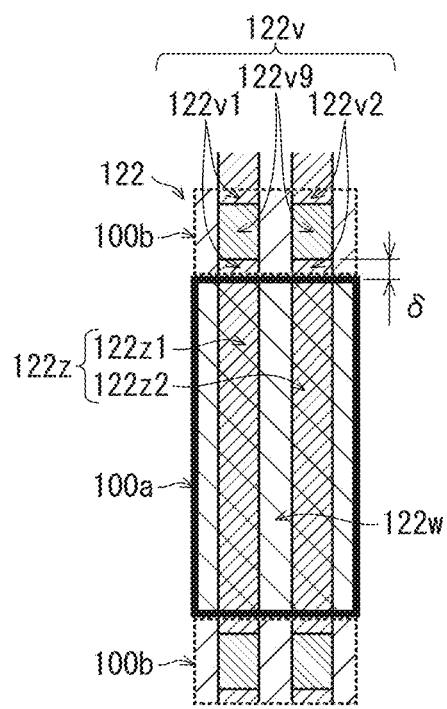
FIGS. 27A and 27B are enlarged plan views of subpixels relating to a modification.
Figure 27B:
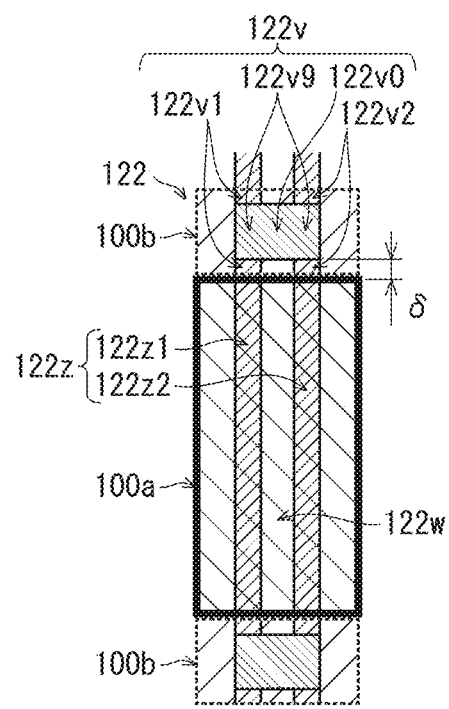

As shown in FIG. 27A, the insulating layer 122 may have groove pieces divided from each of connection grooves 122v1 and 122v2 in the column direction and connection grooves 122v9 in each non-luminous region 100b. The respective connection grooves 122v9 are communicated with the groove pieces divided from the connection grooves 122v1 and 122v2, and have cross-sectional profiles different from the groove pieces. The connection grooves 122v9 are separated from openings 122z by a distance δ in the column direction. Moreover, as shown in FIG. 27B, a bridging groove 122v0 may be further provided that are communicated with the groove pieces divided from the connection grooves 122v1 and 122v2 and the connection groove 122v9 in the row direction.

Even with the configurations relating to modifications (1) to (6) as described above, the grooved portions, which have cross-sectional profiles that vary to influence the ink retention ability, are provided in the non-luminous regions 100b. Since the varying parts are separated from the end parts of the openings 122z by a predetermined distance, it is possible to uniformly retain the ink at the end parts of the openings 122z, as well as in the above embodiment. This reduces film thickness variation of the light emitting layers 123 to suppress luminous variation in each pixel.

(7) Varying Parts of Cross-Sectional Profiles of Grooved Portions and End Parts of Openings 122z that are Close to Each Other As shown in FIGS. 28A to 28F, varying parts of cross-sectional profiles of grooved portions in each non-luminous region 100b may be close to end parts of openings 122z, without being separated from the end parts of the openings 122z by a predetermined distance. FIGS. 28A to 28F respectively show the varying parts of the cross-sectional profiles of the grooved portions and the end parts of the openings 122z in FIGS. 24B, 23B, 25A, 25B, 26A, 26B, 27A, and 27B that are modified so as to be close to each other. Even with these configurations, the grooved portions 122v, which have varying cross-sectional profiles, are provided in the non-luminous region 100b, and accordingly, it is possible to suppress variation in ink retention ability at the end parts of the openings 122z at a certain degree. It is more preferable to provide grooved portions 122v whose cross-sectional profiles vary to increase the ink retention ability at end parts of openings 122z, for example by providing varying parts of the cross-sectional profiles near the end parts of the openings 122z. For example as shown in FIG. 28F, grooved portions 122v should be provided so as to have a shorter width in the row direction than the end parts of the openings 122z. As a result, it is possible to uniformly retain the ink at the end parts of the openings 122z, and also to reduce the length of the non-luminous regions 100b in the column direction thereby to achieve high resolution.

(8) Increase in Distance Between Electrodes Near End Parts of Openings 122z

The pixel electrode layers 119 may be separated from the counter electrode layer 125 by a predetermined distance at parts near the end parts of the respective openings 122z that are communicated with the connection grooves 122v1, 122v2, and 122v3. By forming an interlayer insulating layer 118 having concave portions thereby to form the pixel electrode layers 119 so as to be along the concave portions, it is possible to separate the pixel electrode layers 119 from the counter electrode layer 125 by a predetermined distance. In other words, parts of the pixel electrode layers 119, which are located near the end parts of the openings 122z that are communicated with the connection grooves 122v1, 122v2, and 122v3, may be separated from the counter electrode layer 125 by a greater distance than a remainder of the pixel electrode layers 119 is.

With this configuration, since the electric field intensity is low above the concave portions of the inter insulating layer 118, no electroluminescence of organic compound occurs in parts of the light emitting layers 123 that are located above the concave portions of the inter insulating layer 118. Accordingly, parts above the concave portions of the inter insulating layer 118 can be included in the non-luminous regions 100b. This increase of the non-luminous regions 100b further separates the varying parts of the cross-sectional profiles of the grooved portions 122v from the luminous regions 100a. As a result, it is possible to uniformly retain the ink in the openings 122z which constitute the luminous regions 100a.

<<Other Modifications>>

Although the display panel 10 has been described in the above embodiment, the present disclosure also includes, for example, an embodiment obtained through various types of modifications which could be conceived of by one skilled in the art to the above embodiment, an embodiment obtained through any combination of the compositional elements and the functions in the above embodiment without departing from the spirit of the present disclosure, and so on. The following describes modifications of the display panel 10 as examples of such an embodiment.

(1) In the display panel 10, the light emitting layers 123 are continuous in the column direction above the row banks. Alternatively, the light emitting layers 123 may not be continuous for the entire pixels above the row banks. Even with this configuration, it is possible to improve the light extraction efficiency.

(2) In the display panel 10, the light emitting layers 123 of the subpixels 100se, which are arranged in the gaps 522z between the column banks 522Y adjacent in the row direction, each emit light of a color different from adjacent one. Meanwhile, the light emitting layers 123 of the subpixels 100se, which are arranged between the insulating sublayers 122X adjacent in the column direction, emit light of the same color. Alternatively, the light emitting layers 123 of the subpixels 100se, which are adjacent in the row direction, may emit light of the same color, and the light emitting layers 123 of the subpixels 100se, which are adjacent in the column direction, each may emit light of a color different from adjacent one. Further alternatively, the light emitting layers 123 of the subpixels 100se, which are adjacent in the row direction, each may emit light of a color different from adjacent one, and the light emitting layers 123 of the subpixels 100se, which are adjacent in the column direction, each may emit light of a color different from adjacent one. Even with this configuration, it is possible to improve the light extraction efficiency.

(3) Others

The display panel 10 relating to the above embodiment includes the subpixels 100se of the three colors of red, green, and blue. However, the present disclosure is not limited to this. For example, the light emitting layers may be ones emitting light of a single color, or respective ones emitting light of four colors of red, green, blue, and yellow.

Also, the unit pixels 100e are arranged in a matrix in the above embodiment. However, the present disclosure is not limited to this. The effect of the present disclosure is exhibited also for the configuration in which in the case for example where an interval of the pixel region is one pitch, the pixel region is shifted in the column direction by half pitch between adjacent gaps. In display panels with increasing high resolution, since it is difficult to visually discriminate some shift in the column direction, an irregular film thickness in a straight (or staggered) shape with a certain width is viewed as a stripe-shaped one. Thus, in such a case, it is possible to improve the display quality of the display panels by suppressing an irregular luminance in a staggered shape such as described above.

Also, the display panel 10 includes the pixel electrode layers 119 each of which are provided between every two of all the gaps 522z. However, the present disclosure is not limited to this. For example, some of the gaps 522z may not have the pixel electrode layer 119 therebetween in order to form a bus bar or the like.

Moreover, the display panel 10 includes the color filter layers 128 that are provided above the gaps 522z corresponding to the subpixels 100se of the R, G, and B colors. Alternatively, the exemplified display panel 10 may have a configuration in which the color filter layers 128 are not provided above the gaps 522z.

Also, in the above embodiment, the hole injection layer 120, the hole transport layer 121, the light emitting layers 123, and the electron transport layer 124 are provided between each of the pixel electrode layers 119 and the counter electrode layer 125. However, the present disclosure is not limited to this. For example, only the light emitting layers 123 may be provided between each of the pixel electrode layers 119 and the counter electrode layer 125, without providing the hole injection layer 120, the hole transport layer 121, and the electron transport layer 124. Alternatively, a hole injection layer, a hole transport layer, an electron transport layer, an electron injection layer, and so on may be included, or some or all of these layers may be simultaneously included, for example.

Moreover, all of these layers do not need to be made of organic compound, and alternatively some of the layers may be made of inorganic substance or the like. Furthermore, the hole injection layer 120, the hole transport layer 121, and the electron transport layer 124 may be formed using a dry deposition method such as the vacuum deposition method, an electron beam deposition method, the sputtering method, a reactive sputtering method, an ion plating method, and a chemical vapor deposition method. Also, in the case where the hole injection layer 120 and the hole transport layer 121 are formed using the dry deposition method, the pixel electrode layers 119, the hole injection layer 120, the hole transport layer 121, the insulating layer 122, and the light emitting layers 123 may be layered in the stated order.

Also, in the above embodiment, the light emitting layers 123 are formed using a wet deposition method such as the printing method, the spin coating method, and the ink jet method. However, the present disclosure is not limited to this. For example, the dry deposition method may be used such as the vacuum deposition method, the electron beam deposition method, the sputtering method, the reactive sputtering method, the ion plating method, and the chemical vapor deposition method. Moreover, a known material may be appropriately adopted for the materials of the components.

Also, in the above embodiment, the pixel electrode layers 119 as anodes are provided in the lower part of the organic EL element unit so as to be connected with the source electrodes of the TFTs. Alternatively, the counter electrode layer and the anodes may be provided respectively in the lower part and the upper part of the organic EL element unit. In this case, the cathode that is provided in the lower part is connected with the drain electrodes of the TFTs.

Also, the two transistors $T_{r1}$ and $T_{r2}$ are provided for each subpixel 100se in the above embodiment. However, the present disclosure is not limited to this. For example, one transistor may be provided for each subpixel, or three or more transistors may be provided for each subpixel.

Furthermore, an EL display panel of the top-emission type is exemplified in the above embodiment. However, the present disclosure is not limited to this. For example, the present disclosure may be applied to a display panel of a bottom-emission type. In this case, the configurations of the components may be appropriately modified.

Also, in the above embodiment, the display panel 10 is an active-matrix display panel. However, the present disclosure is not limited to this. For example, the display panel 10 may be a passive-matrix display panel. Specifically, pairs of a linear electrode, which is parallel to the column direction, and a linear electrode, which is parallel to the row direction, may be provided such that each pair of the electrodes sandwich the light emitting layer 123 therebetween. In this case, the configurations of the components may be appropriately modified. Although the substrate 100x in the above embodiment includes the TFT layer, the substrate 100x does not necessarily need to include the TFT layer as seen in the above example of the passive-matrix display panel.

<<Supplements>>

The embodiment described above shows a specific preferred example of the present disclosure. The numerical values, the shapes, the materials, the components, the arrangement and connection status of the components, the processes, the order of the processes, and so on described in the above embodiment are just examples, and do not intend to limit the present disclosure. Also, processes among the components in the embodiment, which are not described in the independent claims representing the most generic concept of the present disclosure, are explained as arbitrary components of a more preferred embodiment.

Furthermore, the order of performing the above processes is exemplification for specifically describing the present disclosure, and the processes may be performed in an order different from the above one. Moreover, part of the above processes may be performed simultaneously (in parallel) with other process.

Also, the components shown in the figures in the above embodiment are not necessarily drawn to scale for easy understanding of the present disclosure. Furthermore, the present disclosure is not limited by the description of the above embodiment, and may be appropriately modified without departing from the scope of the present disclosure.

Moreover, at least part of the functions of the above embodiment and modifications may be combined with each other.

Furthermore, the present disclosure also includes embodiments obtained through various types of modifications that could be conceived of by one skilled in the art to the above embodiment.

INDUSTRIAL APPLICABILITY

The organic EL display panel and the organic EL display device relating to the present disclosure are broadly utilizable to devices such as television sets, personal computers, and mobile phones, or other various types of electrical devices having display panels.

REFERENCE SIGNS LIST

1 Organic EL display device
10 Organic EL display panel
100 Organic EL element
100e Unit pixel
100se Subpixel
100a Luminous region
100b Non-luminous region
100x Substrate (TFT substrate)
100p Lower substrate
101, 102 Gate electrode
103 Gate insulating layer
104, 105 Channel layer
106 Channel protection layer
107, 110 Source electrode
108, 109 Drain electrode
111 Source lower electrode
112 Drain lower electrode
113 Contact plug
116 Passivation layer
117 Connection electrode layer
118 Interlayer insulating layer
119 Pixel electrode layer
119a1, 119a2, 119a3, 119a4 Outer edge
119b Contact region (contact window)
119c Connection concave part
120 Hole injection layer
121 Hole transport layer
122, 122X, 122Y Insulating layer
122z Opening
122w Bar
123 Light emitting layer
124 Electron transport layer
125 Counter electrode layer
126 Sealing layer
127 Bond layer
128 Color filter layer
129 Light shielding layer
129X Row light shielding sublayer
129Y Column light shielding sublayer
130 Upper substrate
131 CF substrate
522Y Column bank
522z Gap
622 Ink jet head
624 Discharge port
EL EL element unit
$T_{r1}$ Drive transistor
$T_{r2}$ Switching transistor
C Capacitance

The invention claimed is:

1. An organic electroluminescence (EL) display panel including pixels arranged in a matrix of rows and columns, the organic EL display panel comprising:
   a substrate;
   pixel electrode layers that are made of a light-reflective material and are arranged on the substrate in the matrix;
   an insulating layer that is provided above the substrate and the pixel electrode layers, and has elongated openings and a grooved portion for each of the pixels, the openings extending in a column direction and being arranged in a row direction, the grooved portion having an upper opening and a bottom and being communicated with at least one of the openings in plan view;
   organic functional layers that are provided above the pixel electrode layers, and include light-emitting layers in which organic electroluminescence occurs in the openings; and
   a light-transmissive counter electrode layer that is provided above the organic functional layers, wherein
   cross-sectional profiles of the openings taken along the row direction are uniform in the column direction.

2. The organic EL display panel of claim 1, wherein the grooved portion is communicated with at least two of the openings in plan view.

3. The organic EL display panel of claim 2, wherein the grooved portion includes:
   connection grooves that are communicated with the openings in the column direction in plan view; and
   a bridging groove that is communicated with the connection grooves in the row direction in plan view.

4. The organic EL display panel of claim 3, wherein the connection grooves and the openings have a substantially equal upper width in the row direction.

5. The organic EL display panel of claim 4, wherein
the connection grooves each have a width of 1 µm to 8 µm in the column direction.

6. The organic EL display panel of claim 2, wherein
the grooved portion includes a bridging groove that is communicated with the openings in plan view.

7. The organic EL display panel of claim 1, wherein
the pixels each have a luminous region where the openings are provided and a non-luminous region where the grooved portion is provided, and
the luminous regions and the non-luminous regions alternate in the column direction.

8. The organic EL display panel of claim 7, wherein
the grooved portion is communicated with the respective openings that are provided in two adjacent luminous regions in the column direction.

9. The organic EL display panel of claim 1, wherein
the organic functional layers are in contact with the pixel electrode layers in the openings, and are separated from the pixel electrode layers in the grooved portions.

10. The organic EL display panel of claim 1, wherein
the cross-sectional profiles of the openings taken along the row direction are defined by an upper width in the row direction and a depth of the openings.

11. The organic EL display panel of claim 10, wherein
the cross-sectional profiles of the openings taken along the row direction are further defined by a rate of change of the width in the row direction to the depth of the openings.

12. The organic EL display panel of claim 3, wherein
at least one of the following two conditions is true:
cross-sectional profiles of the connection grooves taken along the row direction are smaller in terms of an upper width in the row direction than the cross-sectional profiles of the openings taken along the row direction; and
the cross-sectional profiles of the connection grooves are smaller in terms of a rate of change of a width in the row direction to a depth than the cross-sectional profiles of the openings.

13. The organic EL display panel of claim 1, further comprising
a bond layer that is provided above the counter electrode layer and has a rear surface that is convex along the openings,
the cross-sectional profiles of the openings taken along the row direction are each a trapezoid whose width increases upward, and
when refractive indices of the bond layer and the insulating layer are represented by $n_1$ and $n_2$, respectively, the following relationships are satisfied:

$1.1 \leq n_1 \leq 1.8$ (Formula 1); and $|n_1 - n_2| \geq 0.20$ (Formula 2).

14. The organic EL display panel of claim 13, wherein
when depth, upper width in the row direction, and lower width in the row direction of the openings are represented by D, $W_h$, and $W_l$, respectively, the following relationships are satisfied:

$0.5 \leq W_l/W_h \leq 0.8$ (Formula 3); and $0.5 \leq D/W_l \leq 2.0$ (Formula 4).

15. A method of manufacturing an organic electroluminescence (EL) display panel including pixels arranged in a matrix of rows and columns, the method comprising:
preparing a substrate;
forming pixel electrode layers on the substrate in the matrix, the pixel electrode layers being made of a light-reflective material;
forming an insulating layer above the substrate and the pixel electrode layers;
providing elongated openings for each of the pixels in the insulating layer by performing exposure on a photosensitive resin through a mask and performing development on the photosensitive resin, the openings extending in a column direction and being arranged in a row direction;
providing a grooved portion for each of the pixels in the insulating layer by performing exposure on a photosensitive resin through a halftone mask and performing development on the photosensitive resin, the grooved portion being communicated with at least one of the openings in plan view;
forming, at least in the openings of the pixels, organic functional layers including light-emitting layers by applying an ink above the pixel electrode layers and drying the ink, the ink containing a material of the light-emitting layers; and
forming a light-transmissive counter electrode layer above the organic functional layers, wherein
in the providing the openings, cross-sectional profiles of the openings taken along the row direction are made to be uniform in the column direction.

* * * * *